United States Patent [19]
Sakai et al.

[11] Patent Number: 6,159,763
[45] Date of Patent: *Dec. 12, 2000

[54] METHOD AND DEVICE FOR FORMING SEMICONDUCTOR THIN FILM, AND METHOD AND DEVICE FOR FORMING PHOTOVOLTAIC ELEMENT

[75] Inventors: Akira Sakai; Yasushi Fujioka, both of Soraku-gun; Shotaro Okabe, Nara; Masahiro Kanai, Soraku-gun; Yuzo Kohda, Kyotanabe; Tadashi Hori, Nara; Takahiro Yajima, Soraku-gun, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/927,413

[22] Filed: Sep. 10, 1997

[30] Foreign Application Priority Data

| Sep. 12, 1996 | [JP] | Japan | 8-242397 |
| Jan. 21, 1997 | [JP] | Japan | 9-008285 |
| Jan. 21, 1997 | [JP] | Japan | 9-008286 |

[51] Int. Cl.[7] .................................................. H01L 31/18
[52] U.S. Cl. .............................................. 438/97; 438/485
[58] Field of Search .................................. 438/61, 62, 74, 438/96, 97, 482, 484, 485; 136/258; 118/718, 719, 723 E, 723 MW, 723 R; 257/53, 55, 458; 427/509, 575, 248.1, 58

[56] References Cited

U.S. PATENT DOCUMENTS

| 4,400,409 | 8/1983 | Izu | 427/39 |
| 4,438,723 | 3/1984 | Cannella | 118/718 |
| 4,767,641 | 8/1988 | Kieser et al. | 427/38 |
| 4,920,917 | 5/1990 | Nakatami et al. | 118/718 |
| 5,180,434 | 1/1993 | DiDio et al. | 118/718 |
| 5,510,151 | 4/1996 | Matsuyama | 427/509 |
| 5,589,007 | 12/1996 | Fujioka et al. | 438/96 |
| 5,700,326 | 12/1997 | Takatsu et al. | 118/723 NW |
| 5,927,994 | 7/1999 | Kohda et al. | 438/478 |

FOREIGN PATENT DOCUMENTS

| 0786795 | 7/1997 | European Pat. Off. . |
| 4233895 | 4/1994 | Germany . |

*Primary Examiner*—Savitri Mulpuri
*Attorney, Agent, or Firm*—Fiztpatrick, Cella, Harper & Scinto

[57] ABSTRACT

There is provided a method of forming a photovoltaic element, in which a p-type semiconductor layer is formed in a device for forming a semiconductor thin film having a cathod electrode structure, in which in a plasma discharge space, the surface area of a cathod electrode in a plasma discharge space is larger than the sum of surface areas of a belt-like member and an anode electrode, a potential of said cathod electrode at the time of excitation of glow discharge is positive relative to the belt-like member and the anode electrode, and a separator electrode partially constituting the cathod electrode is configured to have a form of a fin or a block, and an n-type semiconductor layer is formed in a device for forming a semiconductor thin film having a cathod electrode structure of a capacitive-coupling, parallel-plate type. Thereby, a photovoltaic element having a high quality and superior uniformity over a large area, less defects, superior photo deterioration property and improved series resistance can be manufactured providing a high throughput in large quantities with good reproducibility.

4 Claims, 13 Drawing Sheets

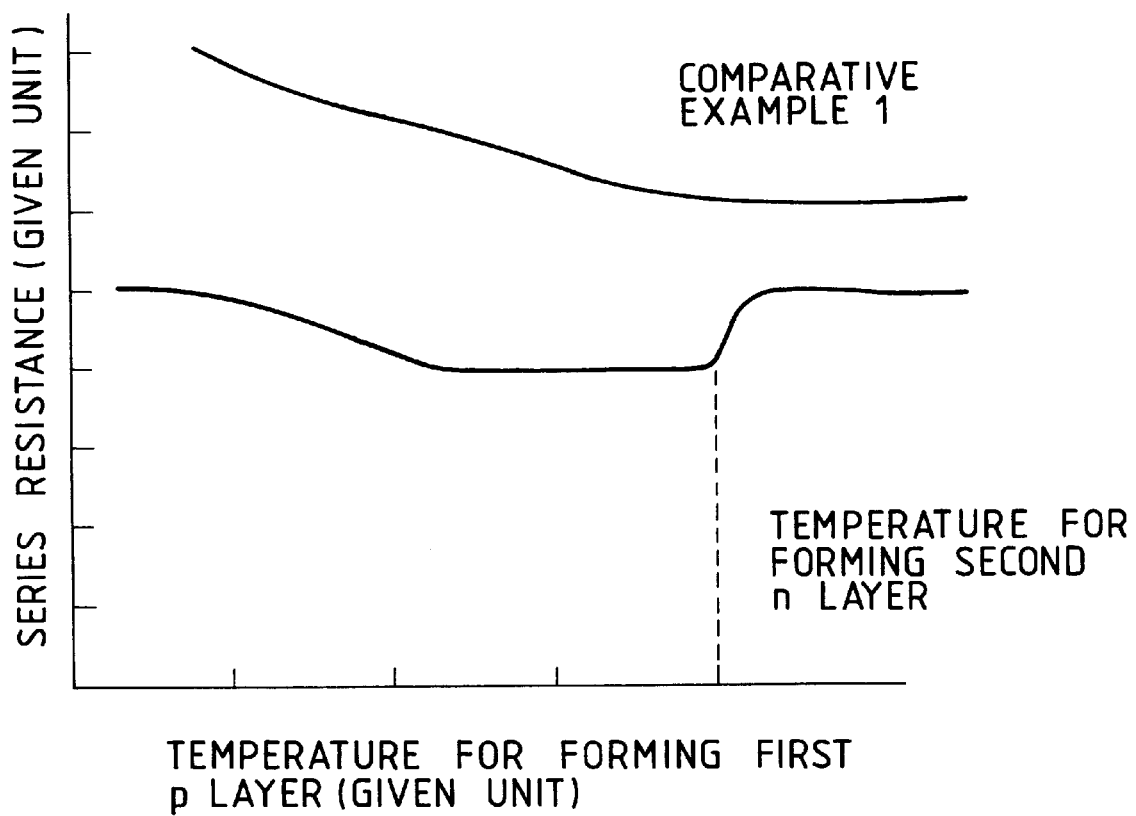

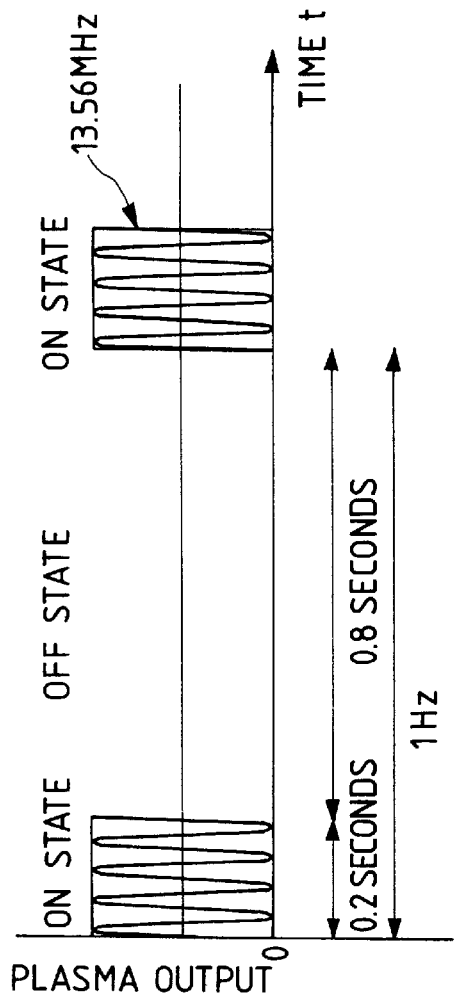
FIG. 14A
FIG. 14B
FIG. 14C
FIG. 14D

METHOD AND DEVICE FOR FORMING SEMICONDUCTOR THIN FILM, AND METHOD AND DEVICE FOR FORMING PHOTOVOLTAIC ELEMENT

BACKGROUND OF THE INVENTION

1. Field of the Invention

The present invention relates to a forming method of a semiconductor thin film, a forming device thereof, a forming method of a photovoltaic element, and a forming device thereof.

Specifically, when manufacturing a photovoltaic element comprising of at least two or more sets of laminated nip junctions, for example, a photovoltaic element comprising of a laminated type of cells having a double or triple cell structure, a semiconductor thin film with a reduced series resistance and a superior photo deterioration property can be obtained. Therefore, the invention relates to a method of forming a photovoltaic element superior in property uniformity and having fewer defects.

Also, the invention relates to a method and a device for forming a non-single crystal semiconductor thin film having a high quality and superior uniformity over a wide area, a high reproducibility and fewer defects, on a continuously moving belt-like member.

Further, the invention relates particularly to a forming device of a semiconductor thin film and a photovoltaic element which can maintain a high film-forming rate, while preventing particles (hereinafter referred to also as powder) generated in plasma from adhering to a substrate surface.

Especially, the forming method and device for forming the semiconductor thin film and the photovoltaic element according to the invention is preferable as a method and device using a roll to roll system for manufacturing in mass photovoltaic elements such as solar batteries or the like.

2. Related Background Art

As a conventional method of preparing a photovoltaic element using an amorphous silicon film (hereinafter referred to as the a-Si film) or the like, in general, a plasma CVD method is widely used and industrialized.

In the plasma CVD method, to form a high-quality i-type amorphous semiconductor layer or an n-type semiconductor layer, in a material gas of silane ($SiH_4$) or the like, $CH_4$, $GeH_4$ or the like is appropriately mixed as a gas for adjusting a band gap, and the mixture gas is diluted (about once to 100 times) with hydrogen ($H_2$). This process is often used. Alternatively, in another process, a high-frequency power is supplied low, generating a large number of long-life radicals to obtain a high-quality film through surface reaction.

However, to raise the deposition rate in the aforementioned plasma CVD method, the supply of a large quantity of required radicals and the promotion of surface reaction for relaxing a structure are necessary. For this purpose, increasing of a substrate temperature or other measures have been studied. The method, however, is disadvantageous in forming a P-I-N junction, and is not suitable for industrial applications.

As another measure for increasing the deposition rate, the density of high-frequency power is raised to decompose the material gas in large quantities. However, the radicals decomposed and generated with the high-density high-frequency power include a large quantity of $SiH_2$ or other active radicals, and the structure cannot be sufficiently relaxed. As a result, a high-quality semiconductor film cannot be obtained. Further, the active radicals easily grow into clusters and, if further growing occurs, create fine particles (hereinafter referred to as powder). To solve the problem, for example, by applying a high-frequency power in a pulse form, the generation of powder is suppressed, while the powder generated by temporarily stopping the supply of plasma is discharged without being taken into a deposited film.

Also, to ensure that the photovoltaic element meets the electric power demand, the photovoltaic element is basically required to have a high photoelectric conversion efficiency, a superior property stability and a superior mass productivity at the same time.

To this end, when preparing the photovoltaic element using the a-Si film or the like, electric, optical, photoconductive or mechanical properties, fatigue properties against repeated use, operation environmental properties or the like need to be improved. Further, together with increasing area and uniformizing film thickness and quality, mass production by means of high-rate film forming while attaining a high reproducibility must be targeted.

The semiconductor layer as an important constituting element of the photovoltaic element is provided with a so-called pn junction, pin junction or another semiconductor junction. When the a-Si or another thin-film semiconductor is used, the material gas including phosphine ($PH_3$), diborane ($B_2H_6$) or another dopant element is mixed with the main material gas of silane or another, and is decomposed by glow discharge, thereby obtaining semiconductor films having a desired conductive type. It is known that by successively laminating the semiconductor films on a desired substrate to form layers, the aforementioned semiconductor junction can be easily achieved. Further, it is proposed as a method of preparing an a-Si system photovoltaic element that an independent film-forming chamber is provided for preparing each semiconductor layer, i.e., each semiconductor layer is in each film-forming chamber.

For example, the specification of U.S. Pat. No. 4,400,409 discloses a continuous plasma CVD device using a roll to roll system. It is described in the specification that according to the device, a plurality of glow discharge regions are provided, and a flexible substrate having a sufficiently long desired width is arranged along a passageway through which the substrate successively passes the glow discharge regions. A desired conductive type of semiconductor layer is being deposited in each glow discharge region, while the substrate is continuously conveyed along its longitudinal direction, to continuously prepare the elements having a semiconductor junction. In the specification, a gas gate is used for preventing the dopant gas for use in preparing each semiconductor layer from diffusing or mixing into another glow discharge region. Specifically, the glow discharge regions are separated from one another via a slit-like separating path, and the separating path is provided with a means for forming a flow of Ar, $H_2$ or another sweeping gas.

As a recently noted method for obtaining a high-quality film, there is a research report that in a capacitive coupling type plasma CVD method, a high-quality film is formed by using a self bias generated between a cathode electrode and an anode electrode and ion kinds. However, the research report has the following two problems.

(1) In an inner structure of a conventional typical discharge container, the area of the entire grounded anode electrode including a substrate is usually much larger than the area of a cathode electrode. Most of the supplied high-frequency power is consumed in the vicinity of the cathode electrode. As a result, the material gas is actively excited, decomposed and reacted only in a restricted portion, i.e., in the vicinity of the cathode electrode. The thin film forming rate becomes large only at the side where high-frequency power is supplied, i.e., in the vicinity of the cathode electrode. Even if a large quantity of high-frequency power is projected, the high-frequency power is not sufficiently supplied toward the anode electrode including the substrate. Therefore, it is indeed difficult to obtain a high-quality amorphous semiconductor thin film at a high depositing rate as desired.

(2) In the inner structure of the conventional typical discharge container, i.e., in the discharge container in which the area of the entire grounded anode electrode is much larger than the area of the cathode electrode, a positive bias is applied to the cathode electrode using a DC source. In the system, however, as a result of using the DC source as the secondary means, direct current flows in the plasma discharge. Therefore, when the direct current voltage bias is increased, spark or another unusual discharge is caused. It is very difficult to maintain a stable discharge by suppressing the unusual discharge. Therefore, it is unclear whether or not the application of direct current voltage to plasma discharge is effective. Because direct current voltage is not separated from direct current in the system. That is to say, a means for effectively applying only a direct current voltage to plasma discharge has been demanded.

Even when the technique stated in the aforementioned research report is used, powder is still generated in a film-forming space during high rate depositing, and is taken into the semiconductor thin film being deposited. The problem that the quality of the semiconductor thin film is adversely affected has not been solved.

In order to prepare a higher quality semiconductor thin film, it is indispensable to develop a technique for preventing the powder from being generated and taken into the semiconductor thin film being deposited.

Especially, the film thickness of the p-type semiconductor layer or the n-type semiconductor film forming the photovoltaic element is usually set as thin as several hundreds of angstrom in view of element properties. Therefore, when forming the photovoltaic element, especially the laminated layer type photovoltaic element, it is essential to prevent the powder from being generated and taken into the film being deposited. Not only the properties but the yield of the element are greatly influenced by the uniformity of layer thickness, the adherence of film, the doping efficiency of dopant, the uniformity of properties and the reproducibility.

Therefore, to obtain an a-Si thin film or another semiconductor thin film uniform in space and time and superior in reproducibility, a forming method and device are demanded in which the stability over a long period of time, reproducibility and uniformity of the electric discharge are enhanced. Further, when the throughput from the device is improved to save cost, a forming method and device are demanded which can increase the depositing rate while maintaining the quality of the semiconductor thin film.

Further, when forming a laminated type cell having a double or a triple cell structure, the conditions of preparing the aforementioned high-quality p-type semiconductor layer and further the n-type semiconductor layer laminated on the p-type semiconductor layer need to be optimized.

Especially, in the case of the preparing conditions with the aforementioned high depositing rate, the development of a measure for preventing the generation of powder and forming a high-quality amorphous semiconductor thin film has been demanded.

On the other hand, in a heretofore known method of continuously forming on a substrate a semiconductor deposit film for use in a photovoltaic element or the like, individual film-forming chambers are provided for preparing individual semiconductor layers, the film-forming chambers are connected via a gate valve in a road lock system, and the substrate is successively moved through the film-forming chambers to form each semiconductor layer. According to the method, a longitudinal belt-like member is used as the substrate. By continuously conveying the substrate in its longitudinal direction, while required conductive type semiconductor layers are deposited and formed in a plurality of glow discharge regions, the element having the semiconductor junction can be continuously formed.

However, the formation of a semiconductor film on a strip substrate extending several hundreds of meters requires several hours of film-forming time. Further, the semiconductor layer needs to be formed by maintaining and controlling the condition of electric discharge uniform and superior in reproducibility. A method is demanded in which a semiconductor deposit film of higher and uniform quality is continuously formed along the entire length of the longitudinal strip substrate from its commencing end to its terminal end with good yield.

For the i-type semiconductor layer for the photovoltaic element, for example, when an amorphous silicon or another thin film semiconductor is used, a main material gas of $SiH_4$ (silane) or the like is mixed with $H_2$ (hydrogen) and decomposed by glow discharge, to form the i-type semiconductor film can be formed. Especially, it is known the film quality of the i-type semiconductor layer determines the properties of the photovoltaic element. It is heretofore general that a high-quality i-type semiconductor layer is formed at a low depositing rate. On the other hand, to manufacture photovoltaic elements in large quantities at low cost, the enhancement of throughput from the forming device is demanded. It is clear to increase the throughput, the deposition rate of the semiconductor layer, especially the i-type semiconductor layers should be increased.

In the conventional technique, however, as the deposition rate is increased, the film quality of the i-type semiconductor layer is disadvantageously and remarkably decreased. A means for solving this problem is demanded.

In the inner structure of the conventional typical discharge container, the area of the entire grounded anode electrode including the substrate is usually much larger than the area of the cathode electrode to which power is applied. Most of the supplied high-frequency power is consumed in the vicinity of the cathode electrode. As a result, the material gas is actively excited, decomposed and reacted only in a restricted portion, i.e., in the vicinity of the cathode electrode. The thin film forming rate becomes large only at the side where high-frequency power is supplied, i.e., in the vicinity of the cathode electrode. Even if a large quantity of high-frequency power is supplied, the high-frequency power is not sufficiently supplied toward the side of the anode electrode or substrate. Therefore, it has been difficult to form an i-type semiconductor thin film on the substrate at a high deposition rate as desired. Further, it has been difficult to compatibly obtain an i-type semiconductor thin film of high quality and properties. Also, it is remarkably disadvantageous, in view of material cost, that more material gas is consumed in the vicinity of the cathode electrode, rather than on the substrate of a belt-like member or the like on which material gas must be deposited.

Also, in the inner structure of the conventional typical discharge container, i.e., in the discharge container in which the area of the entire grounded anode electrode including the substrate is much larger than the area of the cathode electrode, a positive bias is applied to the cathode electrode using a DC source. In the system, however, as a result of using the DC source as the secondary means, direct current flows in the plasma discharge. Therefore, when the direct current voltage bias is increased, spark or another unusual discharge is caused. It has been very difficult to maintain a stable discharge by suppressing the unusual discharge. Further, it has been unclear whether or not the application of direct current voltage to plasma discharge is effective. Direct current voltage is not separated from direct current in the system. That is to say, a means for effectively applying only a direct current voltage to plasma discharge has been demanded.

Therefore, to obtain a high quality i-type semiconductor layer uniform in space and time and superior in reproducibility, a forming device is demanded in which the stability over a long period of time, reproducibility and uniformity of the electric discharge are enhanced. Further, when the throughput from the device is improved to save cost, or when the efficiency of the material gas is enhanced, a device is demanded which can increase the deposition rate while maintaining the quality of semiconductor thin film. When a laminated type photovoltaic element is formed, a forming device is demanded which can continuously prepare an i-type semiconductor layer with higher reproducibility, uniformity and quality.

An object of the present invention is to solve various problems with the aforementioned conventional photovoltaic element forming device and provide a forming method and device of forming a non-single crystal semiconductor thin film, so that photovoltaic elements having a high photoelectric conversion efficiency, a high quality, a superior uniformity, a high reproducibility and fewer defects are produced in large quantities over a large area on continuously moving belt-like members.

Another object of the invention is to provide a semiconductor thin film forming device and a photovoltaic element which can prevent powder generated in plasma from adhering to a substrate surface while maintaining a high film-forming rate. By using the forming device, the quantity of powder taken into the film being deposited is decreased. Therefore, another object of the invention is to form an amorphous semiconductor thin film superior in photo deterioration properties and form a large quantity of photovoltaic elements having superior uniformity in properties and fewer defects, by using the aforementioned forming device.

A further object of the invention is to provide a method of forming a photovoltaic element superior in uniformity of properties and having fewer defects. According to the present invention, when manufacturing a photovoltaic element comprising at least two or more laminated nip junction layers, for example, a photovoltaic element comprising a laminated type of cells having a double or triple cell structure, a semiconductor thin film with a reduced series resistance and a superior photo deterioration property can be obtained. The forming method according to the invention is preferable as a method of manufacturing in mass photovoltaic elements such as solar batteries or the like using a roll to roll system.

SUMMARY OF THE INVENTION

The present invention provides:
(1) a method of forming a photovoltaic element in which, using plasma CVD, at least two or more sets of nip junctions constituted of an n-type semiconductor layer, an i-type semiconductor layer and a p-type semiconductor layer are laminated on a surface of a belt-like member. The p-type semiconductor layer is formed in a device having in a plasma discharge space a cathode electrode to which a high-frequency power is applied, and a belt-like member and an anode electrode situated at a ground potential. The surface area of the cathode electrode in the plasma discharge space is larger than the sum of the surface areas of the belt-like member and the anode electrode in the plasma discharge space. At the time of glow discharge, the potential (referred to as the self bias) of the cathode electrode maintains a positive potential relative to the belt-like member and the anode electrode situated at the ground potential. Further, a configuration of a separator-like electrode partially constituting the cathode is formed in a fin or a block not obstructing material gas flowing through the separator-like electrode. The p-type semiconductor layer is formed in the device used to form the semiconductor thin film having the aforementioned cathode. The n-type semiconductor layer is formed in the forming device of the semiconductor thin film having a structure of a capacitive-coupling, parallel-plate type cathode.

As a development in which the method is applied to a continuous manufacture device, the invention provides:
(2) a method of forming a photovoltaic element in which when a belt-like member continuously passes through a plurality of connected vacuum containers, in a plasma CVD method, at least two or more sets of nip junctions constituted of an n-type semiconductor layer, an i-type semiconductor layer and a p-type semiconductor layer are laminated on a surface of the belt-like member. The p-type semiconductor layer is formed in a device having in a plasma discharge space a cathode to which a high-frequency power is applied, and a belt-like member and an anode electrode situated at a ground potential. The surface area of the cathode in the plasma discharge space is larger than the sum of the surface areas of the belt-like member and the anode electrode in the plasma discharge space. At the time of glow discharge, the potential (referred to as the self bias) of the cathode electrode maintains a positive potential relative to the belt-like member and the anode electrode situated at the ground potential. Further, a separator electrode partially constituting the cathode electrode is configured in the form of a fin or block so as not to obstruct material gas flowing through the separator electrode. The p-type semiconductor layer is formed in the device of forming the semiconductor thin film having the aforementioned cathode electrode structure. The n-type semiconductor layer is formed in the forming device of the semiconductor thin film having a cathode electrode structure of a capacitive-coupling, parallel-plate type.

In the invention, a temperature for forming the p-type semiconductor layer is preferably set lower than a temperature for forming the n-type semiconductor layer.

Further, the invention provides:
(1) a device for forming a semiconductor thin film having in a plasma discharge space a cathode electrode to which a high-frequency power is applied, and a belt-like member and an anode electrode situated at a ground potential. The surface area of the cathode electrode in the plasma discharge space is larger than the sum of the surface areas of the belt-like member and the anode electrode in the plasma discharge space. At the time of excitation of glow discharge, the potential (referred to as the self bias) of the cathode electrode maintains a positive potential relative to the belt-like member and the anode electrode situated at the ground potential. Further, a configuration of a separator electrode partially constituting the cathode electrode is formed as a fin or a block so as not to obstruct material gas flowing through the separator electrode. In the device of forming the semiconductor thin film having the aforementioned cathode electrode, to generate plasma in a form of pulse in the plasma discharge space, a high-frequency power is applied in the form of pulse to the cathod electrode. Thereby, even under the condition of high rate deposition, powder does not become present in a deposited film.

As a development in which the device is applied to a continuous manufacture device, the invention provides:

(2) device of forming a photovoltaic element in which when a belt-like member continuously passes through a plurality of connected vacuum containers, in a plasma CVD method, a plurality of different thin films are laminated on a surface of the belt-like member. The device has in a capacitive-coupling type plasma discharge space for forming a semiconductor thin film as a layer constituting the photovoltaic element, a cathode electrode to which a high-frequency power is applied, and a belt-like member and an anode electrode situated at a ground potential. The surface area of the cathode electrode in the plasma discharge space is larger than the sum of the surface areas of the belt-like member and the anode electrode in the plasma discharge space. At the time of glow discharge, the potential (referred to as the self bias) of the cathode electrode maintains a positive potential relative to the belt-like member and the anode electrode situated at the ground potential. Further, a configuration of a separator electrode partially constituting the cathode electrode is formed as a fin or a block so as not to obstruct material gas flowing in a conveying direction of the belt-like member. In the device of forming the photovoltaic element having the aforementioned cathode electrode, to generate plasma in a form of pulse in the plasma discharge space, a high-frequency power is applied in the form of pulse to the cathode electrode. Thereby, even under the condition of high rate deposition, powder does not become present in a deposited film.

Further, the invention provides a method of forming a non-single crystal semiconductor thin film in which while moving a belt-like member, material gas is introduced in a discharge space of a reaction container, and is decomposed by applying a high-frequency power through plasma discharge, to form an i-type semiconductor layer on the belt-like member. The i-type semiconductor layer is formed by repeating one or more times a process of depositing an i-type semiconductor film having a specified film thickness and then applying an $H_2$ plasma process on a surface of the i-type semiconductor film. The $H_2$ plasma process is carried out under conditions whereby that the surface area of the cathode electrode in the plasma discharge space is larger than the sum of the surface areas of the belt-like member and the anode electrode in the plasma discharge space, and at the time of glow discharge, the potential (referred to as the self bias) of the cathode electrode can maintain a positive potential of +5V or more relative to the belt-like member and the anode electrode.

The invention provides a device of forming a non-single crystal semiconductor thin film in which while moving a belt-like member, material gas is introduced in a discharge space of a reaction container, and is decomposed by applying a high-frequency power through plasma discharge, to form an i-type semiconductor layer on the belt-like member. The i-type semiconductor layer can be formed by repeating one or more times a process of depositing an i-type semiconductor film having a specified film thickness and then applying an $H_2$ plasma process on a surface of the i-type semiconductor film. To carry out the $H_2$ plasma process, the device is constituted such that the surface area of the cathode electrode in the plasma discharge space is larger than the sum of the surface areas of the belt-like member and the anode electrode in the plasma discharge space, and at the time of glow discharge, the potential (referred to as the self bias) of the cathode electrode can maintain a positive potential of +5V or more relative to the belt-like member and the anode electrode.

A configuration of a separator electrode partially constituting the cathode electrode is formed as a fin or a block.

The plurality of separator electrodes are arranged parallel with or vertical to the conveying direction of the belt-like member. The interval between the respective separator electrodes is set such that electric discharge is excited and maintained in a gap between the adjoining separator electrodes.

The material gas is passed through a gap between a plurality of the arranged separator electrodes and the belt-like member, a gap between the separator electrodes and/or a gas hole provided in the separator electrode, such that the material gas successively traverses a plurality of the arranged separator electrodes.

BRIEF DESCRIPTION OF THE DRAWINGS

FIG. 13 is a graph showing the relationship between a temperature for forming a first p-type layer and a series resistance according to the invention.

FIGS. 14A, 14B, 14C and 14D are diagrammatic representations showing an example of pulse modulation wave form according to the invention.

DESCRIPTION OF THE PREFERRED EMBODIMENTS

Figure 1:
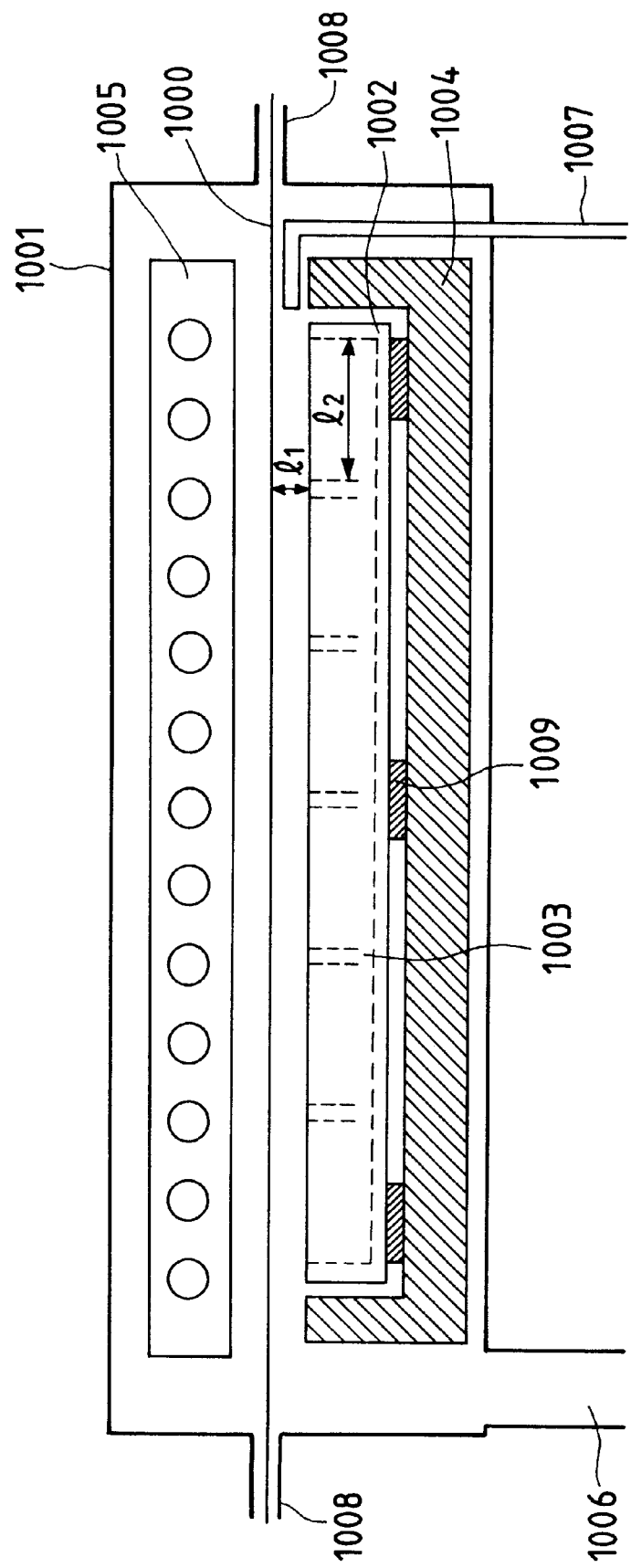
FIGS. 1 and 7 are diagrammatic cross-sectional views of a device of forming a semiconductor thin film using a cathode electrode according to the present invention showing an example of discharge space in the forming device.

In a forming method and device of a photovoltaic element according to the present invention, the problem of a conventional technique of forming a p-type thin film semiconductor layer is eliminated in that the excitation and decomposition reaction of material gas are promoted only in a restricted portion, i.e., in the vicinity of a cathode electrode. The aforementioned excitation and decomposition reaction of material gas are promoted in the entire separator, particularly at the side of an anode electrode including a belt-like member. A thin film can be efficiently deposited on the belt-like member with a relatively high deposition rate. Specifically, the quantity of a high-frequency power supplied to the cathode electrode is appropriately adjusted, and the supplied high-frequency power is effectively used, to efficiently excite and decompose the material gas introduced in the separator. Further, a high-quality P-type semiconductor thin film can be uniformly formed on the belt-like member with a good reproducibility and at a relatively high deposition rate.

In the method and device of forming the photovoltaic element according to the invention, as the material of the cathode electrode, stainless or its alloy, aluminum or its alloy or the like is preferably used. However, the material is not restricted to these as long as it exhibits with conductivity. The same applies to the material of the anode electrode.

In the method and device of forming the photovoltaic element according to the invention, by continuously moving the belt-like member in the longitudinal direction, the belt-like member is passed successively through the film-forming space of the photovoltaic element, to continuously form the photovoltaic element. Further in a method of continuously preparing a laminated-type photovoltaic element by successively passing the belt-like member through a plurality of film-forming chambers of photovoltaic element, the self bias of the cathode electrode disposed in a glow discharge space can preferably maintain a positive potential relative to a grounded anode electrode including the belt-like member. A plurality of separator electrodes in the form of fins or blocks are arranged parallel with or vertical to the conveying direction of the belt-like member. The intervals between the respective separator electrodes are set sufficiently for exciting and maintaining the electric discharge between the adjoining separator electrodes.

According to the invention, the surface area of the cathode electrode in the plasma discharge space is set larger than the sum of the surface areas of the belt-like member and the anode electrode in the plasma discharge space. Further, by exciting the glow discharge and adjusting the high-frequency power to be supplied, the potential (self bias) of the cathode electrode is kept as a positive potential, preferably +5V or more when depositing or forming a semiconductor thin film.

Further in the invention, a plurality of separator electrodes are arranged in the conveying direction of the belt-like member and the interval between the separator electrodes is set sufficiently for exciting and maintaining the electric discharge therebetween, so that the cathode electrode can excite and maintain a relatively large positive potential or self bias. Different from the bias application method or the like using a separately provided DC source or the like, spark or another unusual electric discharge is prevented from occurring. As a result, the electric discharge can be stably excited and maintained. Further, since a part of the cathode electrode having a positive self bias excited, i.e., a tip of the separator electrode, is relatively closer to the belt-like member, the excited relatively large positive potential or bias can be efficiently and stably applied via the discharge space to the film deposited on the belt-like member. In the conventional typical parallel-plate type cathode electrode structure in which the area of the cathode electrode is smaller than the area of the anode electrode, a direct current voltage is applied to the cathode electrode, for example, just by shortening the interval between the cathode electrode and the substrate and also by using the DC source. Different from this method, the aforementioned method uses the self bias potential and an effect of direct current bias application. As compared with the conventional parallel-plate type, according to the invention a p-type semiconductor layer of the same high quality can be obtained even at a lower temperature.

In the invention, ions charged positively by the positive potential of the cathode electrode are accelerated in the direction of the grounded substrate of the belt-like member. Especially, to prepare a high-quality p-type layer, the function of the hydrogen ion among the ions is important.

The positive potential of self bias makes possible the promotion of crystallization by means of the radiation effect of ions present in the plasma discharge even at a low temperature.

Further, on the high-quality p-type semiconductor layer, an n-type semiconductor layer preferably having an amorphous structure is formed.

When the n-type semiconductor layer of the invention is formed in a capacitive-coupling, parallel-plate type separator, the forming temperature is set higher than that of the p-type semiconductor layer.

In the invention, the formation of the n-type and p-type semiconductor layers uses a capacitive-coupling type electric discharge method, in which a sine wave of 13.56 MHz is preferably industrially used.

As aforementioned, in the method of forming the photovoltaic element of the invention, by effectively using ions in forming the p-type thin film semiconductor layer, the forming temperature is lowered, thereby enhancing the properties of the photovoltaic element having a laminated constitution.

Also, the use of the method for forming the photovoltaic element according to the invention is also effective for forming the p-type semiconductor layer of a microcrystal silicon thin film in the photovoltaic element. The forming of a higher-quality semiconductor thin film uniform in space and time with a good reproducibility can be realized, providing an enhanced stability over a long time, reproducibility and uniformity of the electric discharge.

The use of the device for forming the semiconductor thin film according to the invention realizes a remarkably good pn junction particularly in the laminated-type photovoltaic element. A higher-quality photovoltaic element can be uniformly and continuously formed with good reproducibility.

Also, especially when the p-type semiconductor layer is formed of a micro crystal silicon thin film, the use of the device for forming the semiconductor thin film according to the invention realizes the thin film layer of high quality at a relatively high deposition rate. The throughput from the device can be remarkably improved.

Further, according to the method of forming the photovoltaic element of the invention, the aforementioned problem is solved, and a higher-quality photovoltaic element having a superior uniformity can be formed on the continuously moving belt-like member.

The device of forming the semiconductor thin film according to the invention is now described.

FIG. 1 is a diagrammatic cross-sectional view showing the characteristics in an example of a discharge container. In a vacuum container 1001, a cathode electrode 1002 having the structure shown in FIG. 2C is electrically insulated by an insulator 1009 on a grounded electrode or anode electrode 1004. Also on the cathode electrode 1002, a conductive belt-like member 1000 is supported by a plurality of magnet rollers (not shown) to move in a direction shown by an arrow without physically contacting the cathode electrode 1002 positioned below or a lamp heater 1005 positioned above. Material gas introduced from a gas pipe 1007 passes between the belt-like member 1000 and the cathode electrode 1002 and is discharged via an exhaust port 1006 by a vacuum pump (not shown). In the embodiment described later, for a material of the anode electrode and the cathode electrode, SUS316 is used. In FIG. 1, 1008 denotes a gas gate.

The region of the glow discharge excited by a high-frequency power corresponds to each clearance between adjoining ones of a plurality of grounded separator-like electrodes 1003 partially forming the cathode electrode 1002 and a space between the belt-like member 1000 and the cathode electrode 1002. The region is closed with the conductive belt-like member 1000 above.

In the discharge container having the aforementioned structure, the ratio of the surface area of the cathode electrode relative to the sum of the surface areas of the belt-like member and the anode electrode is greater than 1. Also, a closest distance $l_1$ is effectively set to 5 cm or less between the belt-like member 1000 and the separator electrodes 1003 partially forming the cathode electrode and having the form of fins or blocks. The intervals between the plurality of arranged separator electrodes 1003 are sufficient for exciting and maintaining electric discharge, and are appropriately and effectively set in a range from 3 cm to 10 cm as shown by $l_2$ in FIG. 1.

Figure 4:
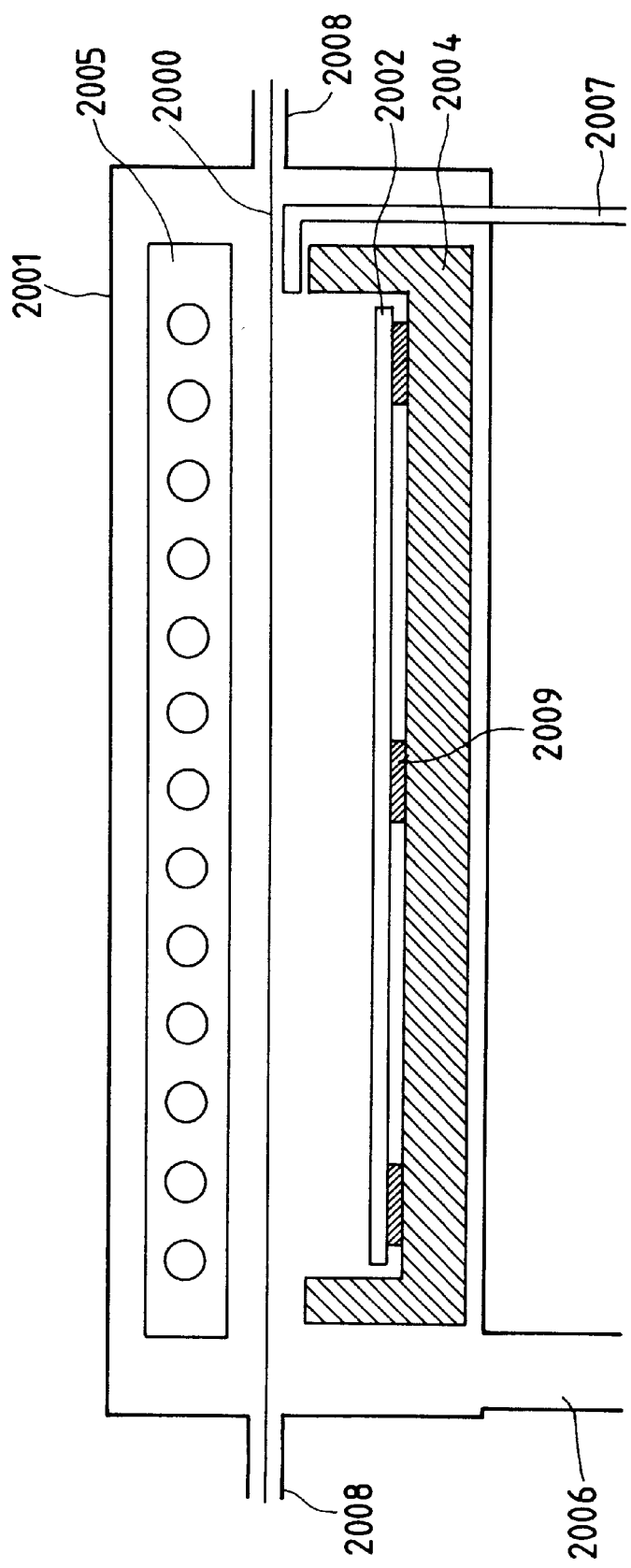
FIG. 4 is a diagrammatic cross-sectional view of a device of forming a semiconductor thin film using a conventional cathode electrode.
Figure 5:
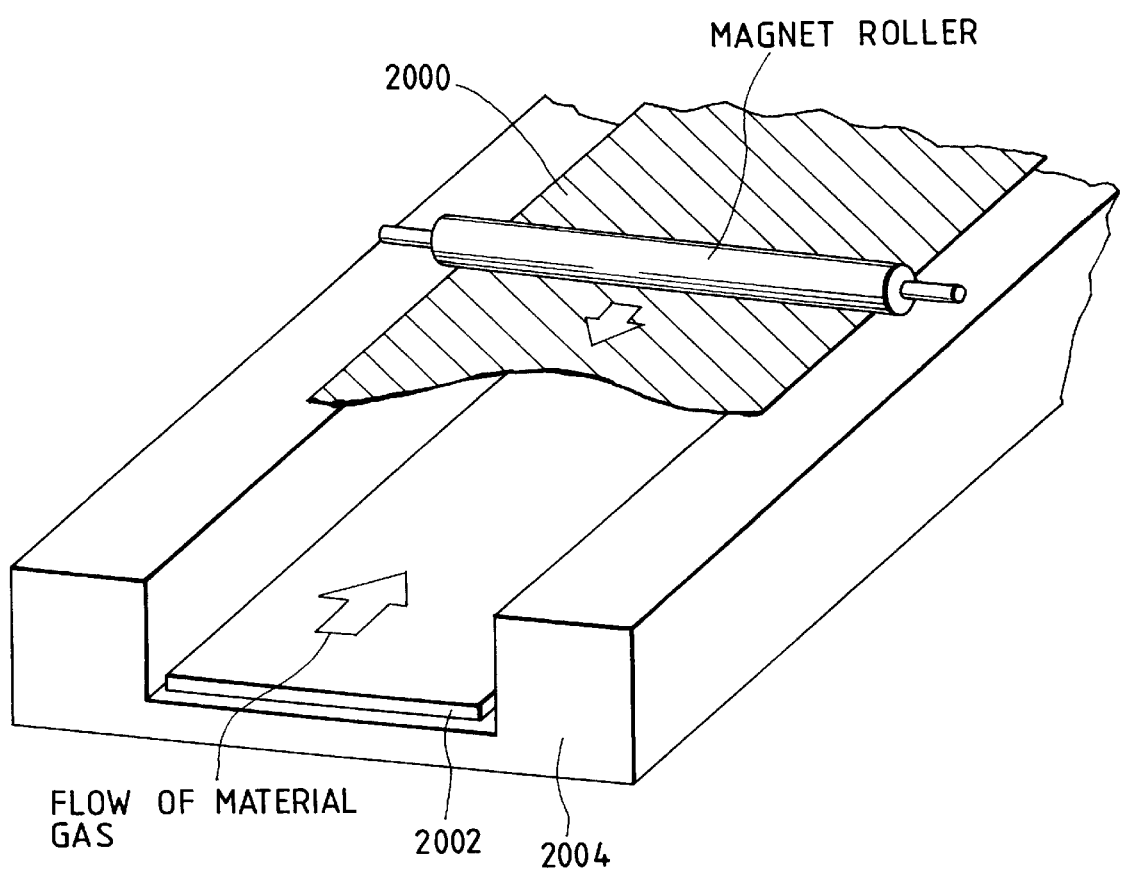
FIG. 5 is a diagrammatic representation showing an example of discharge space in a forming device.

On the other hand, FIGS. 4 and 5 are diagrammatic representations showing a discharge container having a conventional cathode electrode. As shown in the figures, the surface area of a cathode electrode 2002 in contact with a discharge space is smaller than the entire surface area of a grounded anode electrode 2004 including a conductive belt-like member 2000 in contact with the discharge space. Specifically, the ratio of the surface area of the cathode electrode relative to the sum of surface areas of the belt-like member and the anode electrode is clearly less than 1. In the figures, 2001 denotes a vacuum container, 2004 anode electrode, 2005 lamp heater, 2006 exhaust port, 2007 gas pipe, 2008 gas gate and 2009 insulator.

The configuration of the cathode electrode according to the invention is not especially restricted. For example, the cathode electrode can be configured, for example, as diagrammatically shown in FIGS. 2A–2F, and 3A–3F. In the embodiment described later, in each instance, the material of the cathode electrode is SUS316.

Figure 2A:
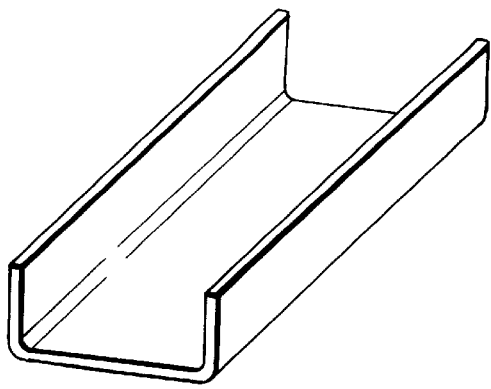
FIGS. 2A, 2B, 2C, 2D, 2E, 2F and FIGS. 3A, 3B, 3C, 3D, 3E and 3F are diagrammatic representations showing an example of a cathode electrode according to the invention.

In FIG. 2A, two separator electrodes are provided along both traverse ends, parallel with the conveying direction of the belt-like member. Material gas can pass between the separator electrodes.

Figure 2B:
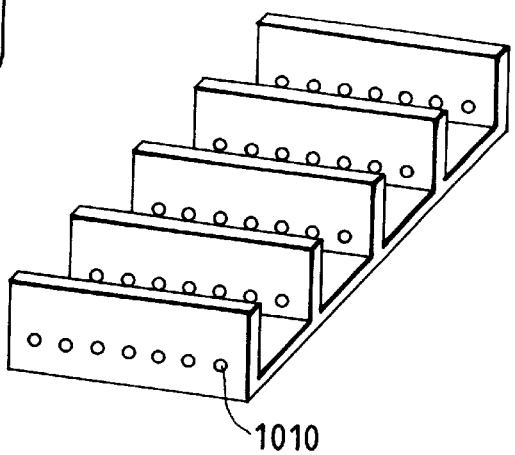
Figure 2C:
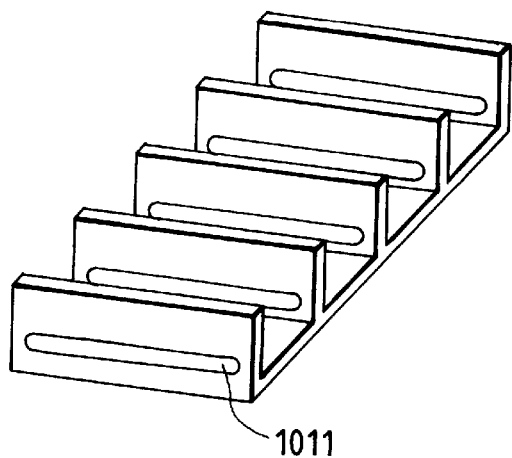
Figure 2D:
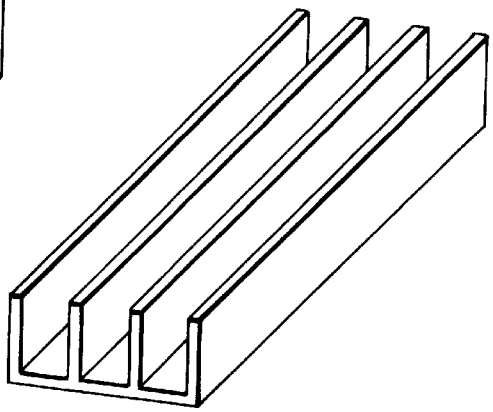
Figure 2E:
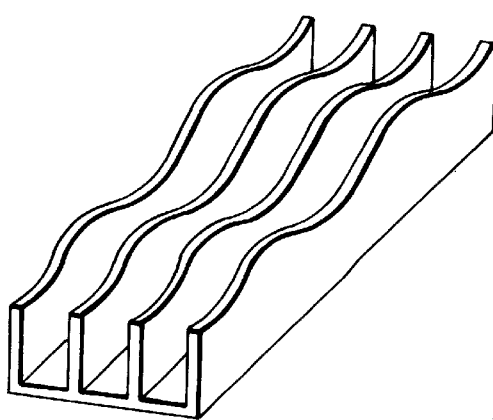
Figure 2F:
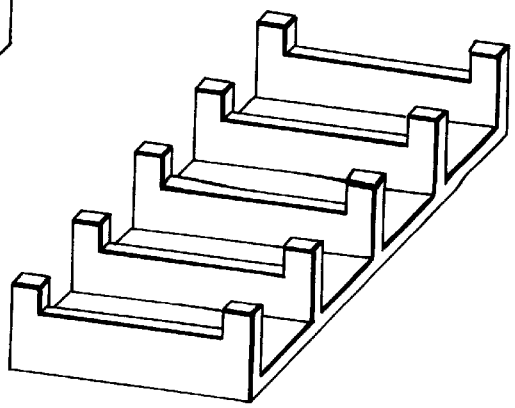

In FIGS. 2B and 2F, a plurality of separator electrodes are arranged perpendicular to the conveying direction of the belt-like member. A plurality of vent holes for passing material gas are provided on the separator electrodes. The vent holes have any size as long as it is sufficient for passing material gas therethrough, without impairing the function as the cathode electrode. For example, vent holes 1011 shown in FIG. 2C can be provided.

In FIG. 2D, a plurality of separator electrodes are linearly arranged parallel with the conveying direction of the belt-like member.

In FIG. 2E, a plurality of separator electrodes are arranged snaking parallel with the conveying direction of the belt-like member.

FIGS. 2A–2F show examples of the separator electrodes having a rectangular cross section and arranged in plural perpendicular to or parallel with the belt-like member. However, the cross-sectional configuration of the separator electrodes is not limited to a rectangle as long as local deflection of gas flow and plasma can be prevented. Further, in FIGS. 2A–2F, the rectangular cross section of the separator electrodes is formed by straight sides, but can be formed by curved sides (not shown). In brief, for the preferable cross-sectional configuration and structure, the surface area of the cathode electrode is larger than that of the anode electrode, and the flow of gas is not obstructed.

By using the aforementioned device of forming the semiconductor thin film according to the invention to form the photovoltaic element, the aforementioned problems are solved, the aforementioned requirements are satisfied, and a high-quality photovoltaic element having superior uniformity and fewer defects can be formed on the continuously moving belt-like member.

In the embodiment described later, unless otherwise mentioned, in the cathode electrode structure of the container, the configuration shown in FIG. 2A is used, and the ratio of the surface area of the cathode electrode relative to the sum of surface areas of the conductive belt-like member and the anode electrode is 2.1. The container is used as a container forming each p-type layer in a continuous plasma CVD method using the roll to roll system shown in FIG. 6, to manufacture a photovoltaic element.

Figure 6:
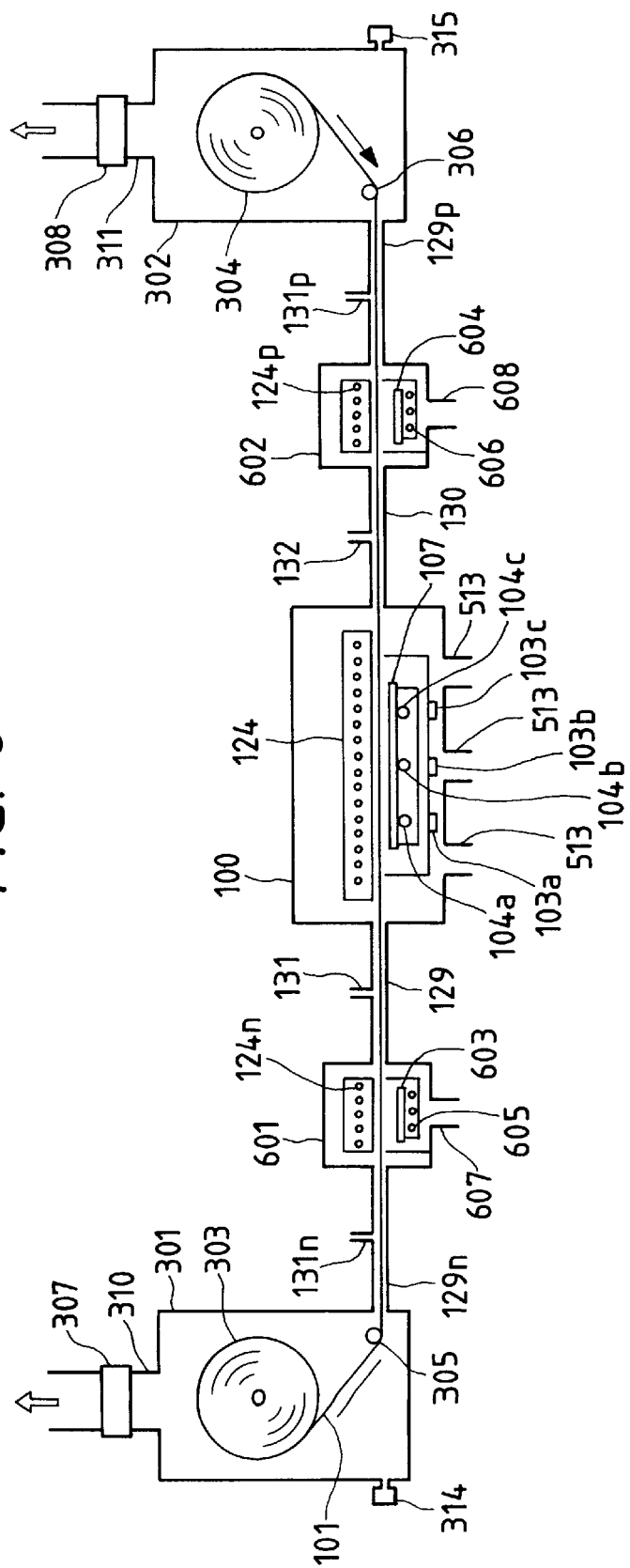
FIG. 6 is a diagrammatic cross-sectional view of a device of forming a photovoltaic element using a device of forming a semiconductor thin film according to the invention.

A device of forming a semiconductor thin film using a method of forming a double-type photovoltaic element according to the invention is described in detail referring to FIG. 6.

In FIG. 6, 100, 301, 302, 601, 602 denote a vacuum container; 101 denotes a belt-like member; 103a, 103b, 103c denote a heater; 104a, 104b, 104c, 604, 606 denote a gas pipe; 107, 603, 604 denote a cathode electrode; 124n, 124, 124p denote a lamp heater; 129n, 129, 129p, 130 denote a gas gate; 131n, 131, 131p, 132 denote a gas gate pipe; 303, 304 denote a bobbin; 305, 306 denote an idling roller; 307, 308 denote a conductance valve; 310, 311, 513, 607, 608 denote an exhaust pipe; and 314, 315 denote a pressure gauge.

(1) Connection Part

In the invention, a gas gate is preferably used in a connection part, so that a vacuum container for delivering and winding the belt-like member is separated from a vacuum container for forming a semiconductor film, and the belt-like member is continuously conveyed through the containers. The gas gate needs to have a capability that the atmosphere of material gas or the like for use in the containers when forming the semiconductor film is prevented from being diffused by a pressure difference created between the containers.

Therefore, the basic concept of a gas gate disclosed in U.S. Pat. No. 4,438,723 can be used, but the capability of the gas gate needs to be improved further. Specifically, the gas gate must bear a pressure difference of about $10^6$ times at maximum. As the exhaust pump, a hydraulic diffusion pump having a high exhaust ability, a turbo molecular pump, a mechanical booster pump or the like is preferably used. The cross-sectional configuration of the gas gate is a slit or another similar configuration. The entire length or another dimension of the gas gate and the exhaust ability of the exhaust pump are calculated and designed using a general formula. Further, to enhance a separative power, a gate gas is preferably used: for example, Ar, He, Ne, Kr, Xe, Rn any other rare gas; or $H_2$ or another diluted gas for forming a semiconductor film is available. The flow rate of the gate gas is appropriately determined by the conductance of the entire gate gas, the ability of the exhaust pump and the like. For example, when a point with a maximum pressure is provided in substantially in the middle of the gas gate, gate gas flows from the middle of the gas gate toward the vacuum containers at both sides, thereby minimizing gas diffusion between the containers. In actual, the optimum conditions are determined by measuring the quantity of diffusing gas with a mass spectrometer or analyzing the composition of the semiconductor film.

(2) Belt-like member

The material of the belt-like member for use in the invention is preferably less deformed at the temperature necessary for forming the semiconductor film and has a desired strength and a conductivity. For example, a metal thin plate of a stainless steel, aluminum or its alloy, iron or its alloy, copper or its alloy or the like or a compound therefore; or a metal foil with its surface coated with a different metal foil and/or an insulating thin film of $SiO_2$, $Si_3N$, $Al_2O_3$, AlN or the like is used in sputtering, evaporation, plating or another method. Alternatively, available is a heat-resistant resin sheet of polyimide, polyamide, polyethylene terephthalate, epoxy or the like; or a compound thereof with glass fiber, carbon fiber, boron fiber, metal fiber or the like with its surface conductively processed or coated with monometal or its alloy, and transparent conductive oxide (TCO) in plating, evaporation, sputtering, applying or other method.

The belt-like member has a thickness providing a strength such that the belt-like member can maintain its curved configuration when conveyed with the conveyor, and is preferably as thin as possible in consideration of storage space or the like. Specifically, the thickness is preferably from 0.01 mm to 5 mm, more preferably from 0.2 mm to 2 mm, most preferably from 0.05 mm to 1 mm. When a metal or other thin plate is used, a desired strength can be easily obtained even if the plate is relatively thin.

The width of the belt-like member is not especially restricted and is determined by the size of a semiconductor film forming means, its container or the like.

Also, the length of the belt-like member is not especially restricted and can be long enough to be wound in a roll. The belt-like member can be formed by further lengthening a longitudinal member by welding or another method.

When the belt-like member is formed of a metal or another electrically conductive material, it is suitable also as an electrode for directly taking out current. When the belt-like member is of a synthetic resin or another electrically insulating material, a surface of the member on which a semiconductor film is formed is preferably processed or coated beforehand with Al, Ag, Pt, Au, Ni, Ti, Mo, W, Fe, V, Cr, Cu, stainless, brass, nichrome, $SnO_2$, $In_2O_3$, ZnO, $SnO_2$—$In_2O_3$ (ITO) or another so-called monometal or its alloy and transparent conductive oxide (TCO) by plating, evaporating, sputtering or another surface processing method, to prepare an electrode for taking out current.

When the belt-like member is translucent formed of metal or the like, a reflective conductive film is preferably formed on the belt-like member for enhancing the reflectance of long wave radiation on a substrate surface. For the reflective conductive film, Ag, Al, Cr or the like is preferably used.

The reflective conductive film formed of a metal layer or the like is preferably provided on a surface of the substrate on which a semiconductor film is to be formed, in order that elements are prevented from being diffused between the substrate material and the semiconductor film or an absorbing layer is formed for preventing short circuit. For the absorbing layer, ZnO is preferably used.

Also, when the belt-like member is relatively transparent and a solar battery is constituted of layers for incident radiation from the side of the belt-like member, the conductive thin film is preferably deposited or formed beforehand using the aforementioned transparent conductive oxide, a metal thin film or the like.

The belt-like member may have a smooth face or have slight surface irregularities. The surface irregularities have a spherical, conical, pyramidal or another configuration and has a maximum height Rmax of preferably between 500 Å and 5000 Å, so that light is irregularly reflected by the surface, and the optical path length of reflected light on the surface is increased.

(3) Photovoltaic Element

Figure 10:
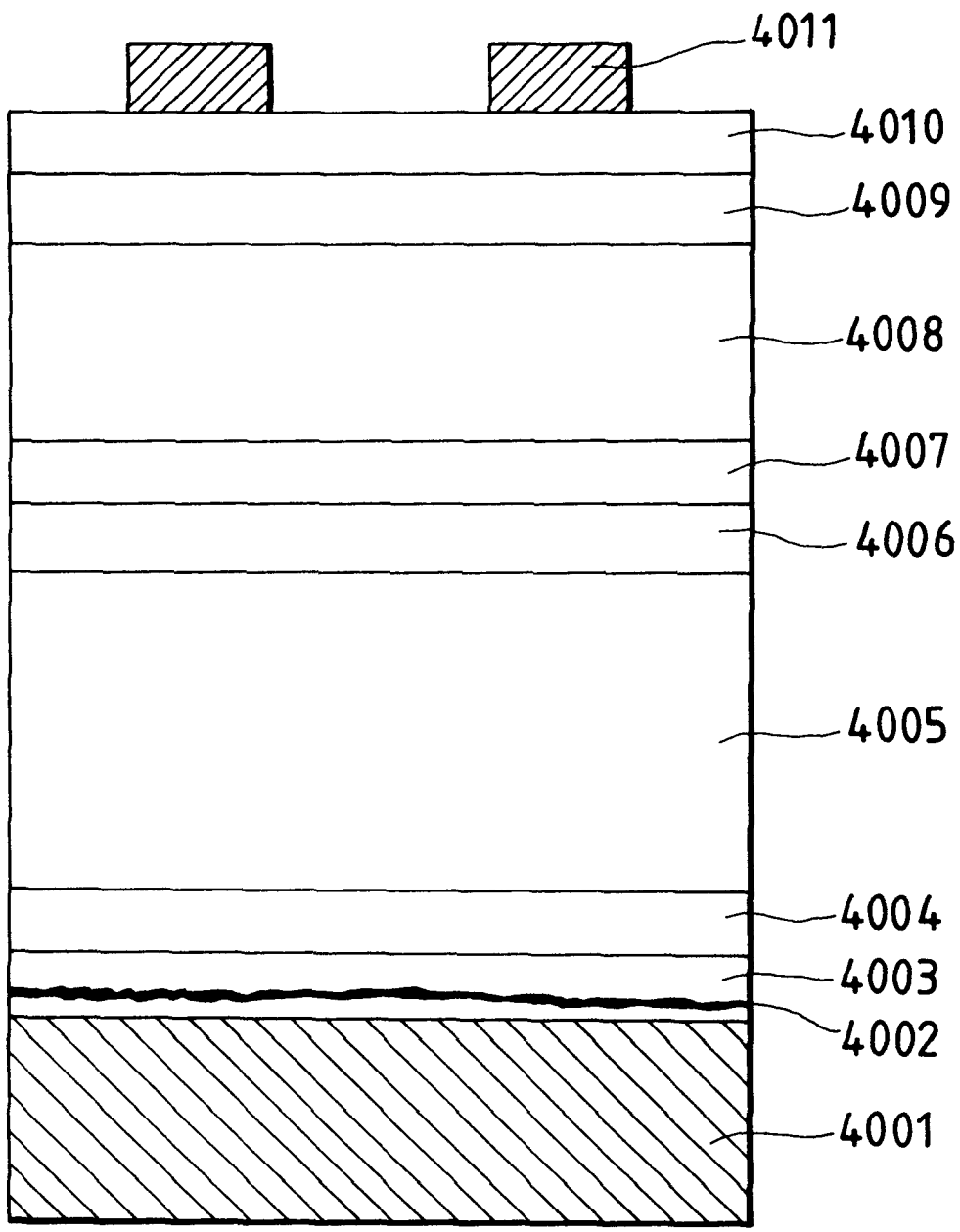
FIG. 10 is a diagrammatic cross-sectional view of a double-cell type photovoltaic element according to the invention.

FIG. 10 is a diagrammatic representation showing the constitution of the photovoltaic element formed in the invention.

A photovoltaic element shown in FIG. 10 is of a double type including two laminated elements using two kinds of semiconductor layers different from each other in band gap and/or layer thickness as i-type layers. Specifically, the photovoltaic element is constituted of a belt-like member 4001 (104), lower electrodes 4002, 4003, a first n-type layer 4004, a first i-type layer 4005, a first p-type layer 4006, a second n-type layer 4007, a second i-type layer 4008, a second p-type layer 4009, an upper electrode 4010 and a collecting electrode 4011.

Figure 11:
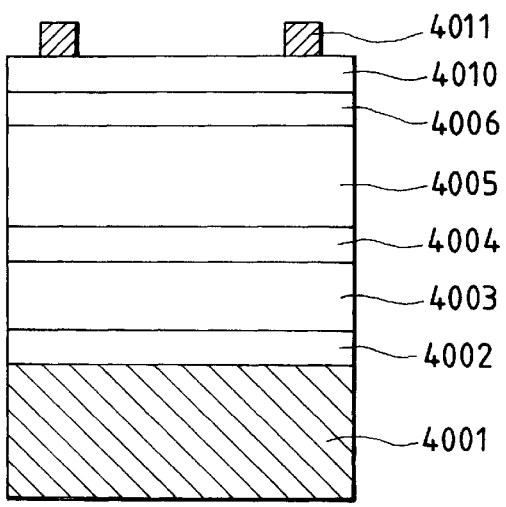
FIG. 11 is a diagrammatic cross-sectional view of a single-cell type photovoltaic element according to the invention.

FIG. 11 shows a so-called single-type photovoltaic element according to the invention.

A photovoltaic element shown in FIG. 11 is of a so-called triple type including three laminated elements using three kinds of semiconductor layers different from one another in band gap and/or layer thickness as i-type layers. Specifically, the photovoltaic element is constituted of a belt-like member 5001 (104), lower electrodes 5002, 5003, a first n-type layer 5004, a first i-type layer 5005, a first p-type layer 5006, a second n-type layer 5007, a second i-type layer 5008, a second p-type layer 5009, a third n-type layer 5010, a third i-type layer 5011, a third p-type layer 5012, an upper electrode 5013 and a collecting electrode 5014.

Each layer constituting the aforementioned photovoltaic element is now described.

(3-1) n-type and p-type conductive layers (first and second conductive layers)

For the first and second conductive layers in the photovoltaic element of the invention, a non-single crystal semiconductor is suitably constituted of one or a plurality of elements belonging to group III or V in the periodic table. Further, as the conductive layer at the side of radiation, a microcrystal semiconductor is suitable. The diameter of the microcrystal is preferably from 3 nm to 20 nm, most preferably from 3 nm to 10 nm.

When the conductive layer is of n-type, an element of group V in the periodic table is preferably added. Especially, phosphorous (P), nitrogen (N), arsenic (As) and antimony (Sb) are suitable.

When the conductive layer is of p-type, an element of group III in the periodic table is preferably added. Especially, boron (B), aluminum (Al) and gallium (Ga) are suitable.

The thickness of each conductive layer is preferably from 1 nm to 50 nm, most preferably from 3 nm to 10 nm.

To reduce photoabsorption by the conductive layer at the radiation side, the semiconductor layer having a greater band gap than the band gap of the semiconductor layer forming the i-type layer is preferably used. For example, when the i-type layer is of amorphous silicon, the conductive layer at the radiation side is most preferably formed of non-single crystal silicon carbide.

(3-2) i-type layer

A semiconductor material for use in the i-type layers in the photovoltaic elements of the invention is constituted of one element or a plurality of elements of group IV in the periodic table: Si, Ge, C, Si, SiC, GeC, SiSn, GeSn, SnC or the like. Available are as a III-V group compound semiconductor are GaAs, GaP, GaSb, InP, or InAs; as a II-VI group compound semiconductor ZnSe, ZnS, ZnTe, CdS, CdSe or CdTe; as a I-III-VI group compound semiconductor $CuAlS_2$, $CuAlSe_2 CuAlTe_2$, $CuInS_2$, $CuInSe_2$, $CuInTe_2$, $CnGaS_2$, $CuGaSe_2$, $CuGaTe$, $AgInSe_2$ or $AgInTe_2$; as a II-IV-V group compound semiconductor, $ZnSiP_2$, $ZnGeAs_2$, $CdSiAs_2$ or $CdSnP_2$; and as an oxide semiconductor, $Cu_2O$, $TiO_2$, $In_2O_3$, $SnO_2$, ZnO, CdO, $Bi_2O_3$ or $CdSnO_4$.

The aforementioned positive self bias holds a potential for a while even after plasma maintaining power expires. At the moment when plasma expires, fine particles such as cluster, powder or the like charged by negative electric charge present in plasma discharge are efficiently accelerated toward the separator electrode of the cathode electrode holding the positive potential. As a result, the probability that cluster, powder or other fine particles are taken into the semiconductor thin film being deposited is remarkably decreased. Further, it is important to efficiently exhaust cluster, powder or other fine particles. For this purpose, material gas introduced into the discharge space is directed in the same or opposite direction relative to the conveying direction of the belt-like member. In this case, it is important that the separator electrodes are configured not to obstruct the flow of gas while providing a sufficient cathode electrode area.

In the capacitive-coupling type discharge device according to the invention, a sine wave of 13.56 MHz is industrially preferably used. By modulating a basic frequency 13.56 MHz of the sine wave as regards cycle and wave height value, the plasma in the form of pulse can be excited in the discharge space. For example, as shown in FIG. 14A, when a rectangular wave of 1 Hz at an on-off ratio of 20% is superimposed on the sine wave of 13.56 MHz, plasma discharge occurring once per second is excited for 0.2 second and extinguished for 0.8 second in the discharge space. Most active ones among active kinds generated for 0.2 second are centrally grown into cluster or powder. Subsequently, when plasma discharge is discontinued for 0.8 second, cluster, powder or other fine particles negatively charged by the remaining positive potential of the cathode electrode are accelerated in a direction apart from the belt-like member. The fine particles are quickly exhausted through the flow defined by the configuration of the separator electrodes disposed not to obstruct the flow of exhaust. As a result, powder, cluster or other fine particles grown in plasma to deteriorate the properties of the semiconductor thin film can be prevented from being taken into the film.

When the plasma discharge is disconnected, the supply quantity of the active kinds contributing to film forming is decreased, thereby decreasing the film forming rate and the gas utilization factor. To compensate for the decrease, the wave height value of the modulated wave is increased. That is to say, high-density plasma is momentarily excited to increase the number of moles for material gas decomposition raised and control the proceeding of decomposition. For example, in case of $SiH_4$, the decomposition in plasma proceeds to $SiH_3$, $SiH_2$, then SiH as time elapses, and changes gas quality to chemically active kinds. The changed active kinds are supposed to cause generation and growth of powder.

The momentary formation of high-density plasma increases the film-forming rate and the utilization factor of material gas. It is believed that the restriction of decomposition time controls the generation of powder.

In the invention, by applying an industrially used sine wave with 13.56 MHz of high-frequency power in the form of pulse to material gas $SiH_4$ or $H_2$ including doping gas, the pulsed plasma is excited, and decomposition and exhaust can intermittently proceed.

By modulating the frequency 13.56 MHz of the sine wave in terms of time and wave height value, the pulsed plasma according to the invention can be realized. In the invention, to optimize the aforementioned decomposition and exhaust processes of material gas, the modulation frequency is changed experimentally, and the resulting enhancement of desired properties of the semiconductor thin film is confirmed, to appropriately determine the modulation configuration of the pulsed plasma. Specifically, the modulation frequency is selectable in a range between 0.1 Hz and 1 MHz, preferably between 1 Hz and 100 kHz. Also, the wave height value of the sine wave with 13.56 MHz can be optimized by applying to 13.56 MHz of sine wave the pulse in the form of asine wave, rectangular wave, triangular wave or the like. These conditions can be appropriately selected in determining the conditions of plasma for forming a desired semiconductor thin film. FIG. 14B shows an example of modulation by triangular wave, and FIG. 14C shows an example of modulation by sine wave with an on-off ratio of 20%. FIG. 14D shows an example of modulation by sawtooth-wave with an on-off ratio of 30%.

As aforementioned, in the forming device according to the invention, by optimizing the active kinds generated by changing the plasma forming conditions as time elapses, discontinuing plasma discharge and exhausting active powder, a high-rate deposition, an increased gas utilization factor and an enhanced film quality can be achieved.

By using the forming device of the invention, over a long period of film-forming time when a semiconductor layer is formed on the belt-like member extending several hundreds of meters, the uniform electric discharge condition with a good reproducibility can be maintained and controlled to form the semiconductor layer. Therefore, a high-quality, uniform semiconductor deposited film can be continuously formed with a good yield on the entire longitudinal belt-like member from its commencing end to its terminal end.

Further, the use of the forming device according to the invention is also effective when the p-type semiconductor layer or the n-type semiconductor layer of the photovoltaic element is formed of a microcrystal silicon thin film. The electric discharge is stabilized over a long time, the reproducibility is enhanced and the uniformity is improved. The formation of a high-quality semiconductor thin film uniform in space and time and having good reproducibility can be realized.

Also, the use of the forming device according to the invention can realize a remarkably superior pn junction especially in the laminated-type photovoltaic element. A higher-quality photovoltaic element can be uniformly and continuously formed with a good reproducibility.

By using the device of the invention, especially when the p-type semiconductor layer or the n-type semiconductor layer is formed of a micro crystal silicon thin film, the thin film layer of high quality can be formed at a relatively high deposition rate. The throughput of the device can be remarkably improved.

As aforementioned, in the invention by forming the photovoltaic element with the device of continuously forming the photovoltaic element, the aforementioned problems are solved, and a higher-quality photovoltaic element with a good uniformity can be formed while continuously conveying the belt-like member.

The device for forming the semiconductor thin film and the photovoltaic element according to the invention is again described in the following.

Figure 7:
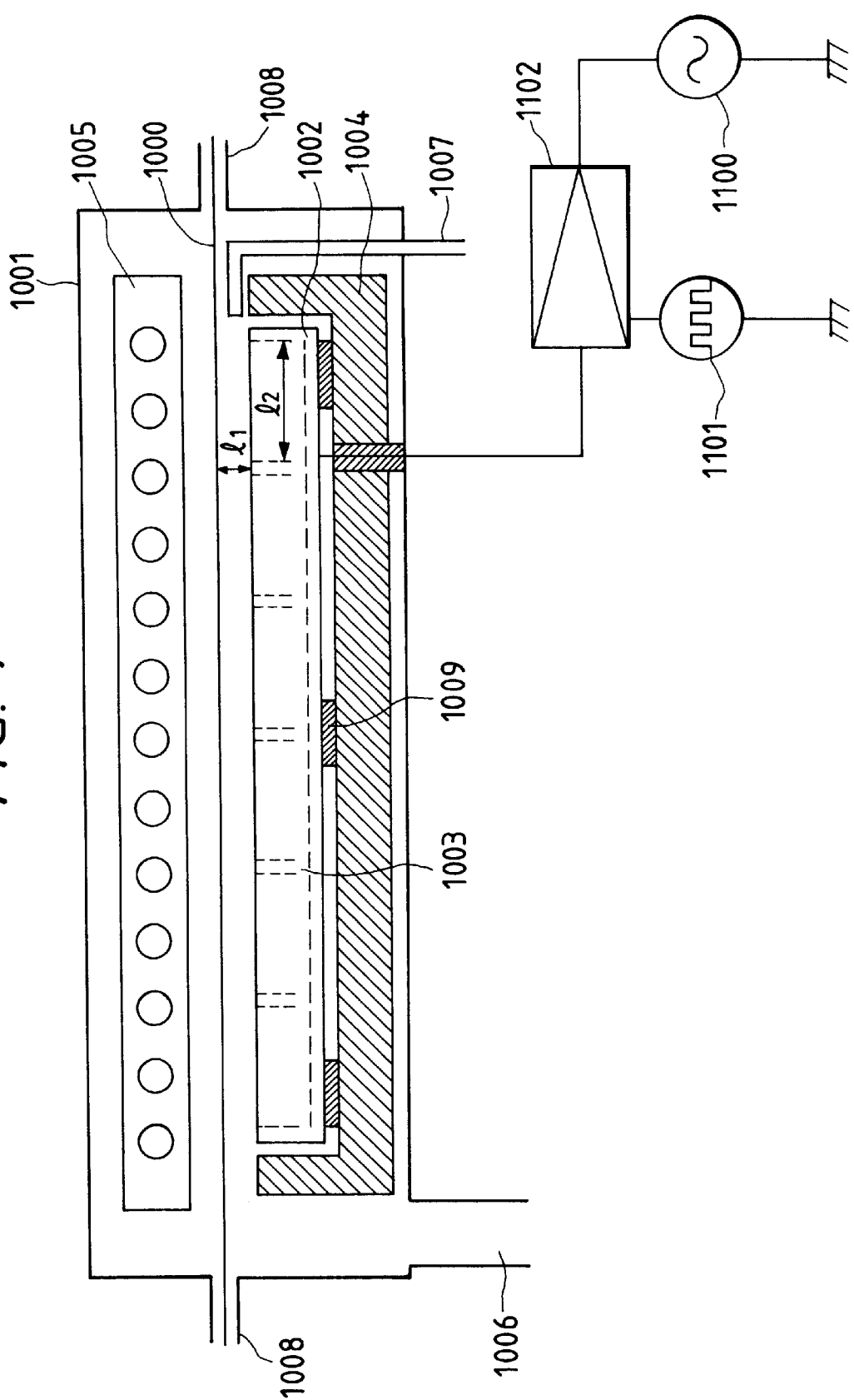

FIG. 7 is a diagrammatic cross-sectional view showing the characteristics of a discharge container according to the invention. A cathode electrode 1002 having the structure shown in FIG. 2C is electrically insulated by an insulator 1009 on a grounded electrode or anode electrode 1004. Also on the cathode electrode 1002, a conductive belt-like member 1000 is supported by a plurality of magnet rollers (not shown) to move in a direction shown by an arrow without physically contacting the cathode electrode 1002 positioned below or a lamp heater 1005 positioned above. Material gas introduced from a gas pipe 1007 passes between the belt-like member 1000 and the cathode electrode 1002 and is discharged via an exhaust port 1006 by a vacuum pump (not shown). As a material of the anode electrode and the cathode electrode, SUS316 is used.

In FIG. 7, 1100 denotes an oscillator of a high frequency 13.56 MHz, 1101 denotes an oscillator for modulation, and 1102 denotes an amplifier electrically connected via a high-frequency cable to the cathode electrode 1002. Here, a high-frequency wave of 13.56 MHz is introduced from the high-frequency oscillator 1100 to the amplifier 1102, and the cycle, on-off ratio, wave height value and wave form of the output wave can be arbitrarily controlled by the modulation oscillator 1101.

The discharge region of the glow discharge excited by modulating the high-frequency power corresponds to the clearance among a plurality of grounded separator electrodes 1003 partially forming the cathode electrode, and the space between the belt-like member and the cathode electrode, which are closed by the conductive belt-like member positioned above.

In the discharge container having the aforementioned structure, the ratio of the surface area of the cathode electrode relative to the sum of surface areas of the belt-like member and the anode electrode is greater than 1. Also, a closest distance $l_1$ is effectively set to 5 cm or less between the belt-like member 1000 and the separator electrodes 1003 partially forming the cathode electrode and having a form of fins or blocks. The intervals between the plurality of arranged separator electrodes 1003 are sufficient for exciting and maintaining electric discharge and are appropriately and effectively set in a range from more than 3 cm to less than 10 cm as shown by $l_2$ in FIG. 7.

The configuration of the cathode electrode according to the invention is not especially restricted. For example, the cathode electrode can be configured, for example, as diagrammatically shown in FIGS. 2A–2F and 3A–3F.

On the other hand, in the method of forming the non-single crystal semiconductor thin film according to the invention, after an i-type layer with a constant film thickness is formed at a preferably relatively high deposition rate, $H_2$ plasma process is applied, while the cathode electrode excites and maintains a positive self bias. Thereby, the film quality of the substrate i-type layer can be improved. Subsequently, on the substrate i-type layer of the improved film quality, an i-type layer with a constant film thickness, and the $H_2$ plasma process is again applied. The processes are repeated until a desired film thickness is reached, so that the film quality of the i-type layers is further improved. In the forming method, the film thickness of the i-type layer immediately before the $H_2$ plasma process is preferably from 20 nm to 100 nm. In case of a very thin film of 20 nm or less, since the i-type layer itself is not necessarily uniform, the layer tends to be etched or removed in the subsequent $H_2$ plasma process. If the film thickness exceeds 100 nm, the effect of the subsequent $H_2$ plasma process cannot be sufficiently fulfilled due to its thickness. Therefore, for example, when the desired entire film thickness of the i-type layer is 200 nm, the aforementioned operation may be repeated twice or more.

In the invention, the aforementioned $H_2$ plasma process is preferably applied to the surface of the i-type semiconductor film being deposited. That is to say, by carrying out the $H_2$ plasma process after the formation of the i-type layer and also during the formation of the i-type layer, a higher-quality i-type layer can be obtained.

As the material of the cathode electrode constituting the forming device according to the invention, stainless or its alloy, aluminum or its alloy or the like is preferably used. The material is not restricted to these as far as it exhibits conductivity. The same applies to the material of the anode electrode.

In the device according to the invention of forming the photovoltaic element according to the invention, by continuously moving the belt-like member in the longitudinal direction, the belt-like member is passed successively through the film-forming space of each thin film, to continuously form the photovoltaic element. Further, in a device of continuously preparing a laminated-type photovoltaic element by successively passing the belt-like member through a plurality of film-forming chambers of a photovoltaic element, the surface area of the high-frequency applied cathode electrode in contact with the electric discharge in the discharge space is made larger than the surface area of the grounded anode electrode including the belt-like member in contact with the discharge space. Thereby, the self bias of the cathode electrode disposed in a glow discharge space can preferably maintain a positive potential relative to a grounded anode electrode including the belt-like member. A plurality of separator electrodes in the form of fins or blocks are arranged parallel with or vertical to the conveying direction of the belt-like member. The intervals between the respective separator electrodes are set sufficiently for exciting and maintaining the electric discharge between the adjoining separator electrodes.

The interval between the separator electrodes and the belt-like member is 5 cm or less, avoiding the physical contact therebetween.

The plurality of separator electrodes is arranged parallel with or vertical to the conveying direction of the belt-like member. The interval between the respective separator electrodes is set such that electric discharge is excited and maintained in a gap between the adjoining separator electrodes. Further, the interval between the adjoining separator electrodes is from 2 cm to 10 cm. Therefore, a relatively large positive potential of self bias can be excited and maintained on the cathode electrode. As a result, different from the bias application method or the like using a separately provided DC current or the like, spark or another unusual discharge can be prevented. Consequently, the electric discharge can be stably excited and maintained.

Further since a part of the cathode electrode having a positive self bias excited, i.e., a tip of the separator electrodes is relatively closer to the belt-like member, the excited relatively large positive potential can be efficiently and stably applied via the discharge space to the film deposited on the belt-like member. This bias application method is different from the prior art. In the conventional typical device having a parallel-plate type cathode electrode structure in which the area of the cathode electrode is smaller than that of the grounded anode electrode, a direct current voltage is applied to the cathode electrode, for example, just by shortening the interval between the cathode electrode and the substrate and also by using the DC source. Far different from the prior art, the aforementioned method is a direct current bias application means.

Also in the forming device of the invention, during the aforementioned $H_2$ plasma process, by exciting and maintaining the positive potential of the cathode electrode, plasma is localized at the side of the belt-like member. Therefore, the utilization efficiency of material gas and the film depositing rate are enhanced.

The effect is obtained as a result of solving two problems in the conventional typical parallel-plate type cathode electrode.

(a) In the conventional structure, since the sheath width is relatively small at the side of the cathode electrode, plasma is localized toward the cathode electrode. As a result, the high-frequency power applied to the cathode electrode is consumed for decomposing material gas in the vicinity of the cathode electrode. Even when the high-frequency power is increased to increase the deposition rate, the film is deposited on the cathode electrode itself, rather than on the belt-like member or another substrate on which the film is to be deposited.

(b) In the prior art, when the deposition speed is increased, the content of hydrogen in the film is increased or a polymer-like region is increased in the film. Therefore, the characteristics of the resulting deposited film tends to be remarkably deteriorated.

Therefore, according to the forming device of the invention, the cathode electrode to which power is applied is maintained as a positive potential, and the self bias is applied to the film deposited on the belt-like member in a direction in which a positively charged ion is irradiated. The ion bombardment effectively imparts energy to the surface of the deposited film. As a result, the relaxing of the film structure is promoted even at a relatively high deposition rate. The quality and density of the film can be effectively and easily increased. Especially during the $H_2$ plasma process, as a result of effectively applying the ion bombardment to the substrate i-type layer, a high-quality of the i-type layer can be achieved. Also in the device of the invention, to realize a high-quality i-type semiconductor layer uniformly at a relatively high deposition rate with good reproducibility, the self bias of the cathode electrode for $H_2$ plasma processing the i-type semiconductor layer is preferably +5V or more, either after or during deposition.

By using the forming device of the invention, over a long period of film forming time when a semiconductor layer is formed on the belt-like member extending several hundreds of meters, the uniform electric discharge condition with good reproducibility can be maintained and controlled to form the semiconductor layer. Therefore, a high-quality, uniform semiconductor deposited film can be continuously formed with a good yield on the entire longitudinal belt-like member from its commencing end to its terminal end.

Further, when forming a non-single crystal i-type semiconductor layer of the photovoltaic element by using the device according to the invention, the utilization efficiency of material gas can be remarkably enhanced. Even when the film depositing rate is relatively increased, a uniform, high-quality i-type semiconductor deposited film can be obtained.

When the i-type semiconductor layer is formed by using the device of the invention, a high-quality thin film layer can be obtained at a relatively high deposition rate, thereby remarkably enhancing the throughput of the device.

The device of forming the semiconductor thin film and the photovoltaic element according to the invention is now described.

Figure 3A:
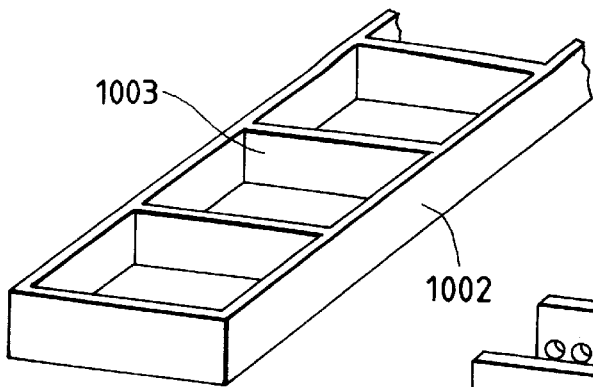

FIG. 1 is a diagrammatic cross-sectional view showing the characteristics of an example of a discharge container of the invention. A cathode electrode 1002 having the structure shown in FIG. 3A is electrically insulated by an insulator 1009 on a grounded electrode or anode electrode 1004. Also on the cathode electrode 1002, a conductive belt-like member 1000 is supported by a plurality of magnet rollers (not shown) allowing movement in a direction shown by an arrow without physically contacting the cathode electrode 1002 positioned below or a lamp heater 1005 positioned above. Material gas introduced from a gas pipe 1007 passes between the belt-like member 1000 and the cathode electrode 1002 and is discharged via an exhaust port 1006 by a vacuum pump (not shown). In the embodiment described later, as a material of the anode electrode and the cathode electrode, SUS316 is used. In FIG. 1, 1008 denotes a gas gate. The region of the glow discharge excited by a high-frequency power applied from a high-frequency source (not shown) corresponds to each clearance between adjoining ones of a plurality of grounded separator-like electrodes 1003 partially forming the cathode electrode 1002 and a space between the belt-like member 1000 and the cathode electrode 1002, which is closed with the conductive belt-like member 1000 above. The entire length of the cathode electrode (parallel with the conveying direction of the belt-like member) varies with the kind of a deposited film, the flow rate of material gas, the supplied power, the conveying rate of the belt-like member and other conditions. Basically, the length sufficient for obtaining a desired film thickness may be selected.

In the discharge container having the aforementioned structure, the ratio of the surface area of the cathode electrode relative to the sum of the surface areas of the belt-like member and the anode electrode is greater than 1. Also, a closest distance 11 is effectively set to 5 cm or less between the belt-like member 1000 and the separator electrodes 1003 partially forming the cathode electrode and having the form of fins or blocks. The intervals between the plurality of arranged separator electrodes 1003 are sufficient for exciting and maintaining electric discharge, and are appropriately and effectively set in a range from 3 cm to 10 cm as shown by $l_2$ in FIG. 1.

The configuration of the cathode electrode according to the invention is not restricted to FIG. 3A. For example, the cathode electrode can be configured, as diagrammatically shown in FIGS. 2A–2F and 3B–3F. In the embodiment described later, in each instance, the material of the cathode electrode is SUS316.

Figure 3B:
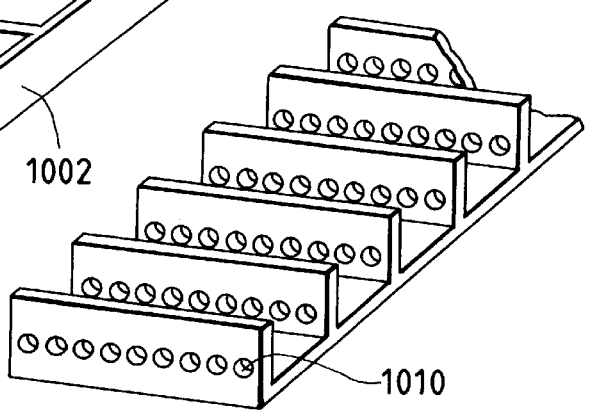
Figure 3C:
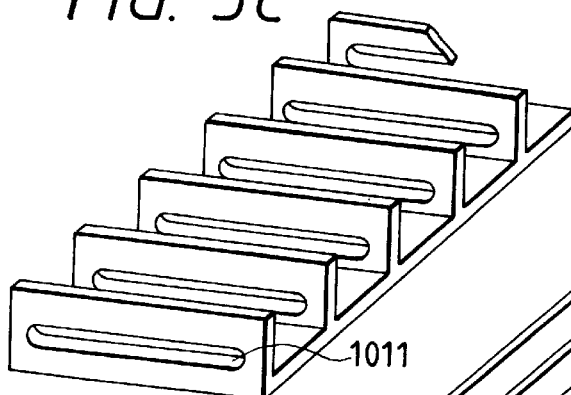

In FIG. 3B, a plurality of separator electrodes is arranged perpendicular to the conveying direction of the belt-like member. A plurality of vent holes for passing material gas is provided on the separator electrodes. The vent holes have any size sufficient for passing material gas therethrough, without impairing the function as the cathode electrode. For example, vent holes shown in FIG. 3C can be provided.

Figure 3D:
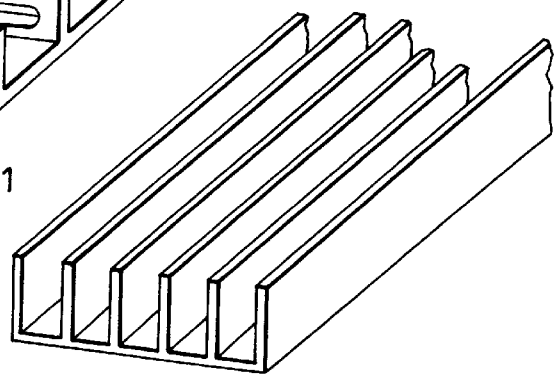

In FIG. 3D, a plurality of separator electrodes is arranged parallel with the conveying direction of the belt-like member.

Figure 3E:
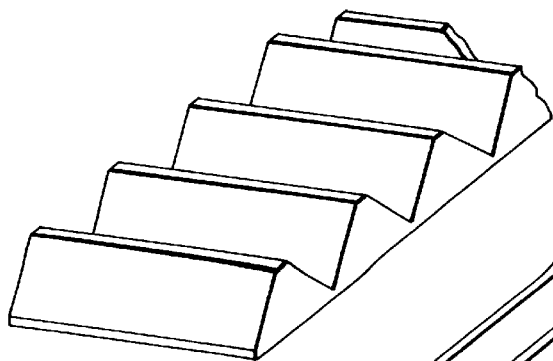

In FIG. 3E, the cross-sectional configuration of a plurality of separator electrodes arranged perpendicular to the conveying direction of the belt-like member is non-rectangular. The cross section of the separator electrode is not necessarily rectangular. The non-rectangular cross section shown in the example is constituted by straight sides, but may be constituted by curved sides (not shown). In brief, the cross section needs to be configured such that the surface area of the cathode electrode is larger than the surface area of the anode electrode.

Figure 3F:
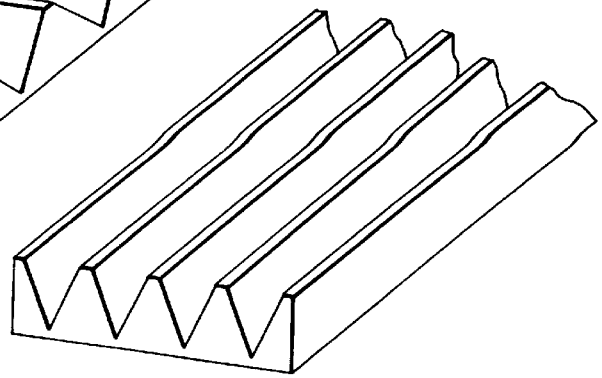

An example of FIG. 3F is made by forming the cross section of the separator electrodes shown in FIG. 3D not-rectangular. In the same manner as FIG. 3E, the non-rectangular cross section of the separator electrodes may be constituted by curved sides.

Figure 8:
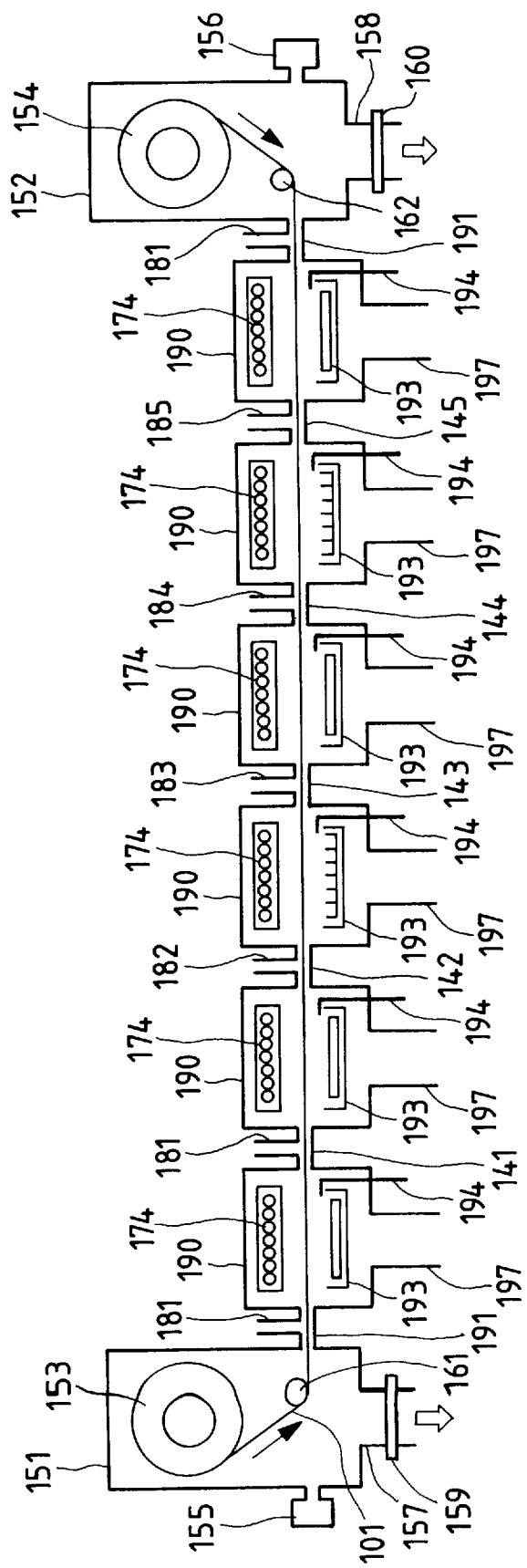
FIG. 8 is a diagrammatic representation showing an example of a forming device using a method of forming a non-single crystal semiconductor thin film according to the invention.

FIG. 8 is a diagrammatic representation showing a device for forming a non-single crystal semiconductor thin film according to the invention, especially for forming a single-cell type photovoltaic element.

In FIG. 8, among four vacuum containers 190a, 190b, 190c and 190d for forming an i-type layer, two vacuum containers 190b and 190d are provided with cathode electrodes having fins 193b and 193d. In the vacuum containers 190b and 190d, $H_2$ plasma processing is carried out. In the other vacuum containers 190a and 190c, conventional cathode electrodes 193a and 193c are provided to form an i-type semiconductor film.

In the following, a photovoltaic element was formed using the device of forming the semiconductor thin film and the photovoltaic element according to the invention, and the properties of the resulting photovoltaic element were evaluated. However, the invention is not restricted to the following embodiments.

EXAMPLE 1

In Example 1, by using a continuous plasma CVD device in a roll to roll system shown in FIG. 6, a double-cell type photovoltaic element shown in FIG. 10 was prepared.

Especially, to prepare a double cell, a vacuum container for preparing each conductive layer was additionally provided in the device (not shown). Specifically, a first n-type layer forming vacuum container 601, an i-type layer forming vacuum container 100 and a first p-type layer forming vacuum container 602 were connected via a gas gate into one set. Another set was added, and two sets in total were repeated or arranged in series, to appropriately form the device for use.

When forming the aforementioned double-cell type photovoltaic element, the temperature for forming the second n-type layer was fixed to 300° C., and the temperature for forming the first p-type layer was varied in a range from 100° C. to 350° C.

The cathode electrode of the vacuum container for forming each p-type layer has the separator configuration shown in FIG. 2A. In the cathode electrode structure, the ratio of the surface area of the cathode electrode relative to the sum of surface areas of the conductive belt-like member and the anode electrode was set 2.1 times.

Also, as each n-type layer forming container and each i-type layer forming container, containers having a parallel-plate type RF electrode were used.

In the device of Example 1, in the same manner as in FIG. 6, the vacuum containers 301 and 302 for delivering and winding the belt-like member 101 are provided. Between these two vacuum containers, the first n-type layer forming vacuum container 601, the first i-type layer forming vacuum container 100, the first p-type layer forming vacuum container 602, the second n-type layer forming vacuum container 601, the second i-type layer forming vacuum container 100 and the second p-type layer forming vacuum container 602 are connected via a gas gate.

The structure of the respective cathode electrodes disposed in each vacuum container 601, 100, 602 has the aforementioned cathode electrode structure.

By using the aforementioned manufacture device, under forming conditions shown in Table 1-1, the first n-type layer, the first i-type layer, the first p-type layer, the second n-type layer, the second i-type layer and the second p-type layer were continuously formed on the lower electrode by the following procedure, to prepare a double-cell type photovoltaic element (referred to as Element-E1).

(1) First, the bobbin 303 with the belt-like member 101 wound therearound was set in the vacuum container 301 having a substrate delivery mechanism. As the belt-like member 101, a belt-like member of SUS430 BA (width 120 mm×length 200 m×thickness 0.13 mm) was prepared by carrying out sufficient degreasing and cleaning and evaporating a silver thin film 4002 of 100 nm and a ZnO thin film 4003 of 1 μm deposited as the lower electrodes in a sputtering method.

(2) The belt-like member 101 was passed via the gas gate and each non-single crystal layer forming vacuum container to the vacuum container 302 having a belt-like member take-up mechanism, in which the tension was adjusted to remove any slacks.

(3) Each vacuum container 301, 601, 100, 602, 601, 100, 602 and 302 was evacuated with a vacuum pump (not shown).

(4) Gate gas $H_2$ of 700 sccm was supplied from each gate gas pipe to each gas gate, and the belt-like member 101 was heated by the lamp heaters 124n, 124, 124p, 124n, 124 and 124p to 350° C., 350° C., 100 to 350° C., 300° C., 200° C. and 200° C., respectively.

(5) A specified gas was introduced from each gas pipe according to the conditions shown in Table 1-1.

(6) The pressure of each vacuum container was adjusted with each conductance valve to be a pressure value as shown in Table 1-1.

(7) After the process (6) of pressure adjustment, each RF power shown in Table 1-1 was introduced to each cathod electrode.

(8) The belt-like member 101 was conveyed in a direction shown by an arrow in FIG. 6, to form the first n-type layer, the first i-type layer, the first p-type layer, the second n-type layer, the second i-type layer and the second p-type layer successively on the belt-like member 101.

(9) On the second p-type layer formed in the process (8), as a transparent electrodes ITO ($In_2O_3+SnO_2$) was deposited 80 nm by vacuum evaporation, and further as a collecting electrodes Al was deposited 2 μm by vacuum evaporation, thereby finishing formation of the photovoltaic element (referred to as Element-E1).

Table 1-1 shows the conditions for forming the photovoltaic element in Example 1.

TABLE 1-1

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al) thin film, 2 μm
RF electrode of each n and i-type layer: parallel-plate type
RF electrode of each p-type layer: separator of FIG. 2A

| Layer | Layer Thickness (nm) | Gas and gas flow rate (sccm) | | RF power (W) | Pressure (Torr) | Substrate Temperature (° C.) |
|---|---|---|---|---|---|---|
| First n-type layer | 40 | $SiH_4$<br>$PH_3/H_2$ (2% DILUTION)<br>$H_2$ | 40<br>50<br>500 | 500 | 1.5 | 350 |
| First i-type layer | 110 | $SiH_4$<br>$GeH_4$<br>$H_2$ | 55 each<br>55 each<br>500 each | 200 | 1.8 | 350 |
| First p-type layer | 10 | $SiH_4$<br>$BF_3/H_2$ (2% DILUTION)<br>$H_2$ | 10<br>100<br>500 | 600 | 1.6 | 100 to 350 |
| Second n-type layer | 40 | $SiH_4$<br>$PH_3/H_2$ (2% DILUTION)<br>$H_2$ | 40<br>50<br>200 | 500 | 1.5 | 300 |
| Second i-type layer | 100 | $SiH_4$<br>$PH_3/H_2$ | 110 each<br>500 each | 200 | 1.8 | 200 |
| Second p-type layer | 100 | $SiH_4$<br>$BF_3/H_2$ (2% DILUTION)<br>$H_2$ | 10<br><br>500 | 600 | 1.6 | 200 |

COMPARATIVE EXAMPLE 1

Comparative Example 1 is different from Example 1 in that the configuration of the cathode electrode for the vacuum container for forming each p-type layer is of a parallel-plate type, and the cathode electrode structure shown in FIGS. 4 and 5 is used. In the cathode electrode structure, the ratio of the surface area of the cathode electrode relative to the sum of surface areas of the conductive belt-like member and the anode electrode was 0.6 times.

However, the same conditions for forming the photovoltaic element as in Example 1 (Table 1-1) were used.

All other respects were the same as in Example 1, to form a double-cell type photovoltaic element (referred to as Element-C1).

In the following, regarding the photovoltaic elements formed in Example 1 and Comparative Example 1, i.e., Element-E1 and Element-C1, results of evaluation of property uniformity, defect density, photodeterioration and series resistance are described.

Regarding the property uniformity, a 5 cm square piece was cut at every interval of 10 m from the photovoltaic element formed on the belt-like member in Example 1 and Comparative Example 1, i.e., Element-E1 and Element-C1 and placed under radiation of AM-1.5 (100 mW/cm²), the photoelectric conversion efficiency was measured, and the dispersion in the photoelectric conversion efficiency was evaluated. By using a value 1.00 of dispersion in the photoelectric conversion efficiency of Element-E1 when the temperature for forming the first p-layer equals or exceeds the temperature for forming the second n-layer, a relative comparison was made.

For the defect density, 100 pieces having an area of 5 cm square were cut from each 5 m middle portion of the photovoltaic element on the belt-like member prepared in Example 1 and Comparative Example 1, i.e., Element-E1 and Element-C1, and it was determined by measuring a reverse direction current whether or not each photovoltaic element has a defect, to evaluate the defect density. By using a value 1.00 of dispersion in the defect density of Element-E1 when the temperature for forming the first p-layer equals or exceeds the temperature for forming the second n-layer, a relative comparison was made.

Regarding the photodeterioration property, 100 pieces having an area of 5 cm square were cut from each 5 m middle portion of the photovoltaic element on the belt-like member prepared in Example 1 and Comparative Example 1, i.e., Element-E1 and Element-C1, placed under radiation of AM-1.5 (100 mW/cm²) and let stand for 10000 hours, the photoelectric conversion efficiency was measured and the drop ratio of the photoelectric conversion efficiency was evaluated. By using a value 1.00 of dispersion in the drop ratio of Element-E1 when the temperature for forming the first p-layer equals or exceeds the temperature for forming the second n-layer, a relative comparison was made.

For the series resistance, a 5 cm square piece at every interval of 10 m was cut from the photovoltaic element prepared in Example 1 and Comparative Example 1, i.e., Element-E1 and Element-C1 and placed under radiation of AM-1.5 (100 mW/cm²), and the series resistance was calculated from the gradient of I-V property in the vicinity of an open voltage value. By using a value 1.00 of the series resistance of Element-E1 when the temperature for forming the first p-layer equals or exceeds the temperature for forming the second n-layer, a relative comparison was made.

Table 1-2 shows the results of evaluation of the aforementioned dispersion in the photoelectric conversion efficiency, the defect density and photodeterioration ratio of the photovoltaic element prepared in Example 1 (Element-E1). Table 1-3 shows the results of evaluation of the photovoltaic element prepared in Comparative Example 1 (Element-C1).

TABLE 1-2

| Forming temperature of First p-layer in element-E1 | Dispersion in conversion efficiency | Defect density | Photo deterioration ratio | Series resistance |
|---|---|---|---|---|
| Lower than forming temperature of Second n-layer | 0.90 | 0.95 | 0.90 | 0.90 |
| Forming temperature of Second n-layer or higher | 1.00 | 1.00 | 1.00 | 1.00 |

TABLE 1-3

| Forming temperature of First p-layer in element-C1 | Dispersion in conversion efficiency | Defect density | Photo deterioration ratio | Series resistance |
|---|---|---|---|---|
| Lower than forming temperature of Second n-layer | 1.10 or more | 1.12 or more | 1.06 or more | 1.20 or more |
| Forming temperature of Second n-layer or higher | 1.10 | 1.12 | 1.08 | 1.20 |

It is seen from Table 1-2 that when the temperature for forming the first p-layer is lower than the temperature for forming the second n-layer, the photovoltaic element of Example 1 (Element-E1) is superior in conversion efficiency, defect density, the photodeterioration ratio and series resistance. This means that the photovoltaic element prepared in the forming method according to the invention has more superior properties.

By comparison of Table 1-2 and Table 1-3, it is found that the photovoltaic element formed using the device of the invention is superior to the element using the conventional device in all the evaluation items.

Specifically, it can be seen that in the case of forming the double-cell type photovoltaic element, when the area of the cathode electrode at least of the first p-layer is enlarged and the temperature for forming the first p-layer is lower than the temperature for forming the second n-layer, the properties of the resulting photovoltaic element (Element-E1) are the best.

EXAMPLE 2

Figure 12:
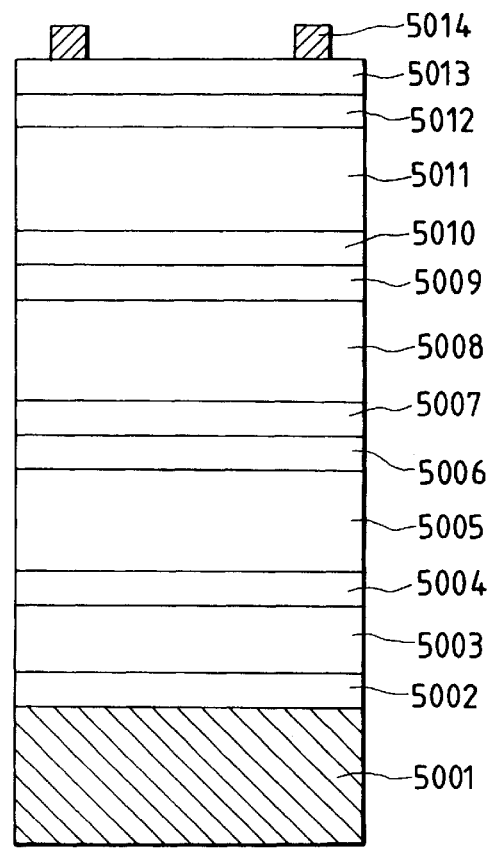
FIG. 12 is a diagrammatic cross-sectional view of a triple-cell type photovoltaic element according to the invention.

In Example 2, by using a continuous plasma CVD device in a roll to roll system shown in FIG. 6, a triple-cell type photovoltaic element shown in FIG. 12 was prepared, different from Example 1.

Especially, to prepare the triple-cell type, a vacuum container was additionally provided for preparing each conductive layer. Specifically, a vacuum container 601 for forming a first n-type layer, a vacuum container 100 for forming an i-type layer and a vacuum container 602 for forming a first p-type layer were connected via a gas gate into one set. Two sets of the containers were added. Three sets in total were arranged in series as a device for use (not shown).

When forming the triple-cell type photovoltaic element, the temperature for forming the second p-type layer was fixed to 250° C., and the temperature for forming the third n-type layer was varied in a range from 100° C. to 350° C.

The cathode electrode of the vacuum container for forming each p-type layer has the separator configuration shown in FIG. 2B. In the cathode electrode structure, the ratio of the surface area of the cathode electrode relative to the sum of surface areas of the conductive belt-like member and the anode electrode was set to 2.9.

Also, as each n-type layer forming container and each i-type layer forming container, containers having a parallel-plate type RF electrode were used.

Using the aforementioned manufacture device, according to the conditions shown in Table 2-1, a first n-type layer, a first i-type layer, a first p-type layer, a second n-type layer, a second i-type layer, a second p-type layer, a third n-type layer, a third i-type layer and a third p-type layer were successively laminated on a lower electrode constituted of a silver thin film 5002 and a zinc oxide thin film 5003, to form a triple-cell type photovoltaic element (Element-E2).

Table 2-1 shows the conditions for forming the photovoltaic element in Example 2.

TABLE 2-1

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al)thin film, 2 μm
RF electrode of each n and i-type layer: parallel-plate type
RF electrode of each p-type layer: separator of FIG. 2B

| Layer | Layer Thickness (nm) | Gas and gas flow rate (sccm) | | RF power (W) | Pressure (Torr) | Substrate Temperature (° C.) |
|---|---|---|---|---|---|---|
| First n-type layer | 40 | $SiH_4$ $PH_3/H_2$ (2% DILUTION) $H_2$ | 40 50 500 | 500 | 1.5 | 350 |
| First i-type layer | 110 | $SiH_4$ $GeH_4$ $H_2$ | 55 each 55 each 500 each | 200 | 1.8 | 350 |
| First p-type layer | 10 | $SiH_4$ $BF_3/H_2$ (2% DILUTION) $H_2$ | 10 100 500 | 600 | 1.6 | 250 |
| Second | 40 | $SiH_4$ | 40 | 500 | 1.5 | 300 |

TABLE 2-1-continued

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al)thin film, 2 μm
RF electrode of each n and i-type layer: parallel-plate type
RF electrode of each p-type layer: separator of FIG. 2B

| Layer | Layer Thickness (nm) | Gas and gas flow rate (sccm) | | RF power (W) | Pressure (Torr) | Substrate Temperature (° C.) |
|---|---|---|---|---|---|---|
| n-type layer | | $PH_3/H_2$ (2% DILUTION) $H_2$ | 50 500 | | | |
| Second i-type layer | 100 | $SiH_4$ $GeH_4$ $H_2$ | 65 each 45 each 500 each | 200 | 1.8 | 350 |
| Second p-type layer | 10 | $SiH_4$ $BF_3/H_2$ (2% DILUTION) $H_2$ | 10 100 500 | 600 | 1.6 | 250 |
| Third n-type layer | 40 | $SiH_4$ $PH_3/H_2$ (2% DILUTION) $H_2$ | 40 50 500 | 500 | 1.5 | 100 to 350 |
| Third i-type layer | 100 | $SiH_4$ $H_2$ | 110 each 500 each | 200 | 1.8 | 200 |
| Third p-type layer | 10 | $SiH_4$ $BF_3/H_2$ (2% DILUTION) $H_2$ | 10 100 500 | 600 | 1.6 | 200 |

COMPARATIVE EXAMPLE 2

Comparative Example 2 is different from Example 1 in that the configuration of the cathode electrode for the vacuum container for forming each p-type layer is of a parallel-plate type, and the cathode electrode structure shown in FIGS. 4 and 5 is used. In the cathode electrode structure, the ratio of the surface area of the cathode electrode relative to the sum of surface areas of the conductive belt-like member and the anode electrode was 0.6 times.

However, the conditions for forming the photovoltaic element shown in Table 2-1 were used in the same manner as Example 2.

All other aspects were the same as in Example 2, to form a triple-cell type photovoltaic element (referred to as Element-C2).

In the following, regarding the photovoltaic elements formed in Example 2 and Comparative Example 2, i.e., Element-E2 and Element-C2, results of evaluation of property uniformity, defect density, photodeterioration and series resistance are described.

The evaluation method was the same as in Example 1. Specifically, regarding the property uniformity, defect density, photodeterioration and series resistance of the photovoltaic element formed in Example 2 (Element-E2), comparison was made, by using the respective values of 1.00 when the temperature for forming the second p-layer equals or exceeds the temperature for forming the third n-layer, with the respective property results when the temperature for forming the second p-layer is lower than the temperature for forming the third n-layer, and with the results of the photovoltaic element of Comparative Example 2 (Element-C2).

Table 2-2 shows the results of evaluation of the aforementioned properties of the photovoltaic element prepared in Example 2 (Element-E2). Table 2-3 shows the results of evaluation of the photovoltaic element prepared in Comparative Example 2 (Element-C2).

TABLE 2-2

| Forming temperature of Second p-layer in element-E2 | Dispersion in conversion efficiency | Defect density | Photo deterioration ratio | Series resistance |
|---|---|---|---|---|
| Lower than forming temperature of Third n-layer | 0.95 | 0.95 | 0.95 | 0.93 |
| Forming temperature of Third n-layer or higher | 1.00 | 1.00 | 1.00 | 1.00 |

TABLE 2-3

| Forming temperature of Second p-layer in element-C2 | Dispersion in conversion efficiency | Defect density | Photo deterioration ratio | Series resistance |
|---|---|---|---|---|
| Lower than forming temperature of Third n-layer | 1.08 or more | 1.10 or more | 1.05 or more | 1.15 or more |
| Forming temperature of Third n-layer or higher | 1.18 | 1.10 | 1.05 | 1.15 |

It is seen from Table 2-2 that when the temperature for forming the second p-layer is lower than the temperature for forming the third n-layer, the photovoltaic element of Example 2 (Element-E2) is superior in conversion efficiency, defect density, photodeterioration ratio and series resistance. It is found that the photovoltaic element prepared in the forming method according to the invention has superior properties.

By comparison of Table 2-2 and Table 2-3, the photovoltaic element formed using the device of the invention is superior to the element using the conventional device in all the evaluation items.

Specifically, it is seen that in case of forming the triple-cell type photovoltaic element, when the area of the cathode electrode at least of the first and second p-layers is enlarged, the temperature for forming the first p-layer is lower than the temperature for forming the second n-layer, and the temperature for forming the second p-layer is lower than the temperature for forming the third n-layer, then the properties of the resulting photovoltaic element (Element-E2) are the best.

EXAMPLE 3

Example 3 is different from Example 1 in that when the double-cell type photovoltaic element is formed, the cathode electrode of the vacuum container for forming each p-type layer has the separator configuration shown in FIG. 2C. In the cathode electrode structure, the ratio of the surface area of the cathode electrode relative to the sum of surface areas of the conductive belt-like member and the anode electrode was set 2.9.

Also, as each n-type layer forming container and each i-type layer forming container, containers having a parallel-plate type RF electrode were used.

Using the aforementioned manufacture device, according to the conditions shown in Table 1-1, a first n-type layer, a first i-type layer, a first p-type layer, a second n-type layer, a second i-type layer and a second p-type layer were successively laminated on a lower electrode in the following procedure, to form a double-cell type photovoltaic element (Element-E3).

The other respects were the same as in Example 1.

In the following, the results of evaluation of property uniformity, defect density, photodeterioration and series resistance of the photovoltaic element prepared in Example 3 (Element-E3) are described.

The evaluation method was the same as in Example 1. Specifically, the property uniformity, defect density, photodeterioration and series resistance of the photovoltaic element formed in Example 3 (Element-E3) were evaluated. By using the respective values of 1.00 when the temperature for forming the first p-layer equals or exceeds the temperature for forming the second n-layer, the respective property results when the temperature for forming the first p-layer is lower than the temperature for forming the second n-layer were compared.

Table 3 shows the results of evaluation of the aforementioned properties of the photovoltaic element prepared in Example 3 (Element-E3).

TABLE 3

| Forming temperature of First p-layer in element-E3 | Dispersion in conversion efficiency | Defect density | Photo deterioration ratio | Series resistance |
|---|---|---|---|---|
| Lower than forming temperature of Second n-layer | 0.95 | 0.93 | 0.94 | 0.93 |
| Forming temperature of Second n-layer or higher | 1.00 | 1.00 | 1.00 | 1.00 |

It is seen from Table 3 that when the temperature for forming the first p-layer is lower than the temperature for forming the second n-layer, the. photovoltaic element of Example 3 (Element-E3) is superior in conversion efficiency, defect density, photodeterioration ratio and the series resistance. This means that the photovoltaic element prepared in the forming method according to the invention has more superior properties.

Specifically, it can be seen that in case of forming the double-cell type photovoltaic element, when the area of the cathode electrode at least of the first p-layer is enlarged, and the temperature for forming the first p-layer is lower than the temperature for forming the second n-layer, the properties of the resulting photovoltaic element (Element-E3) are the best.

EXAMPLE 4

Example 4 is different from Example 2 in that when forming a triple-cell type photovoltaic element, the cathode electrode of the vacuum container for forming each p-type layer having the separator configuration shown in FIG. 2D was used. In the cathode electrode structure, the ratio of the surface area of the cathode electrode relative to the sum of surface areas of the conductive belt-like member and the anode electrode was set to 2.9.

Also, as each n-type layer forming container and each i-type layer forming container, containers having a parallel-plate type RF electrode were used.

Using the aforementioned manufacture device, according to the conditions shown in Table 2-1, a first n-type layer, a first i-type layer, a first p-type layer, a second n-type layer, a second i-type layer, a second p-type layer, a third n-type layer, a third i-type layer and a third p-type layer were successively laminated on a lower electrode, to form a triple-cell type photovoltaic element (Element-E4).

Other respects were the same as in Example 2.

In the following, the results of evaluation of property uniformity, defect density, photodeterioration and series resistance of the photovoltaic element prepared in Example 4 (Element-E4) are described.

The evaluation method was the same as in Example 1. Specifically, the property uniformity, defect density, photodeterioration and series resistance of the photovoltaic element formed in Example 4 (Element-E4) were evaluated. By using the respective values of 1.00 when the temperature for forming the second p-layer equals or exceeds the temperature for forming the third n-layer, the respective property results when the temperature for forming the second p-layer is lower than the temperature for forming the third n-layer, and the results of the photovoltaic element (Comparative Example 2) were compared.

Table 4 shows the results of evaluation of the aforementioned properties of the photovoltaic element prepared in Example 4 (Element-E4).

TABLE 4

| Forming temperature of Second p-layer in element-E4 | Dispersion in conversion efficiency | Defect density | Photo deterioration ratio | Series resistance |
|---|---|---|---|---|
| Lower than forming temperature of Third n-layer | 0.97 | 0.95 | 0.94 | 0.92 |
| Forming temperature of Third n-layer or higher | 1.00 | 1.00 | 1.00 | 1.00 |

It is seen from Table 4 that when the temperature for forming the second p-layer is lower than the temperature for forming the third n-layer, the photovoltaic element of Example 4 (Element-E4) is superior to the photovoltaic element of Comparative Example 2 (Element-C2) in conversion efficiency, the defect density, photodeterioration ratio and series resistance. It is found that triple-cell type photovoltaic element prepared in the forming method according to the invention has superior properties.

Specifically, it can be seen that in the case of forming the triple-cell type photovoltaic element, when the area of the cathode electrode at least of the first p-layer and the second p-layer is enlarged, the temperature for forming the first p-layer is lower than the temperature for forming the second n-layer, and the temperature for forming the second p-layer is lower than the temperature for forming the third n-layer, the properties of the resulting photovoltaic element (Element-E4) are the best.

EXAMPLE 5

Example 5 is different from Example 1 in that when forming a double-cell type photovoltaic element, the cathode electrode of the vacuum container for forming each p-type layer having the separator configuration shown in FIG. 2E was used. In the cathode electrode structure, the ratio of the surface area of the cathode electrode relative to the sum of surface areas of the conductive belt-like member and the anode electrode was set to 3.1.

Also, in the vacuum container for forming the first i-type layer, a film was formed in a microwave CVD method, and as a container for forming the second i-type layer, a forming container having a parallel-plate type RF electrode was used.

Further, as each n-type layer forming container and each i-type layer forming container, forming containers having a parallel-plate type RF electrode were used.

Using the aforementioned manufacture device, according to the conditions shown in Table 5-1, a first n-type layer, a first i-type layer, a first p-type layer, a second n-type layer, a second i-type layer and a second p-type layer were successively laminated on a lower electrode, to form a double-cell type photovoltaic element (Element-E5).

Other respects were the same as in Example 1.

TABLE 5-1

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al) thin film, 2 μm
RF electrode of each n and Second i-type layer: parallel-plate type
Method of forming First i-type layer: microwave CVD method
RF electrode of each p-type layer: separator in FIG. 2E

| Layer | Layer Thickness (nm) | Gas and gas flow rate (sccm) | | RF power (W) | Pressure (Torr) | Substrate Temperature (° C.) |
|---|---|---|---|---|---|---|
| First n-type layer | 40 | $SiH_4$ $PH_3/H_2$ (2% DILUTION) $H_2$ | 40 50 500 | 500 | 1.5 | 350 |
| First i-type layer microwave CVD method | 110 | $SiH_4$ $GeH_4$ $H_2$ | 50 50 500 | Microwave: 200 RF bias: 400 | 10 mTorr | 350 |
| First p-type layer | 10 | $SiH_4$ $BF_3/H_2$ (2% DILUTION) $H_2$ | 10 100 500 | 600 | 1.6 | 100 to 350 |
| Second n-type layer | 40 | $SiH_4$ $PH_3/H_2$ (2% DILUTION) $H_2$ | 40 50 200 | 500 | 1.5 | 300 |
| Second i-type layer | 100 | $SiH_4$ $H_2$ | 110 each 500 each | 200 | 1.8 | 200 |
| Second p-type layer | 10 | $SiH_4$ $BF_3/H_2$ (2% DILUTION) $H_2$ | 10 100 500 | 600 | 1.6 | 200 |

COMPARATIVE EXAMPLE 3

Comparative Example 3 is different from Example 5 in that the configuration of the cathode electrode for the vacuum container 100 for forming the first i-type layer is of a parallel-plate type, and the cathode electrode structure shown in FIGS. 4 and 5 is used. In the cathode electrode structure, the ratio of the surface area of the cathode electrode relative to the sum of surface areas of the conductive belt-like member and the anode electrode was 0.6.

However, the conditions for forming the photovoltaic element shown in Table 1-1 were used in the same manner as Example 1.

All other aspects were the same as in Example 1, to form a double-cell type photovoltaic element (referred to as Element-C3).

In the following, regarding the photovoltaic elements formed in Example 5 and Comparative Example 3, i.e., Element-E5 and Element-C3, results of evaluation of property uniformity, defect density, photodeterioration and series resistance are described.

The evaluation method was the same as in Example 1. Specifically, the property uniformity, defect density, photodeterioration and series resistance of the photovoltaic element formed in Example 5 (Element-E5) were evaluated. By using the respective values of 1.00 when the temperature for forming the first p-layer equals or exceeds the temperature for forming the second n-layer, the respective property results when the temperature for forming the first p-layer is lower than the temperature for forming the second n-layer, and the results of the photovoltaic element of Comparative Example 3 (Element-C3) were compared.

Table 5-2 shows the results of evaluation of the aforementioned properties of the photovoltaic element prepared in Example 5 (Element-E5). Table 5-3 shows the results of evaluation of the photovoltaic element prepared in Comparative Example 3 (Element-C3).

TABLE 5-2

| Forming temperature of First p-layer in element-E5 | Dispersion in conversion efficiency | Defect density | Photo deterioration ratio | Series resistance |
|---|---|---|---|---|
| Lower than forming temperature of Second n-layer | 0.92 | 0.98 | 0.93 | 0.91 |
| Forming temperature of Second n-layer or higher | 1.00 | 1.00 | 1.00 | 1.00 |

TABLE 5-3

| Forming temperature of First p-layer in element-C3 | Dispersion in conversion efficiency | Defect density | Photo deterioration ratio | Series resistance |
|---|---|---|---|---|
| Lower than forming temperature of Second n-layer | 1.15 or more | 1.20 or more | 1.18 or more | 1.22 or more |
| Forming temperature of Second n-layer or higher | 1.15 | 1.20 | 1.18 | 1.22 |

It is seen from Table 5-2 that when the temperature for forming the first p-layer is lower than the temperature for forming the second n-layer, the photovoltaic element of Example 5 (Element-E5) is superior in conversion efficiency, defect density, photodeterioration ratio and series resistance. It is found that the double-cell type photovoltaic element prepared in the forming method according to the invention has superior properties.

By comparison of Table 5-2 and Table 5-3, the photovoltaic element formed using the device of the invention is superior to the element using the conventional device in all the evaluation items.

Specifically, it is seen that in the case of forming the double-cell type photovoltaic element, when the area of the cathode electrode at least of the first p-layer is enlarged, and the temperature for forming the first p-layer is lower than the temperature for forming the second n-layer, the properties of the resulting photovoltaic element (Element-E5) are the best.

EXAMPLE 6

Example 6 is different from Example 2 in that when forming the triple-cell type photovoltaic element, the cathode electrode of the vacuum container for forming each p-type layer having the separator configuration shown in FIG. 2F was used. In the cathode electrode structure, the ratio of the surface area of the cathode electrode relative to the sum of surface areas of the conductive belt-like member and the anode electrode was set 2.6 times.

Also, in a first i-type layer forming vacuum container and a second i-type layer forming vacuum container, a film was formed in a microwave CVD method, and as a third i-type layer forming container, a container having a parallel-plate type RF electrode was used.

Also as each n-type forming container and each i-type layer forming container, containers having a parallel-plate type RF electrode were used.

Using the aforementioned manufacture device, according the conditions shown in Table 6-1, a first n-type layer, a first i-type layer, a first p-type layer, a second n-type layer, a second i-type layer, a second p-type layer, a third n-type layer, a third i-type layer and a third p-type layer were successively laminated on a lower electrode, to form a triple-cell type photovoltaic element (Element-E6).

All other aspects were the same as in Example 2.

Table 6-1 shows the conditions for forming the photovoltaic element in Example 6.

TABLE 6-1

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al)thin film, 2 μm
RF electrode of each n and Third i-type layer: parallel-plate type
Method for forming First and Second i-type layers: microwave CVD method
RF electrode for each p-type layer: separator of FIG. 2F

| Layer | Layer Thickness (nm) | Gas and gas flow rate (sccm) | | RF power (W) | Pressure (Torr) | Substrate Temperature (° C.) |
|---|---|---|---|---|---|---|
| First n-type layer | 40 | $SiH_4$<br>$PH_3/H_2$ (2% DILUTION)<br>$H_2$ | 40<br>50<br>500 | 500 | 1.5 | 350 |
| First i-type layer microwave CVD method | 110 | $SiH_4$<br>$GeH_4$<br>$H_2$ | 50 each<br>50 each<br>500 each | Microwave: 200<br>RF bias: 400 | 10 mTorr | 350 |
| First p-type | 10 | $SiH_4$<br>$BF_3/H_2$ | 10<br>100 | 600 | 1.6 | 250 |

TABLE 6-1-continued

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al)thin film, 2 μm
RF electrode of each n and Third i-type layer: parallel-plate type
Method for forming First and Second i-type layers: microwave CVD method
RF electrode for each p-type layer: separator of FIG. 2F

| Layer | Layer Thickness (nm) | Gas and gas flow rate (sccm) | | RF power (W) | Pressure (Torr) | Substrate Temperature (° C.) |
|---|---|---|---|---|---|---|
| layer | | (2% DILUTION) $H_2$ | 500 | | | |
| Second n-type layer | 40 | $SiH_4$ $PH_3/H_2$ (2% DILUTION) $H_2$ | 40 50 500 | 500 | 1.5 | 300 |
| Second i-type layer microwave CVD method | 110 | $SiH_4$ $GeH_4$ $H_2$ | 65 each 45 each 500 each | Microwave: 200 RF bias: 400 | 10 mTorr | 350 |
| Second p-type layer | 10 | $SiH_4$ $BF_3/H_2$ (2% DILUTION) $H_2$ | 10 100 500 | 600 | 1.6 | 250 |
| Third n-type layer | 40 | $SiH_4$ $PH_3/H_2$ (2% DILUTION) $H_2$ | 40 50 200 | 500 | 1.5 | 100 to 350 |
| Third i-type layer | 100 | $SiH_4$ $H_2$ | 110 each 500 each | 200 | 1.8 | 200 |
| Third p-type layer | 10 | $SiH_4$ $BF_3/H_2$ (2% DILUTION) $H_2$ | 10 100 500 | 600 | 1.6 | 200 |

COMPARATIVE EXAMPLE 4

Comparative Example 4 is different from Example 6 in that the configuration of the cathode electrode for the vacuum container for forming the first i-type layer and the second i-type layer is of a parallel-plate type, and the cathode electrode structure shown in FIGS. 4 and 5 was used. In the cathode electrode structure, the ratio of the surface area of the cathode electrode relative to the sum of surface areas of the conductive belt-like member and the anode electrode was 0.6 times.

However, the conditions for forming the photovoltaic element shown in Table 2-1 were used in the same manner as Example 2.

All other aspects were the same as in Example 2, to form a triple-cell type photovoltaic element (referred to as Element-C4).

In the following, regarding the photovoltaic elements formed in Example 6 and Comparative Example 4, i.e., Element-E6 and Element-C4, results of evaluation of property uniformity, defect density, photodeterioration and series resistance are described.

The evaluation method was the same as in Example 1. Specifically, regarding the property uniformity, defect density, photodeterioration and series resistance of the photovoltaic element formed in Example 6 (Element-E6), comparison was made, by using the respective values of 1.00 when the temperature for forming the second p-layer equals or exceeds the temperature for forming the third n-layer, with the respective property results when the temperature for forming the second p-layer is lower than the temperature for forming the third n-layer, and with the results of the photovoltaic element of Comparative Example 4 (Element-C4).

Table 6-2 shows the results of evaluation of the aforementioned properties of the photovoltaic element prepared in Example 6 (Element-E6). Table 6-3 shows the results of evaluation of the photovoltaic element prepared in Comparative Example 4 (Element-C4).

TABLE 6-2

| Forming temperature of Second p-layer in element-E6 | Dispersion in conversion efficiency | Defect density | Photo deterioration ratio | Series resistance |
|---|---|---|---|---|
| Lower than forming temperature of Third n-layer | 0.95 | 0.98 | 0.95 | 0.93 |
| Forming temperature of Third n-layer or higher | 1.00 | 1.00 | 1.00 | 1.00 |

TABLE 6-3

| Forming temperature of Second p-layer in element-C4 | Dispersion in conversion efficiency | Defect density | Photo deterioration ratio | Series resistance |
|---|---|---|---|---|
| Lower than forming temperature of Third n-layer | 1.10 or more | 1.10 or more | 1.20 or more | 1.15 or more |
| Forming temperature of Third n-layer or higher | 1.10 | 1.10 | 1.20 | 1.15 |

It is seen from Table 6-2 that when the temperature for forming the second p-layer is lower than the temperature for forming the third n-layer, the photovoltaic element of Example 6 (Element-E6) is superior in conversion efficiency, defect density, photodeterioration ratio and series resistance. It is found that the photovoltaic element prepared in the forming method according to the invention has superior properties.

By comparison of Table 6-2 and Table 6-3, the photovoltaic element formed using the device of the invention is superior to the element using the conventional device in all the evaluation items.

Specifically, it is seen that in case of forming the triple-cell type photovoltaic element, when the area of the cathode electrode at least of the first and second p-layers is enlarged, the temperature for forming the first p-layer is lower than the temperature for forming the second n-layer, and the temperature for forming the second p-layer is lower than the temperature for forming the third n-layer, then the properties of the resulting photovoltaic element (Element-E6) are the best.

EXAMPLE 7

In Example 7, by using a continuous plasma CVD device in a roll to roll system shown in FIG. 6, a single-cell type photovoltaic element shown in FIG. 11 was prepared. For this, the cathode electrode of a vacuum container for forming an i-type layer was configured to have the separator configuration shown in FIG. 2A. In the cathode electrode structure, the ratio of the surface area of the cathode electrode relative to the sum of surface areas of the conductive belt-like member and the anode electrode was set to 2.9.

Also, as a first conductive layer forming container and a second conductive layer forming container, forming containers having a parallel-plate type RF electrode were used.

In the manufacture device shown in FIG. 6, the vacuum containers 301 and 302 for delivering and winding the belt-like member 101, the first conductive layer forming vacuum container 601, the i-type layer forming vacuum container 100, the second conductive layer forming vacuum container 602, and a second n-type layer forming vacuum container 601 are connected via a gas gate.

The cathode electrode 603 in the vacuum container 601 and the cathode electrode 604 in the vacuum container 602 have the aforementioned cathode electrode structure.

By using the manufacture device shown in FIG. 6, under forming conditions shown in Table 7-1, on the lower electrode, the first conductive layer, the i-type layer and the second conductive layer were continuously formed in the following procedure, to prepare a single-cell type photovoltaic element (referred to as Element-E7).

(1) First, the bobbin 303 with the belt-like member 101 wound therearound was set in the vacuum container 301 having a substrate delivery mechanism. As the belt-like member 101, a belt-like member of SUS430 BA (width 120 mm×length 200 m×thickness 0.13 mm) was prepared by carrying out sufficient degreasing and cleaning, and evaporating a silver thin film of 100 nm and a ZnO thin film of 1 μm as the lower electrodes in a sputtering method.

(2) The belt-like member 101 was passed via the gas gate and each non-single crystal layer forming vacuum container to the vacuum container 302 having a belt-like member take-up mechanism, in which the tension was adjusted to remove any slack.

(3) Each vacuum container 301, 601, 100, 602, 302 was evacuated with a vacuum pump (not shown).

(4) Gate gas $H_2$ of 700 sccm was supplied from each gate gas pipe 131n, 131, 132, 131p to each gas gate, and the belt-like member 101 was heated by the lamp heaters 124n, 124, 124p to 350° C., 350° C., 250° C., respectively.

(5) From the gas pipe 605, 40 sccm of $SiH_4$ gas, 50 sccm of $PH_3$ gas (2% $H_2$ dilution) and 200 sccm of $H_2$ gas; from the gas pipes 104a, 104b, 104c, 100 sccm each of $SiH_4$ gas and 500 sccm each of $H_2$ gas; and from the gas pipe 606, 10 sccm of $SiH_4$ gas, 100 sccm of $BF_3$ gas (2% $H_2$ dilution) and 500 sccm of $H_2$ gas were introduced.

(6) The pressure in the vacuum container 301 was adjusted with the conductance valve 307 to read 1.0 Torr on the pressure gauge 314. The pressure in the vacuum container 601 was adjusted with a conductance valve (not shown) to read 1.5 Torr on a pressure gauge (not shown). The pressure in the vacuum container 100 was adjusted with a conductance valve (not shown) to read 1.8 Torr on a pressure gauge (not shown). The pressure in the vacuum container 602 was adjusted with a conductance valve (not shown) to read 1.6 Torr on a pressure gauge (not shown). The pressure in the vacuum container 302 was adjusted with the conductance valve 308 to read 1.0 Torr on the pressure gauge 315.

(7) After the process (6) of pressure adjustment, introduced were 500 W of RF power to the cathode electrode 603, 200 W of RF power to the cathode electrode 107 and 600 W of RF power to the cathode electrode 604, respectively.

(8) The belt-like member 101 was conveyed in a direction shown by an arrow in FIG. 6, to form the first conductive layer, the i-type layer and the second conductive layer successively on the belt-like member 101.

(9) On the second conductive layer formed in the process (8), as a transparent electrode, ITO ($In_2O_3 + SnO_2$) was deposited 80 nm by vacuum evaporation, and further as a collecting electrode, Al was deposited 2 μm by vacuum evaporation, thereby finishing formation of the photovoltaic element (referred to as Element-E7).

Table 7-1 shows the conditions for forming the photovoltaic element in Example 7.

TABLE 7-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$ $PH_3/H_2$ (2% DILUTION) $H_2$ | 40 50 500 | 500 | 1.5 | 350 |
| i-type layer | 140 | $SiH_4$ $H_2$ | 100 each 500 each | 200 | 1.8 | 350 |
| Second conductive | 10 | $SiH_4$ $BF_3/H_2$ | 10 100 | 800 | 1.6 | 250 |

TABLE 7-1-continued

| Layer | Layer Thickness (nm) | Gas and gas flow rate (sccm) | RF power (W) | Pressure (Torr) | Substrate Temperature (° C.) |
|---|---|---|---|---|---|
| layer | | (2% DILUTION) H₂  2000 | | | |

Substrate: SUS430BA, thickness 0.13 mm
Reflective layer: silver (Ag) thin film, 100 nm
Reflective increase layer: zinc oxide (ZnO) thin film, 1 μm
Transparent electrode: ITO (In$_2$O$_3$ + SnO$_2$) thin film, 80 nm
Collecting electrode: aluminum (Al) thin film, 2 μm
Gate gas: 700 sccm from each gate
RF electrode of first and second conductive layer: parallel-plate type
RF electrode of i-type layer: RF power pulse modulation 1 kHz (rectangular wave)
Separator configuration of i-type layer: FIG. 2A

COMPARATIVE EXAMPLE 5

Comparative Example 5 is different from Example 7 in that the configuration of the cathode electrode for the vacuum container for forming the i-type layer is of a parallel-plate type, and the cathode electrode structure shown in FIGS. 4 and 5 was used. In the cathode electrode structure, the ratio of the surface area of the cathode electrode relative to the sum of surface areas of the conductive belt-like member and the anode electrode was 0.6 times.

However, the same conditions for forming the photovoltaic element as in Example 7 (Table 7-1) were used.

All other aspects were the same as in Example 7, to form a single-cell type photovoltaic element (referred to as Element-C5).

In the following, regarding the photovoltaic elements formed in Example 7 and Comparative Example 5, i.e., Element-E7 and Element-C5, results of evaluation of property uniformity, defect density and photodeterioration are described.

Regarding the property uniformity, a 5 cm square piece was cut at every interval of 10 m from the photovoltaic elements formed on the belt-like member in Example 7 and Comparative Example 7, i.e., Element-E7 and Element-C5 and placed under radiation of AM-1.5 (10 mW/cm²), the photoelectric conversion efficiency was measured, and the dispersion in the photoelectric conversion efficiency was evaluated. By setting the deviation in the photovoltaic element of Comparative Reference 5 (Element-C5) as a basis 1.00, the dispersion of the photovoltaic element of Example 7 (Element-E7) was shown.

For the defect density, 100 pieces having an area of 5 cm square were cut from each 5 m middle portion of the photovoltaic element on the belt-like member prepared in Example 7 and Comparative Example 5, i.e., Element-E7 and Element-C5, and it was determined by measuring a reverse direction current whether or not each photovoltaic element has a defect, to evaluate the defect density. By setting the defect density of the photovoltaic element of Comparative Example 5 (Element-C5) as a basis 1.00, the defect density of the photovoltaic element of Example 7 (Element-E7) was shown.

Regarding the photodeterioration property: 100 pieces having an area of 5 cm square were cut from each 5 m middle portion of the photovoltaic element on the belt-like member prepared in Example 7 and Comparative Example 5, i.e., Element-E7 and Element-C5, placed under radiation of AM-1.5 (100 mW/cm²) and let stand for 10000 hours, the photoelectric conversion efficiency was measured and the drop ratio of the photoelectric conversion efficiency was evaluated. By setting the drop ratio of the photovoltaic element of Comparative Example 5 as a basis 1.00, the drop ratio of the photovoltaic element of Example 7 (Element-E7) was shown.

Table 7-2 shows the results of evaluation of the aforementioned dispersion in the photoelectric conversion efficiency, the defect density and photodeterioration ratio of the photovoltaic element prepared in Example 7 and Comparative Example 5, i.e., Element-E7 and Element-C5.

TABLE 7-2

| ELEMENT NO. | DISPERSION IN CONVERSION EFFICIENCY | DEFECT DENSITY | PHOTO DETERIO- RATION RATIO |
|---|---|---|---|
| ELEMENT-E7 | 0.75 | 0.70 | 0.78 |
| ELEMENT-C5 | 1.00 | 1.00 | 1.00 |

It is found from Table 7-2 that the photovoltaic element of Example 7 (Element-E7) is superior to the photovoltaic element of Comparative Example 5 (Element-C5) in conversion efficiency, the defect density and the photodeterioration ratio, and the photovoltaic element formed in the forming method of the invention has superior properties.

EXAMPLE 8

Example 8 is different from Example 7 in that the cathode electrode electrode of the vacuum container for forming the i-type layer is configured to have the separator configuration shown in FIG. 2B. In the cathode electrode structure, the ratio of the surface area of the cathode electrode relative to the sum of surface areas of the conductive belt-like member and the anode electrode was set to 2.9. The conditions for forming the photovoltaic element are shown in Table 8-1.

Also, as a first conductive layer forming container and a second conductive layer forming container, containers having a parallel-plate type RF electrode were used.

The other respects were the same as in Example 7, and a single-type photovoltaic element (referred to as Element-E8) was prepared.

TABLE 8-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$<br>$PH_3/H_2$<br>(2% DILUTION)<br>$H_2$ | 40<br>50<br><br>500 | 500 | 1.5 | 350 |
| i-type layer | 140 | $SiH_4$<br>$H_2$ | 105 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate
RF electrode of first and second conductive layers: parallel-plate type
RF electrode of i-type layer: RF power pulse modulation 1 kHz (rectangular wave)
Separator configuration of i-type layer: FIG. 2B Regarding the photovoltaic elements prepared in Example 8 and Comparative Example 5, i.e., Element-E8 and Element-C5, in the same manner as Example 7, the property uniformity, the defect density and the photodeterioration ratio were evaluated. The results are shown in Table 8-2.

TABLE 8-2

| ELEMENT NO. | DISPERSION IN CONVERSION EFFICIENCY | DEFECT DENSITY | PHOTO DETERIORATION RATIO |
|---|---|---|---|
| ELEMENT-E8 | 0.77 | 0.78 | 0.76 |
| ELEMENT-C5 | 1.00 | 1.00 | 1.00 |

It is found from Table 8-2 that the photovoltaic element of Example 8 (Element-E8) is superior to the photovoltaic element of Comparative Example 5 (Element-C5) in conversion efficiency, the defect density and photodeterioration ratio.

EXAMPLE 9

Example 9 is different from Example 7 in that the cathode electrode of the vacuum container for forming the i-type layer is configured to have the separator configuration shown in FIG. 2C. In the cathode electrode structure, the ratio of the surface area of the cathode electrode relative to the sum of surface areas of the conductive belt-like member and the anode electrode was set to 2.9. The conditions for forming the photovoltaic element are shown in Table 9-1.

Also, as a first conductive layer forming container and a second conductive layer forming container, containers having a parallel-plate type RF electrode were used.

The other respects were the same as in Example 7, and a single-type photovoltaic element (referred to as Element-E9) was prepared.

TABLE 9-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$<br>$PH_3/H_2$<br>(2% DILUTION)<br>$H_2$ | 40<br>50<br><br>500 | 500 | 1.5 | 350 |
| i-type layer | 140 | $SiH_4$<br>$H_2$ | 110 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate
RF electrode of first and second conductive layers: parallel-plate type
RF electrode of i-type layer: RF power pulse modulation 1 kHz (rectangular wave)
Separator configuration of i-type layer: FIG. 2C Regarding the photovoltaic elements prepared in Example 9 and Comparative Example 5, i.e., Element-E9 and Element-C5, in the same manner as Example 7, the property uniformity, the defect density and the photodeterioration were evaluated. The results are shown in Table 9-2.

TABLE 9-2

| ELEMENT NO. | DISPERSION IN CONVERSION EFFICIENCY | DEFECT DENSITY | PHOTO DETERIO- RATION RATIO |
|---|---|---|---|
| ELEMENT-E9 | 0.77 | 0.74 | 0.71 |
| ELEMENT-C5 | 1.00 | 1.00 | 1.00 |

It is found from Table 9-2 that the photovoltaic element of Example 9 (Element-E9) is superior to the photovoltaic element of Comparative Example 5 (Element-C5) in conversion efficiency, defect density and photodeterioration ratio.

EXAMPLE 10

Example 10 is different from Example 7 in that the cathode electrode of the vacuum container for forming the i-type layer is configured to have the separator configuration shown in FIG. 2D. In the cathode electrode structure, the ratio of the surface area of the cathode electrode relative to the sum of surface areas of the conductive belt-like member and the anode electrode was set to 2.9. The conditions for forming the photovoltaic element are shown in Table. 10-1.

Also, as a first conductive layer forming container and a second conductive layer forming container, containers having a parallel-plate type RF electrode were used.

The other respects were the same as in Example 7, and a single-type photovoltaic element (referred to as Element-E10) was prepared.

Element-C5, in the same manner as Example 7, the property uniformity, the defect density and the photodeterioration were evaluated. The results are shown in Table 10-2.

TABLE 10-2

| ELEMENT NO. | DISPERSION IN CONVERSION EFFICIENCY | DEFECT DENSITY | PHOTO DETERIO- RATION RATIO |
|---|---|---|---|
| ELEMENT-E10 | 0.78 | 0.78 | 0.76 |
| ELEMENT-C5 | 1.00 | 1.00 | 1.00 |

It is found from Table 10-2 that the photovoltaic element of Example 10 (Element-E110) is superior to the photovoltaic element of Comparative Example 5 (Element-C5) in conversion efficiency, the defect density and the photodeterioration ratio.

EXAMPLE 11

Example 11 is different from Example 7 in that the cathode electrode of the vacuum container for forming the first conductive layer is configured to have the separator configuration shown in FIG. 2E. In the cathode electrode structure, the ratio of the surface area of the cathode electrode relative to the sum of surface areas of the conductive belt-like member and the anode electrode was set to 2.9. The conditions for forming the photovoltaic element are shown in Table Also, as a second conductive layer forming container and an i-type layer forming container, containers having a parallel-plate type RF electrode were used.

The other respects were the same as in Example 7, and a single-type photovoltaic element (referred to as Element-E11) was prepared.

TABLE 10-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$<br>$PH_3/H_2$<br>(2% DILUTION)<br>$H_2$ | 40<br>50<br><br>500 | 500 | 1.5 | 350 |
| i-type layer | 140 | $SiH_4$<br>$H_2$ | 105 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate
RF electrode of first and second conductive layers: parallel-plate type
RF electrode of i-type layer: RF power pulse modulation 1 kHz (rectangular wave)
Separator configuration of i-type layer: FIG. 2D Regarding the photovoltaic elements prepared in Example 10 and Comparative Example 5, i.e., Element-E10 and

TABLE 11-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$<br>$PH_3/H_2$<br>$H_2$ | 40<br>50<br>200 | 500 | 1.5 | 350 |
| i-type layer | 140 | $SiH_4$<br>$H_2$ | 115 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: silver (Ag) thin film, 100 nm
Reflective increase layer: zinc oxide (ZnO) thin film, 1 $\mu$m
Transparent electrode: ITO ($In_2O_3$ + $SnO_2$) thin film, 80 nm
Collecting electrode: aluminum (Al) thin film, 2 $\mu$m
Gate gas: 700 sccm from each gate
RF electrode of the second conductive and i-type layers: parallel-plate type
RF electrode of the first conductive layer: RF power pulse modulation 1 kHz (rectangular wave)
Separator configuration of the first conductive layer: FIG. 2E Regarding the photovoltaic elements prepared in Example 11 and Comparative Example 5, i.e., Element-E11 and Element-C5, in the same manner as Example 7, the property uniformity, the defect density and the photodeterioration were evaluated. The results are shown in Table 11-2.

TABLE 11-2

| ELEMENT NO. | DISPERSION IN CONVERSION EFFICIENCY | DEFECT DENSITY | PHOTO DETERIO- RATION RATIO |
|---|---|---|---|
| ELEMENT-E11 | 0.85 | 0.88 | 0.95 |
| ELEMENT-C5 | 1.00 | 1.00 | 1.00 |

It is found from Table 11-2 that the photovoltaic element of Example 11 (Element-E11) is superior to the photovoltaic element of Comparative Example 5 (Element-C5) in conversion efficiency, the defect density and photodeterioration ratio.

EXAMPLE 12

Example 12 is different from Example 7 in that the cathode electrode of the vacuum container for forming the second conductive layer is configured to have the separator configuration shown in FIG. 2E. In the cathode electrode structure, the ratio of the surface area of the cathode electrode relative to the sum of surface areas of the conductive belt-like member and the anode electrode was set to 2.9. The conditions for forming the photovoltaic element are shown in Table 12-1.

Also, as a first conductive layer forming container and an i-type layer forming container, containers having a parallel-plate type RF electrode were used.

The other respects were the same as in Example 7, and a single-type photovoltaic element (referred to as Element-E12) was prepared.

TABLE 12-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer | 40 | $SiH_4$<br>$PH_3/H_2$<br>(2% DILUTION)<br>$H_2$ | 40<br>50<br><br>500 | 500 | 1.5 | 350 |
| i-type layer | 40 | $SiH_4$<br>$H_2$ | 115 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 500 | 1.6 | 250 |

Substrate: SUS430BA, thickness 0.13 mm
Reflective layer: silver (Ag) thin film, 100 nm
Reflective increase layer: zinc oxide (ZnO) thin film, 1 $\mu$m
Transparent electrode: ITO ($In_2O_3$ + $SnO_2$) thin film, 80 nm
Collecting electrode: aluminum (Al) thin film, 2 $\mu$m
Gate gas: 700 sccm from each gate TABLE 12-1-continued

| Layer | Layer Thickness (nm) | Gas and gas flow rate (sccm) | RF power (W) | Pressure (Torr) | Substrate Temperature (° C.) |
|---|---|---|---|---|---|

RF electrode of the first conductive and i-type layers: parallel-plate type
RF electrode of the second conductive layer: RF power pulse modulation 1 kHz (rectangular wave)
Separator configuration of the second conductive layer: FIG. 2E Regarding the photovoltaic elements prepared in Example 12 and Comparative Example 5, i.e., Element-E12 and Element-C5, in the same manner as Example 7, the property uniformity, the defect density and the photodeterioration were evaluated. The results are shown in Table 12-2.

In Table 12-2, since in the conversion efficiency, an open voltage Voc was highly improved, the value of the open voltage in Comparative Example 5 (Element-C5) was set as 1.00, providing the results of Example 12 (Element-E12)

TABLE 12-2

| ELEMENT NO. | DISPERSION IN CONVERSION EFFICIENCY | DEFECT DENSITY | PHOTO DETERIO- RATION RATIO | OPEN VOLTAGE |
|---|---|---|---|---|
| ELEMENT-E12 | 1.00 | 0.98 | 0.98 | 1.15 |
| ELEMENT-C5 | 1.00 | 1.00 | 1.00 | 1.00 |

It is found from Table 12-2 that the photovoltaic element of Example 12 (Element-E12) is superior to the photovoltaic element of Comparative Example 5 (Element-C5) in conversion efficiency, the defect density and the photodeterioration ratio and has a high open voltage.

EXAMPLE 13

In Example 13, in a continuous plasma CVD device using a roll to roll system shown in FIG. 6 and having each forming vacuum container additionally provided, a triple-cell type photovoltaic element shown in FIG. 12 was prepared. For this, the cathode electrode of a vacuum container for forming each i-type layer was configured to have the separator configuration shown in FIG. 2A. In the cathode electrode structure, the ratio of the surface area of the cathode electrode relative to the sum of surface areas of the conductive belt-like member and the anode electrode was set to 2.1.

Also, as a first conductive layer forming container and a second conductive layer forming container, forming containers having a parallel-plate type RF electrode were used.

In the manufacture device shown in FIG. 6, as not shown, the first conductive layer forming vacuum container 601, the i-type layer forming vacuum container 100 and the second conductive layer forming vacuum container 602 are connected via a gas gate to form one set. Two additional sets were provided, and the three sets in total were repeated or arranged in series, to form the device for use. Further in the device, all the first conductive layer forming containers and the second conductive layer forming containers were provided with the aforementioned forming containers, to form a triple-type photovoltaic element.

By using the device (not shown), under forming conditions shown in Table 13-1, on a lower electrode, the first conductive layer, the first i-type layer, the second conductive layer, the first conductive layer, the second i-type layer, the second conductive layer, the first conductive layer, the third i-type layer and the second conductive layer were successively laminated and deposited, in the same procedure as Example 7, to continuously prepare a triple-type photovoltaic element (referred to as Element-E3).

Table 13-1 shows the conditions for forming the photovoltaic element in Example 13.

TABLE 13-1

Substrate: SUS430BA, thickness 0.13 mm
Reflective layer: silver (Ag) thin film, 100 nm
Reflective increase layer: zinc oxide (ZnO) thin film, 1 $\mu$m
Gate gas: 700 sccm from each gate
Transparent electrode: ITO ($In_2O_3$ + $SnO_2$) thin film, 80 nm
Collecting electrode: aluminum (Al) thin film, 2 $\mu$m
RF electrode of first and second conductive layer: parallel-plate type
RF electrode of each i-type layer:
RF power pulse modulation 1 kHz (rectangular wave)
Separator configuration of each i-type layer: FIG. 2A

| Layer | Layer Thickness (nm) | Gas and gas flow rate (sccm) | RF power (W) | Pressure (Torr) | Substrate Temperature (° C.) |
|---|---|---|---|---|---|
| First conductive layer | 40 | $SiH_4$<br>$PH_3/H_2$<br>(2% DILUTION)<br>$H_2$ | 50<br>50<br><br>500 | 500 | 1.5 | 350 |
| i-type layer | 100 | $SiH_4$<br>$GeH_4$<br>$H_2$ | 55 each<br>55 each<br>500 each | 200 | 1.8 | 350 |

TABLE 13-1-continued

Substrate: SUS430BA, thickness 0.13 mm
Reflective layer: silver (Ag) thin film, 100 nm
Reflective increase layer: zinc oxide (ZnO) thin film, 1 μm
Gate gas: 700 sccm from each gate
Transparent electrode: ITO ($In_2O_3$ + $SnO_2$) thin film, 80 nm
Collecting electrode: aluminum (Al)thin film, 2 μm
RF electrode of first and second conductive layer: parallel-plate type
RF electrode of each i-type layer:
RF power pulse modulation 1 kHz (rectangular wave)
Separator configuration of each i-type layer: FIG. 2A

| Layer | Layer Thickness (nm) | Gas and gas flow rate (sccm) | | RF power (W) | Pressure (Torr) | Substrate Temperature (° C.) |
|---|---|---|---|---|---|---|
| Second conductive layer | 10 | $SiH_4$<br>$BF_3/H_2$<br>(2% DILUTION)<br>$H_2$ | 10<br>100<br><br>2000 | 600 | 1.6 | 250 |
| First conductive layer | 40 | $SiH_4$<br>$PH_3/H_2$<br>(2% DILUTION)<br>$H_2$ | 40<br>50<br><br>50 | 500 | 1.5 | 270 |
| Second i-type layer | 110 | $SiH_4$<br>$GeH_4$<br>$H_2$ | 65 each<br>45 each<br>500 each | 200 | 1.8 | 350 |
| Second conductive layer | 10 | $SiH_4$<br>$BF_3/H_2$<br>(2% DILUTION)<br>$H_2$ | 10<br>100<br><br>2000 | 600 | 1.6 | 250 |
| First conductive layer | 40 | $SiH_4$<br>$PH_3/H_2$<br>(2% DILUTION)<br>$H_2$ | 40<br>50<br><br>200 | 500 | 1.5 | 220 |
| Third i-type layer | 100 | $SiH_4$<br>$H_2$ | 110 each<br>500 each | 200 | 1.8 | 200 |
| Second conductive layer | 10 | $SiH_4$<br>$BF_3/H_2$<br>(2% DILUTION)<br>$H_2$ | 10<br>100<br><br>2000 | 600 | 1.6 | 200 |

COMPARATIVE EXAMPLE 6

Comparative Example 6 is different from Example 7 in that the cathode electrode of the vacuum container for forming each i-type layer is of a parallel-plate type, and the cathode electrode structure shown in FIGS. 4 and 5 was used. In the cathode electrode structure, the ratio of the surface area of the cathode electrode relative to the sum of surface areas of the conductive belt-like member and the anode electrode was 0.6 times.

However, the same conditions for forming the photovoltaic element as in Example 13 (Table 13-1) were used.

All other aspects were the same as in Example 13, to form a triple-cell type photovoltaic element (referred to as Element-C6).

In the following, regarding the photovoltaic elements formed in Example 13 and Comparative Example 6, i.e., Element-E13 and Element-C6, in the same manner as Example 7, the property uniformity, the defect density and the photodeterioration were evaluated. Results are shown in Table 13-2.

TABLE 13-2

| ELEMENT NO. | DISPERSION IN CONVERSION EFFICIENCY | DEFECT DENSITY | PHOTO DETERIO-RATION RATIO |
|---|---|---|---|
| ELEMENT-E13 | 0.72 | 0.70 | 0.70 |
| ELEMENT-C6 | 1.00 | 1.00 | 1.00 |

It is found from Table 13-2 that the photovoltaic element of Example 13 (Element-E13) is superior to the photovoltaic element of Comparative Example 6 (Element-C6) in conversion efficiency, defect density and photodeterioration ratio, and the photovoltaic element having the superior properties can be obtained according to the forming method of the invention.

EXAMPLE 14

In Example 14, by using a continuous plasma CVD device in a roll to roll system shown in FIG. 8, a single-cell type photovoltaic element shown in FIG. 11 was prepared.

Also, among the i-type layer forming vacuum containers, as 190*b* and 190*d*, the forming containers having the cathode electrode structure configured as shown in FIG. 3A were used. In this case, the closest distance ($l_1$ in FIG. 1) between the belt-like member and the separator electrode as a part of the cathode electrode was set to 2 cm, the interval ($l_2$ in FIG.

1) among a plurality of arranged separator electrodes was set to 6 cm, and the ratio of the surface area of the cathode electrode relative to the sum of surface areas of the conductive belt-like member and the anode electrode was set to 2.9.

Also, as the cathode electrode of another two i-type layer forming containers 190a, 190c, the n-type layer forming container 190n and the p-type layer forming container 190p, the conventional cathode electrode shown in FIG. 4 was used.

In the device of Example 14, in the same manner as in FIG. 8, the vacuum containers 151 and 152 for delivering and winding the belt-like member 101 are provided. Between these two vacuum containers, the first conductive layer forming vacuum container 190n, the i-type layer forming vacuum containers 190a, 190b, 190c, 190d, and the second conductive layer forming vacuum container 190p are connected via gas gates 191n, 191, 192, 193, 194, 195, 191p.

By using the manufacture device, according to the conditions shown in Table 14-1, on the lower electrode, the first conductive layer, the i-type layer and the second conductive layer were continuously formed by the following procedure, to prepare a single-cell type photovoltaic element (referred to as Element-E14).

(1) First, the bobbin 153 with the belt-like member 101 wound therearound was set in the vacuum container 151 having a substrate delivery mechanism. As the belt-like member 101, a belt-like member 4001 of SUS430 BA (width 120 mm×length 200 m×thickness 0.13 mm) was prepared by carrying out sufficient degreasing and cleaning, and evaporating a silver thin film 4002 of 100 nm and a ZnO thin film 4003 of 1 μm as the lower electrodes in a sputtering method.

(2) The belt-like member 101 was passed via the gas gates and each non-single crystal layer forming vacuum container to the vacuum container 152 having a belt-like member take-up mechanism, in which the tension was adjusted to remove any slack.

(3) Each vacuum container 151, 190n, 190a, 190b, 190c, 190d, 190p, 152 was evacuated with a vacuum pump (not shown) to $1 \times 10^{-4}$ Torr or less.

(4) To each gas gate from each gas pipe 181n, 181, 182, 183, 184, 185, 181p was flown 700 sccm each of $H_2$ as gate gas, and by the lamp heaters 174n, 174a, 174b, 174c, 174d and 174p, the belt-like member 101 was heated to 350° C., 300° C., 300° C., 300° C., 300° C. and 250° C., respectively.

(5) From each gas pipe 194n, 194a, 194b, 194c, 194d, 194p, a specified gas was introduced accoeding to the conditions shown in Table 14-1.

(6) The pressure in each vacuum container was adjusted with each conductance valve 159, 160 to be a pressure value as shown in Table 14-1.

(7) After the process (6) of pressure adjustment, to each cathode electrode each RF power shown in Table 14-1 was introduced.

(8) The belt-like member 101 was conveyed in a direction shown by an arrow in FIG. 8, to successively form the first conductive layer 4004, the i-type layer 4005 and the conductive layer 4006 on the belt-like member 101.

(9) On the second conductive layer formed in the process (8), as a transparent electrode 4010, ITO ($In_2O_3+SnO_2$) was deposited 80 nm by vacuum evaporation, and further as a collecting electrode 4011, Al was deposited 2 μm by vacuum evaporation, thereby finishing formation of the photovoltaic element (referred to as Element-E14).

Table 14-1 shows the conditions for forming the photovoltaic element in Example 14.

TABLE 14-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer (100 n) | 40 | $SiH_4$<br>$PH_3/H_2$<br>(2% DILUTION)<br>$H_2$ | 40<br>50<br><br>500 | 800 | 1.5 | 350 |
| i-type layer (100a) | 70 | $SiH_4$<br>$H_2$ | 80<br>200 | 100 | 1.8 | 300 |
| i-type layer (100b) | — | $H_2$ | 200 | 200 | 1.8 | 300 |
| i-type layer (100c) | 70 | $SiH_4$<br>$H_2$ | 80<br>200 | 100 | 1.8 | 300 |
| i-type layer (100d) | — | $H_2$ | 200 | 200 | 1.8 | 300 |
| Second conductive layer (100p) | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate

COMPARATIVE EXAMPLE 7

Comparative Example 7 is different from Example 14 in that after forming the i-type layer, $H_2$ plasma processing was not conducted.

Figure 9:
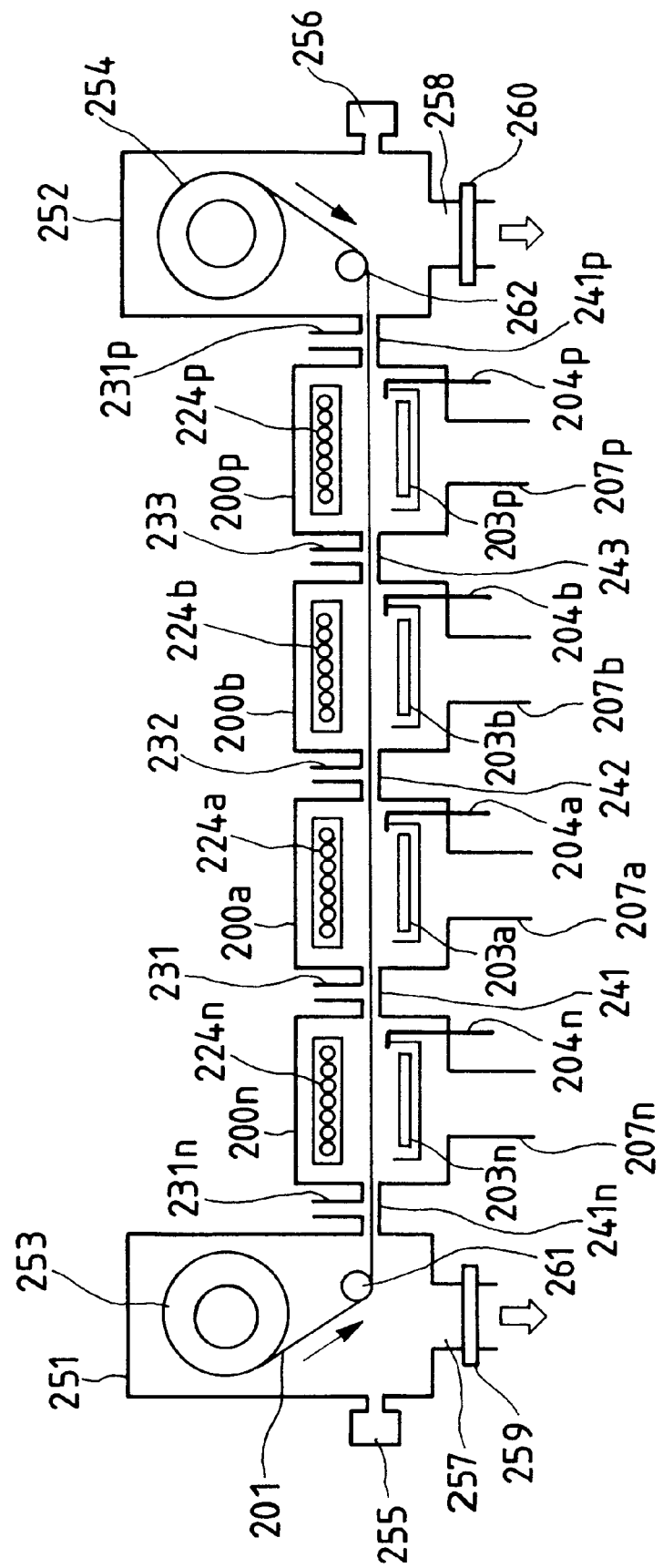
FIG. 9 is a diagrammatic representation showing an example of a forming device using a conventional method of forming a non-single crystal semiconductor thin film.

As the device of forming the photovoltaic element, a continuous plasma CVD device using a roll to roll system as shown in FIG. 9 was used. The device of FIG. 9 has vacuum containers 251 and 252 for delivering and winding a belt-like member 201. Between these two vacuum containers, a first conductive layer forming vacuum container 200n, i-type layer forming vacuum containers 200a, 200b, and a second conductive layer forming vacuum container 200p are connected via a gas gate.

In the n-type layer forming container 200n, the i-type layer forming vacuum containers 200a, 200b and the second conductive layer forming vacuum container 200p, respectively, as cathode electrodes 203n, 203a, 203b, 203p, the conventional cathode electrodes shown in FIG. 4 were used. In this case, the ratio of the surface area of the cathod electrode relative to the sum of surface areas of the conductive belt-like member and the anode electrode was set to 0.6. However, the conditions for forming the photovoltaic element shown in Table 14-2 were used.

All other aspects were the same as in Example 14, to form a single-cell type photovoltaic element (referred to as Element-C7).

TABLE 14-3

| Element No. | Self bias during $H_2$ plasma process | Conversion efficiency | Open voltage | Current density | Fill factor |
| --- | --- | --- | --- | --- | --- |
| Element-E14 | +18 | 1.05 | 1.01 | 1.01 | 1.03 |
| Element-C7 | — | 1.00 | 1.00 | 1.00 | 1.00 |

As shown in Table 14-3, to the photovoltaic element of Comparative Element 7 (Element-C7), the photovoltaic element of Example 14 (Element-E14) is superior in conversion efficiency. Therefore, it is found that the photovoltaic element prepared in the forming method of the invention has superior properties.

For the property uniformity, from the photovoltaic elements on the belt-like member prepared in Example 14 and Comparative Example 7 (Element-E14), (Element-C7), pieces having an area of 5 cm square were cut at every interval of 10 m and placed under radiation of AM-1.5 (100 mW/cm$^2$), the photoelectric conversion efficiency was measured and the dispersion in the photoelectric conversion

TABLE 14-2

| Layer | Layer Thickness (nm) | Gas and gas flow rate (sccm) | | RF power (W) | Pressure (Torr) | Substrate Temperature (° C.) |
| --- | --- | --- | --- | --- | --- | --- |
| First conductive layer (200 n) | 40 | $SiH_4$<br>$PH_3/H_2$ (2% DILUTION)<br>$H_2$ | 40<br>50<br><br>500 | 800 | 1.5 | 350 |
| i-type layer (200a) | 70 | $SiH_4$<br>$H_2$ | 100<br>500 | 200 | 1.8 | 300 |
| i-type layer (200b) | 70 | $SiH_4$<br>$H_2$ | 100<br>500 | 200 | 1.8 | 300 |
| Second conductive layer (200p) | 10 | $SiH_4$<br>$BF_3/H_2$ (2% DILUTION)<br>$H_2$ | 10<br>100<br><br>2000 | 800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate Regarding the aforementioned photovoltaic elements prepared in Example 14 and Comparative Example 7, Element-E14 and Element-C7, conversion efficiency, property uniformity and yield were evaluated.

For the current voltage property, pieces having an area of 5 cm square were cut at every interval of 10 m and placed under radiation of AM-1.5 (100 mW/cm$^2$), and the photoelectric conversion ratio was measured and evaluated. Measurement results are shown in Table 14-3. In the table, by setting each property of Element-C7 to 1.00, the values of Element-E14 are shown. Element-E14 exhibits each property enhanced as a whole as compared with Element-C7, and especially has enhanced in fill factor. As a result, the conversion efficiency was increased to 1.05 times.

efficiency was evaluated. On the basis of the photovoltaic element of Comparative Example 7 (Element-C7), the inverse number of the size of dispersion was obtained. Results are shown in Table 14-4.

Regarding the yield, from the photovoltaic elements on the belt-like member prepared in Example 14 and Comparative Example 7 (Element-E14), (Element-C7), pieces having an area of 5 cm square were cut at every interval of 10 m, the shunt resistance in the dark condition was measured, the pieces having a resistance value of $1\times10^3$ Ωm·m$^2$ were counted as good, and their ratio in the total number was represented in percentage and evaluated. In this manner, the yield of the photovoltaic elements of Embodiment 14 (Element-E14) and Comparative Example 7 (Element-C7) was obtained. Results are shown in Table 14-4.

TABLE 14-4

| ELEMENT NO. | INVERSE NUMBER OF DISPERSION IN CONVERSION EFFICIENCY | YIELD (%) |
|---|---|---|
| ELEMENT-E14 | 1.11 | 99 |
| ELEMENT-C7 | 1.00 | 89 |

As shown in Table 14-4, to the photovoltaic element of Comparative Example 7 (Element-C7), the photovoltaic element of Embodiment 14 (Element-E14) is superior in property uniformity and yield, and it is found that the single-cell type photovoltaic element formed according to the forming method of the invention has superior properties.

EXAMPLE 15

In Example 15, continuous plasma CVD devices using the roll to roll system shown in FIGS. 8 and 9 were connected for use, and a triple-cell type photovoltaic element shown in FIG. 12 was prepared.

First, as the first cell layer forming container, in the device of FIG. 9, the first conductive layer forming vacuum container 200n, the i-type layer forming vacuum containers 200a, 200b and the second conductive layer forming vacuum container 200p were connected to one set for use.

Subsequently, to the first cell layer forming container, another set of the same container was added and connected in series, as a second layer forming container.

Further to the second cell layer forming container, the device as shown in FIG. 8 was connected in series, as a third cell layer forming container. Here, in the device as shown in FIG. 8, the third conductive layer forming vacuum container 190n, the third i-type layer forming vacuum containers 190a, 190b, 190c, 190d, and the third conductive layer forming vacuum container 190p are connected via gas gates. One set of this constituted device was used.

After connecting these three sets in series, at both terminal ends, the device constituted of the delivering container 151 and the winding container 152 was used, to form a triple-cell type photovoltaic element shown in FIG. 12.

Also, among the i-type layer forming vacuum containers, as 190b and 190d, the forming containers having the cathode electrode structure configured as shown in FIG. 3A were used. In this case, the closest distance ($l_1$ in FIG. 1) between the belt-like member and the separator electrode as a part of the cathode electrode was set to 2 cm, the interval ($l_2$ in FIG. 1) among a plurality of arranged separator electrodes was set to 6 cm, and the ratio of the surface area of the cathode electrode relative to the sum of surface areas of the conductive belt-like member and the anode electrode was set to 2.9.

Also, as the cathode electrode of another two i-type layer forming container, the n-type layer forming container and the p-type layer forming container, the conventional cathode electrode shown in FIG. 4 was used.

By using the manufacture device, according to the conditions shown in Table 15-1, on the lower electrode, the substrate 5001, the reflective layer 5002 and the reflective increase layer 5003, the first cell (the first conductive layer 5004, the first i-type layer 5005 and the second conductive layer 5006), the second cell (the first conductive layer 5007, the second i-type layer 5008 and the second conductive layer 5009) and the third cell (the first conductive layer 5010, the third i-type layer 5011 and the second conductive layer 5012) were successively laminated and deposited continuously in the same procedure as Example 14, to form the transparent electrode 5013 and the collecting electrode 5014 and prepare a triple-cell type photovoltaic element (referred to as Element-E15).

Table 15-1 shows the conditions for forming the photovoltaic element of Example 15.

TABLE 15-1

| Layer | Layer Thickness (nm) | Gas and gas flow rate (sccm) | | RF power (W) | Pressure (Torr) | Substrate Temperature (° C.) |
|---|---|---|---|---|---|---|
| First Cell | | | | | | |
| First conductive layer | 40 | $SiH_4$<br>$PH_3/H_2$<br>(2% DILUTION)<br>$H_2$ | 40<br>50<br><br>500 | 800 | 1.5 | 350 |
| First i-type layer (for one container) | 50 | $SiH_4$<br>$GeH_4$<br>$H_2$ | 40<br>40<br>200 | 100 | 1.8 | 350 |
| Second conductive layer | 10 | $SiH_4$<br>$BF_3/H_2$<br>(2% DILUTION)<br>$H_2$ | 10<br>100<br><br>2000 | 800 | 1.6 | 250 |
| Second Layer | | | | | | |
| First conductive layer | 40 | $SiH_4$<br>$PH_3/H_2$<br>(2% DILUTION)<br>$H_2$ | 40<br>50<br><br>500 | 800 | 1.5 | 350 |
| Second i-type layer (for one container) | 50 | $SiH_4$<br>$GeH_4$<br>$H_2$ | 45<br>35<br>200 | 100 | 1.8 | 350 |
| Second | 10 | $SiH_4$ | 10 | 800 | 1.6 | 250 |

TABLE 15-1-continued

| Layer | Layer Thickness (nm) | Gas and gas flow rate (sccm) | | RF power (W) | Pressure (Torr) | Substrate Temperature (° C.) |
|---|---|---|---|---|---|---|
| conductive layer | | BF$_3$/H$_2$ (2% DILUTION) H$_2$ | 100 2000 | | | |
| Third Cell | | | | | | |
| First conductive layer | 40 | SiH$_4$ PH$_3$/H$_2$ (2% DILUTION) H$_2$ | 40 50 500 | 800 | 1.5 | 350 |
| Third i-type layer | 60 | SiH$_4$ H$_2$ | 40 200 | 100 | 1.8 | 200 |
| Third i-type layer | — | H$_2$ | 200 | 100 | 1.8 | 200 |
| Third i-type layer | 60 | SiH$_4$ H$_2$ | 40 200 | 100 | 1.8 | 200 |
| Third i-type layer | — | H$_2$ | 200 | 100 | 1.8 | 200 |
| Second conductive layer | 10 | SiH$_4$ BF$_3$/H$_2$ (2% DILUTION) H$_2$ | 10 100 2000 | 800 | 1.6 | 200 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO (In$_2$O$_3$ + SnO$_2$) thin film, 80 nm
Collecting electrode: aluminum (Al) thin film, 2 μm
Gate gas: 700 sccm from each gate

COMPARATIVE EXAMPLE 8

Comparative Example 8 is different from Example 15 in that to form the third cell, after forming the i-type layer, H$_2$ plasma processing was not carried out. Specifically, as the device for forming the third cell, in the manufacture device shown in FIG. 9, only the portions 200n, 200a, 200b and 200p were used.

Using the manufacture device, under the forming conditions shown in Table 15-2, a triple-cell type photovoltaic element (referred to as Element-C8) was prepared. All other aspects were the same as Example 15.

Table 15-2 shows the conditions for forming the photovoltaic element of Comparative Example 8.

TABLE 15-2

| Layer | Layer Thickness (nm) | Gas and gas flow rate (sccm) | | RF power (W) | Pressure (Torr) | Substrate Temperature (° C.) |
|---|---|---|---|---|---|---|
| First Cell | | | | | | |
| First conductive layer | 40 | SiH$_4$ PH$_3$/H$_2$ (2% DILUTION) H$_2$ | 40 50 500 | 800 | 1.5 | 350 |
| First i-type layer (for one container) | 50 | SiH$_4$ GeH$_4$ H$_2$ | 40 40 200 | 100 | 1.8 | 350 |
| Second conductive layer | 10 | SiH$_4$ BF$_3$/H$_2$ (2% DILUTION) H$_2$ | 10 100 2000 | 800 | 1.6 | 250 |
| Second Layer | | | | | | |
| First conductive layer | 40 | SiH$_4$ PH$_3$/H$_2$ (2% DILUTION) H$_2$ | 40 50 500 | 800 | 1.5 | 350 |
| Second i-type layer (for one container) | 50 | SiH$_4$ GeH$_4$ H$_2$ | 45 35 200 | 100 | 1.8 | 350 |
| Second conductive | 10 | SiH$_4$ BF$_3$/H$_2$ | 10 100 | 800 | 1.6 | 250 |

TABLE 15-2-continued

| Layer | Layer Thickness (nm) | Gas and gas flow rate (sccm) | | RF power (W) | Pressure (Torr) | Substrate Temperature (° C.) |
|---|---|---|---|---|---|---|
| layer | | (2% DILUTION) H$_2$ | 2000 | | | |
| Third Cell | | | | | | |
| First conductive layer | 40 | SiH$_4$ PH$_3$/H$_2$ (2% DILUTION) H$_2$ | 40 50 500 | 800 | 1.5 | 350 |
| Third i-type layer (for one container) | 60 | SiH$_4$ H$_2$ | 40 200 | 100 | 1.8 | 200 |
| Second conductive layer | 10 | SiH$_4$ BF$_3$/H$_2$ (2% DILUTION) H$_2$ | 10 100 2000 | 800 | 1.6 | 200 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO (In$_2$O$_3$ + SnO$_2$) thin film, 80 nm
Collecting electrode: aluminum (Al) thin film, 2 μm
Gate gas: 700 sccm from each gate The aforementioned photovoltaic elements prepared in Example 15 and Comparative Example 8 (Element-E15), (Element-C8) were evaluated with respects to conversion efficiency, property uniformity and yield.

Regarding the current voltage property, pieces having an area of 5 cm square were cut out at every interval of 10 m and placed under radiation of AM-1.5 (100 mW/cm$^2$), and the photoelectric conversion efficiency was measured and evaluated. Measurement results are shown in Table 15-2. In the table, by setting each property of Element-C8 as 1.00, each value of Element-E15 is shown. Each property of Element-E15 is as a whole enhanced as compared with Element-C8, and enhancement is exhibited especially with respect to fill factor. As a result, the conversion efficiency is increased to 1.05 times.

TABLE 15-3

| Element No. | Self bias during H$_2$ plasma process | Conversion efficiency | Open voltage | Current density | Fill factor |
|---|---|---|---|---|---|
| Element-E15 | +14 | 1.04 | 1.01 | 1.01 | 1.02 |
| Element-C8 | — | 1.00 | 1.00 | 1.00 | 1.00 |

As shown in Table 15-3, to the photovoltaic element of Comparative Element 8 (Element-C8), the photovoltaic element of Example 15 (Element-E15) is superior in conversion efficiency. Therefore, it is found that the photovoltaic element prepared in the forming method of the invention has superior properties.

For the property uniformity, from the photovoltaic elements on the belt-like member prepared in Example 15 and Comparative Example 8 (Element-E15), (Element-C8), pieces having an area of 5 cm square were cut at every interval of 10 m and placed under radiation of AM-1.5 (100 mW/cm$^2$), the photoelectric conversion efficiency was measured and the dispersion in the photoelectric conversion efficiency was evaluated. On the basis of the photovoltaic element of Comparative Example 8 (Element-C8), the inverse number of the size of dispersion was obtained. Results are shown in Table 15-4.

Regarding the yield, from the photovoltaic element on the belt-like member prepared in Example 15 and Comparative Example 8 (Element-E15), (Element-C8), pieces having an area of 5 cm square were cut at every interval of 10 m, the shunt resistance in the dark condition was measured, the pieces having a resistance value of $1 \times 10^3$ Ω·cm$^2$ were counted as good, and their ratio in the total number was represented as a percentage and evaluated. In this manner, the yield of the photovoltaic elements of Embodiment 15 (Element-E15) and Comparative Example 8 (Element-C8) was obtained. Results are shown in Table 15-4.

TABLE 15-4

| ELEMENT NO. | INVERSE NUMBER OF DISPERSION IN CONVERSION EFFICIENCY | YIELD (%) |
|---|---|---|
| ELEMENT-E15 | 1.08 | 99 |
| ELEMENT-C8 | 1.00 | 92 |

As shown in Table 15-4, to the photovoltaic element of Comparative Example 8, the photovoltaic element of Embodiment 15 (Element-E15) is superior in property uniformity and yield, and it is found that the triple-cell type photovoltaic element formed according to the forming method of the invention has superior properties.

EXAMPLE 16

In Example 16, in the continuous plasma CVD device using the roll to roll system shown in FIG. 8, as all the vacuum containers for forming the i-type layer, i.e., 190a, 190b, 190c and 190d, the forming containers having the cathode electrode structure configured as shown in FIG. 3A in the same manner as Example 14 were used, to form a single-cell type photovoltaic element shown in FIG. 11.

Using the manufacture device, according to the forming conditions shown in Table 16-1, a single-cell type photovoltaic element (referred to as Element-E16) was formed. All other aspects were the same as Example 14.

Table 16-1 shows the conditions for forming the photovoltaic element of Example 16.

TABLE 16-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer (100n) | 40 | $SiH_4$<br>$PH_3/H_2$<br>(2% DILUTION)<br>$H_2$ | 40<br>50<br><br>500 | ?800 | 1.5 | 350 |
| i-type layer (100a) | 65 | $SiH_4$<br>$H_2$ | 70<br>200 | 100 | 1.8 | 300 |
| i-type layer (100b) | — | $H_2$ | 200 | 200 | 1.8 | 300 |
| i-type layer (100c) | 65 | $SiH_4$<br>$H_2$ | 70<br>200 | 100 | 1.8 | 300 |
| i-type layer (100d) | — | $H_2$ | 200 | 200 | 1.8 | 300 |
| Second conductive layer (100p) | 10 | $SiH_4$<br>$BF_3/H_2$<br>(2% DILUTION)<br>$H_2$ | 10<br>100<br><br>2000 | ?800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate The aforementioned photovoltaic elements prepared in Example 16 and Comparative Example 7 (Element-E16), (Element-C7) were evaluated respect to the conversion efficiency, the property uniformity and the yield.

Regarding the current voltage property, pieces having an area of 5 cm square were cut out at every interval of 10 m and placed under radiation of AM-1.5 (100 mW/cm²), and the photoelectric conversion efficiency was measured and evaluated. Measurement results are shown in Table 16-2. In the table, by setting each property of Element-C7 as 1.00, each value of Element-E16 is shown. Each property of Element-E16 is as a whole enhanced as compared with Element-C7, and enhancement is seen exhibited especially with respect to fill factor. As a result, the conversion efficiency is increased to 1.06 times.

Comparative Example 7 (Element-E16), (Element-C7), pieces having an area of 5 cm square were cut at every interval of 10 m and placed under radiation of AM-1.5 (100 mW/cm²), the photoelectric conversion efficiency was measured and the dispersion in the photoelectric conversion efficiency was evaluated. On the basis of the photovoltaic element of Comparative Example 7 (Element-C7), the inverse number of the size of dispersion was obtained. Results are shown in Table 16-3.

Regarding the yield, from the photovoltaic elements on the belt-like member prepared in Example 16 and Comparative Example 7 (Element-E16), (Element-C7), pieces having an area of 5 cm square were cut at every interval of 10 m, the shunt resistance in the dark condition was measured, the pieces having a resistance value of $1 \times 10^3$ Ω·cm² were counted as good, and their ratio in the total number was represented as is percentage and evaluated. In this manner,

TABLE 16-2

| Element No. | Self bias (V) | | | | Conversion efficiency | Open voltage | Current density | Fill factor |
|---|---|---|---|---|---|---|---|---|
| | 100a | 100b | 100c | 100d | | | | |
| Element-E16 | +16 | +28 | +16 | +28 | 1.06 | 1.01 | 1.01 | 1.04 |
| Element-C7 | — | — | — | — | 1.00 | 1.00 | 1.00 | 1.00 |

As shown in Table 16-2, to the photovoltaic element of Comparative Example 7 (Element-C7), the photovoltaic element of Example 16 (Element-E16) is superior in conversion efficiency. Therefore, it is found that the photovoltaic element prepared in the forming method of the invention has superior properties.

For the property uniformity, from the photovoltaic elements on the belt-like member prepared in Example 16 and the yield of the photovoltaic elements of Embodiment 16 (Element-E16) and Comparative Example 7 (Element-C7) was obtained. Results are shown in Table 16-3.

TABLE 16-3

| ELEMENT NO. | INVERSE NUMBER OF DISPERSION IN CONVERSION EFFICIENCY | YIELD (%) |
|---|---|---|
| ELEMENT-E16 | 1.14 | 99 |
| ELEMENT-C7 | 1.00 | 89 |

As shown in Table 16-3, as to the photovoltaic element of Comparative Example 7 (Element-C7), the photovoltaic element of Embodiment 16 (Element-E16) is superior in property uniformity and yield, and it is found that the single-cell type photovoltaic element formed according to the forming method of the invention has superior properties.

EXAMPLE 17

In Example 17, in the forming container for $H_2$ plasma processing of Example 14, the closest distance ($l_1$ in FIG. 1) between the belt-like member and the separator electrode as a part of the cathode electrode was varied to form five different devices ($l_1$ (cm)=0.2, 1, 3, 5, 6), different from Example 14, as single-cell type photovoltaic elements, shown in FIG. 11.

Specifically, the forming container for $H_2$ plasma processing of Example 14 corresponds to the i-type layer forming vacuum containers 190b and 190d having the cathode electrode structure configured as shown in FIG. 3A.

In this case, the interval between a plurality of arranged separator electrodes ($l_2$ in FIG. 1) were set to 5 cm. The ratio of the surface area of the cathode electrode relative to the sum of surface areas of the conductive belt-like member and the anode electrode was set to about 2.9.

Using the manufacture device, according to the forming conditions shown in Table 14-1, single-cell type photovoltaic elements (referred to as Element-E171–175) were formed. All other aspects were the same as Example 14.

The photovoltaic elements (Element-E171-175) prepared in Example 17 were evaluated with respects to the conversion efficiency, the property uniformity and the yield. As the comparative example, the results of the photovoltaic element (Element-C7) of Comparative Example 7 prepared in the conventional method were used.

For the current voltage property, pieces having an area of 5 cm square were cut at every interval of 10 m and placed under radiation of AM-1.5 (100 mW/cm$^2$), and the photoelectric conversion ratio was measured and evaluated. Measurement results are shown in Table 17. In the table, by setting each property of Element-C7 to 1.00, the values of Element-E171–175 are shown.

TABLE 17

| Element No. | Distance $l_1$ (cm) | Conversion efficiency | Open voltage | Current density | Fill factor |
|---|---|---|---|---|---|
| Element-E171 | 0.2 | 1.04 | 1.01 | 1.01 | 1.02 |
| Element-E172 | 1 | 1.03 | 1.01 | 1.01 | 1.01 |
| Element-E173 | 3 | 1.02 | 1.00 | 1.01 | 1.02 |
| Element-E174 | 5 | 1.02 | 1.00 | 1.01 | 1.02 |
| Element-E175 | 6 | 1.00 | 1.00 | 1.00 | 1.00 |
| Element-C7 | — | 1.00 | 1.00 | 1.00 | 1.00 |

As shown in Table 17, as compared with the photovoltaic element (Element-C7) of Comparative Example 7, each property of the photovoltaic elements (Element-E171–174), in which the distance $l_1$ is 5.0 cm or less, is enhanced as a whole. Especially, in Element-E171, 172, when the distance $l_1$ is 1.0 cm or less, the conversion efficiency is 1.03 to 1.04 times.

Therefore, it is found that by using the device in which the closest distance $l_1$ between the separator electrodes and the belt-like member is 5 cm or less, preferably 1 cm or less, a photovoltaic element having superior properties can be obtained.

EXAMPLE 18

In Example 18, in the forming container for $H_2$ plasma processing of Example 14, the interval ($l_2$ in FIG. 1) between the plurality of arranged separator electrodes was varied to form six different devices ($l_2$ (cm)=1, 2, 4, 7, 10, 12), as single-cell type photovoltaic elements shown in FIG. 6, different from Example 14.

Specifically, the forming container for $H_2$ plasma processing of Example 14 corresponds to the i-type layer forming vacuum containers 190b and 190d having the cathod electrode structure configured as shown in FIG. 3A.

In this case, the closest distance ($l_1$ in FIG. 1) between the belt-like member and the separator electrode as a part of the cathod electrode was fixed to 1 cm. The ratio of the surface area of the cathode electrode relative to the sum of surface areas of the conductive belt-like member and the anode electrode was set about to 2.9.

Using the manufacture device, on the forming conditions shown in Table 14-1, single-cell type photovoltaic elements (referred to as Element-E181–186) were formed. All other aspects were the same as Example 14.

The photovoltaic elements (Element-E181–186) prepared in Example 18 were evaluated with respect to the conversion efficiency, the property uniformity and the yield. As the comparative example, the results of the photovoltaic element (Element-C7) of Comparative Example 7 prepared in the conventional method were used.

For the current voltage property, pieces having an area of 5 cm square were cut at every interval of 10 m and placed under radiation of AM-1.5 (100 mW/cm$^2$), and the photoelectric conversion ratio was measured and evaluated. Measurement results are shown in Table 18. In the table, by setting each property of Element-C7 to 1.00, the values of Element-E181–186 are shown.

TABLE 18

| Element No. | Interval $l_2$ (cm) | Conversion efficiency | Open voltage | Current density | Fill factor |
|---|---|---|---|---|---|
| Element-E181 | 1 | 1.00 | 1.00 | 1.00 | 1.00 |
| Element-E182 | 2 | 1.04 | 1.01 | 1.01 | 1.02 |
| Element-E183 | 4 | 1.04 | 1.01 | 1.01 | 1.02 |
| Element-E184 | 7 | 1.04 | 1.01 | 1.01 | 1.02 |
| Element-E185 | 10 | 1.03 | 1.01 | 1.01 | 1.01 |
| Element-B186 | 12 | 1.00 | 1.00 | 1.00 | 1.00 |
| Element-C7 | — | 1.00 | 1.00 | 1.00 | 1.00 |

As shown in Table 18, as compared with the photovoltaic element of Comparative Example 7 (Element-C7), each property of the photovoltaic elements (Element-E182–185), in which the interval $l_2$ is from 2 cm to 10 cm, is enhanced especially in the conversion efficiency.

Therefore, it is found that by using the device in which the interval ($l_2$ in FIG. 1) among the plurality of arranged separator electrodes is from 2 cm to 10 cm, a photovoltaic element having superior properties can be obtained.

EXAMPLE 19

In Example 19, in the continuous plasma CVD device using the roll to roll system shown in FIG. 8, by changing the flow rate of $SiH_4$ gas to be introduced and the RF power to be applied of the i-type layer forming container, the deposition rate of the i-type layer was changed, to form the single-cell type photovoltaic element shown in FIG. 11.

As all the i-type layer forming vacuum containers in the device of FIG. 8, i.e., 190a, 190b, 190c and 190d, the forming containers having the cathode electrode structure configured as shown in FIG. 3A were used. In this case, the closest distance ($l_1$ in FIG. 1) between the belt-like member and the separator electrode as a part of the cathode electrode was set to 2 cm, the interval ($l_2$ in FIG. 1) among the plurality of arranged separator electrodes was set to 6 cm, and the ratio of the surface area of the cathode electrode relative to the sum of surface areas of the conductive belt-like member and the anode electrode was set to 2.9.

Also, in the n-type layer forming container 190n and the p-type layer forming container 190p, the conventional cathode electrode shown in FIG. 4 was used.

Using the manufacture device, on the forming conditions shown in Table 19-1, single-cell type photovoltaic elements (referred to as Element-E191–194) were formed. All other aspects were the same as Example 14.

not conducted. In the continuous plasma CVD device using the roll to roll system shown in FIG. 9, as the cathode electrodes in the i-type forming containers 190a, 190b, the n-type layer forming container 190n and the p-type layer forming container 190p, the conventional cathode electrodes shown in FIG. 4 were used. In this case, the ratio of the surface area of the cathode electrode relative to the sum of surface areas of the conductive belt-like member and the anode electrode was set to 0.6. Also, by adjusting the opening length of the discharge space, the film thickness of the i-type layer was set constant as 140 nm in either conditions of Example 19 or Comparative Example 9.

Using the manufacture device, on the forming conditions shown in Table 19-2, single-cell type photovoltaic elements (referred to as Element-C91–94) were formed. All other aspects were the same as Example 19.

Table 19-2 shows the conditions for forming the photovoltaic element of Comparative Example 9.

TABLE 19-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer (100n) | 40 | $SiH_4$<br>$PH_3/H_2$<br>(2% DILUTION)<br>$H_2$ | 40<br>50<br><br>500 | 800 | 1.5 | 350 |
| i-type layer (100a) | 70 | $SiH_4$<br>$H_2$ | 60–100<br>200 | 80–120 | 1.8 | 300 |
| i-type layer (100b) | — | $H_2$ | 200 | 200 | 1.8 | 300 |
| i-type layer (100c) | 70 | $SiH_4$<br>$H_2$ | 60–100<br>200 | 80–120 | 1.8 | 300 |
| i-type layer (100d) | — | $H_2$ | 200 | 200 | 1.8 | 300 |
| Second conductive layer (100p) | 10 | $SiH_4$<br>$BF_3/H_2$<br>(2% DILUTION)<br>$H_2$ | 10<br>100<br><br>2000 | 800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate

COMPARATIVE EXAMPLE 9

Comparative Example 9 is different from Example 19 in that after forming the i-type layer, $H_2$ plasma processing was

TABLE 19-2

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer (200n) | 40 | $SiH_4$<br>$PH_3/H_2$ (2% DILUTION)<br>$H_2$ | 40<br>50<br><br>500 | 800 | 1.5 | 350 |
| i-type layer (200a) | 70 | $SiH_4$<br>$H_2$ | 60–120<br>500 | 180–220 | 1.8 | 300 |
| i-type layer (200b) | 70 | $SiH_4$<br>$H_2$ | 60–120<br>500 | 180–220 | 1.8 | 300 |
| Second conductive layer (200p) | 10 | $SiH_4$<br>$BF_3/H_2$ (2% DILUTION)<br>$H_2$ | 10<br>100<br><br>2000 | 800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate The aforementioned photovoltaic elements prepared in Example 19 and Comparative Example 9 (Element-E191–194), (Element-C91–94) were evaluated in conversion efficiency.

For the current voltage property, pieces having an area of 5 cm square were cut at every interval of 10 m and placed under radiation of AM-1.5 (100 mW/cm$^2$), and the photoelectric conversion ratio was measured and evaluated. Measurement results are shown in Table 19-3. In the table, by setting each property of Element-C9 to 1.00, the values of Element-E191–194 and Element-C92–94 are shown.

TABLE 19-3

| ELEMENT NO. | DEPOSITING RATE OF i-TYPE LAYER (nm/second) | SELF BIAS OF i-TYPE LAYER WHEN DISCHARGING (V) | CONVERSION EFFICIENCY |
|---|---|---|---|
| ELEMENT-E191 | 0.06 | +5 | 1.03 |
| ELEMENT-E192 | 0.10 | +11 | 1.03 |
| ELEMENT-E193 | 0.12 | +16 | 1.02 |
| ELEMENT-E194 | 0.15 | +19 | 1.02 |
| ELEMENT-C91 | 0.06 | −26 | 1.00 |
| ELEMENT-C92 | 0.10 | −29 | 0.99 |
| ELEMENT-C93 | 0.12 | −33 | 0.95 |
| ELEMENT-C94 | 0.15 | −36 | 0.93 |

As seen from Table 19-3, when the cathode electrode structure according to the invention is employed and, the self bias of the cathod electrode at the time of electric discharge becomes a positive potential, the properties of the photovoltaic elements (Element-E191–194) are superior to Element-C91 in the conversion efficiency as a whole. Especially, even when the deposition rate is increased to 0.1 nm or more per second (Element-E192–194), the properties are maintained. On the other hand, it is found that when the conventional cathode electrode structure is used (Element-C91–94), the conversion efficiency is decreases as the depositing rate increases.

Specifically, it is found that to the photovoltaic element of Comparative Example 9, the photovoltaic elements (Element-E191–194) are superior in the conversion efficiency.

Therefore, it is found that by using the device having the cathode electrode structure according to the invention and applying the $H_2$ plasma processing, the photovoltaic element has superior properties, even when the deposition rate is increased.

EXAMPLE 20

In Example 20, in the i-type layer forming containers 190a, 190c, by changing the opening length of the discharge space toward the belt-like member, the film thickness of the i-type layer deposited before the $H_2$ plasma process, i.e., the total film thickness of the i-type layer, was changed to form the single-cell type photovoltaic element shown in FIG. 11, different from Example 19.

However, the factors changed in Example 19 (the flow rate of $SiH_4$ gas to be introduced, the RF power to be applied in the i-type layer forming container) were fixed to constant values. That is to say, the deposition rate of the i-type layer was fixed.

Also, in the n-type layer forming container 190n the p-type layer forming container 190p, the conventional cathod electrode shown in FIG. 4 was used.

Using the manufacture device, according to the forming conditions shown in Table 20-1, single-cell type photovoltaic elements (referred to as Element-E201–206) were formed. All other aspects were the same as Example 19.

TABLE 20-1

| Layer | Layer Thickness (nm) | Gas and gas flow rate (sccm) | | RF power (W) | Pressure (Torr) | Substrate Temperature (° C.) |
|---|---|---|---|---|---|---|
| First conductive layer (100n) | 40 | $SiH_4$<br>$PH_3/H_2$ (2% DILUTION)<br>$H_2$ | 40<br>50<br>500 | 800 | 1.5 | 350 |
| i-type layer (100a) | 10–110 | $SiH_4$<br>$H_2$ | 80<br>200 | 80 | 1.8 | 300 |
| i-type layer (100b) | — | $H_2$ | 200 | 200 | 1.8 | 300 |
| i-type layer (100c) | 10–110 | $SiH_4$<br>$H_2$ | 80<br>200 | 100 | 1.8 | 300 |
| i-type layer (100d) | — | $H_2$ | 200 | 200 | 1.8 | 300 |
| Second conductive layer (100p) | 10 | $SiH_4$<br>$BF_3/H_2$ (2% DILUTION)<br>$H_2$ | 10<br>100<br>2000 | 800 | 1.6 | 250 |

Substrate: SUS430BA, thickness 0.13 mm
Reflective layer: Silver (Ag) thin film, 100 nm
Reflective increase layer: zinc oxide (ZnO) thin film, 1 μm
Transparent electrode: ITO ($In_2O_3$ + $SnO_2$) thin film, 80 nm
Collecting electrode: aluminum (Al) thin film, 2 μm
Gate gas: 700 sccm from each gate The photovoltaic elements (Element-E201–206) prepared in Example 20 were evaluated with respect of the conversion efficiency.

For the current voltage property, pieces having an area of 5 cm square were cut at every interval of 10 m placed under radiation of AM-1.5 (100 mW/cm²), and the photoelectric conversion ratio was measured and evaluated. Measurement results are shown in Table 20-2. In the table, by setting each property of Element-E201 to 1.00, the values of Element-E202–206 are shown.

TABLE 20-2

| Element No. | Total film thickness of i-layer (nm) | Conversion efficiency | Open voltage | Current density | Fill factor |
|---|---|---|---|---|---|
| Element-E201 | 10 | 1.00 | 1.00 | 1.00 | 1.00 |
| Element-E202 | 20 | 1.04 | 1.01 | 1.01 | 1.02 |
| Element-E203 | 50 | 1.04 | 1.01 | 1.01 | 1.02 |
| Element-E204 | 70 | 1.04 | 1.01 | 1.01 | 1.02 |
| Element-E205 | 100 | 1.03 | 1.01 | 1.01 | 1.01 |
| Element-E206 | 110 | 0.09 | 1.00 | 1.00 | 0.99 |

As shown in Table 20-2, in using the cathode electrode structure and the $H_2$ plasma processing according to the invention, when the film thickness of the i-type semiconductor film deposited before the $H_2$ plasma processing (the total film thickness of the i-type layer) is in the range from 20 nm to 100 nm (Element-E202–205), the conversion efficiency is improved.

Therefore, it is found that by setting the film thickness of the i-type semiconductor film deposited before the $H_2$ plasma processing (the total film thickness of the i-type layer) in the range from 20 nm to 100 nm, the photovoltaic element having superior properties can be obtained.

As aforementioned, according to the invention, a photovoltaic element having a high quality and uniformity over a large area, fewer defects, superior photodeterioration property and improved series resistance can be manufactured with a high throughput and good reproducibility in large quantities.

What is claimed is:

1. A method of forming a non-single crystal semiconductor thin film comprising the steps of introducing material gas into a discharge space of a reaction container while moving a belt-like member, applying a high-frequency power, decomposing said material gas by plasma discharge and forming an i-type semiconductor layer on said belt-like member, wherein
    said i-type semiconductor layer is formed by repeating once or more times a process of depositing an i-type semiconductor film having a specified film thickness, then applying a $H_2$ plasma process onto a surface of said i-type semiconductor film, and
    said $H_2$ plasma process is applied under the conditions that the surface area of a cathode electrode in a plasma discharge space is larger than the sum of surface areas of said belt-like member and an anode electrode in said plasma discharge space, and a potential of said cathode electrode at the time of excitation of glow discharge provides a positive potential of +5V or more relative to said belt-like member and said anode electrode.

2. The method of forming the non-single crystal semiconductor thin film according to claim 1, wherein said $H_2$ plasma process is applied to a surface of said i-type semiconductor film being deposited.

3. The method of forming the non-single crystal semiconductor thin film according to claim 1, wherein the film thickness of said i-type semiconductor film deposited before said $H_2$ plasma process is 20 nm or more to 100 nm or less.

4. The method of forming the non-single crystal semiconductor thin film according to claim , wherein the depositing rate of said i-type semiconductor film deposited before said $H_2$ plasma process is 0.1 nm or more per second.

* * * * *

UNITED STATES PATENT AND TRADEMARK OFFICE
CERTIFICATE OF CORRECTION

PATENT NO.   : 6,159,763
DATED        : December 12, 2000
INVENTOR(S)  : Akira Sakai et al.

It is certified that error appears in the above-identified patent and that said Letters Patent is hereby corrected as shown below:

Title page,
Item [57], ABSTRACT,
Lines 4, 5, 8, 11, and 14, "cathod" should read -- cathode --;
Line 11, "a" should read -- the --;
Line 16, "less" should read -- fewer --; and
Line 17, "photo deterioration" should read -- photodeterioration --.

Column 1,
Line 13, "of" (first occurrence) should be deleted;
Line 15, "of" should be deleted;
Line 35, "roll to roll" should read -- roll-to-roll --; and
Line 55, "of a" should be deleted.

Column 2,
Line 39, "roll to" should read -- roll-to --.

Column 4,
Line 28, "can be formed" should be deleted; and
Line 37, "layers" should read -- layer, --.

Column 5,
Line 59, "to roll" should read -- to-roll --.

Column 7,
Line 4, "cathod" should read -- cathode --.

Column 9,
Line 13, "P-type" should read -- p-type --.

Column 10,
Line 9, "invention" should read -- invention, --; and
Line 52, "micro crystal" should read -- microcrystal --.

Column 11,
Line 49, "2F," should read -- 2F --.

Column 12,
Line 30, "roll to roll" should read -- roll-to-roll --.

UNITED STATES PATENT AND TRADEMARK OFFICE
CERTIFICATE OF CORRECTION

PATENT NO. : 6,159,763
DATED : December 12, 2000
INVENTOR(S) : Akira Sakai et al.

It is certified that error appears in the above-identified patent and that said Letters Patent is hereby corrected as shown below:

Column 13,
Line 4, "gas;" should read -- gas --;
Line 9, "in" (first occurrence) should be deleted;
Line 11, "actual," should read -- actuality, --;
Line 21, "therefore" should read -- thereof --; and
Line 36, "space" should be deleted.

Column 14,
Line 22, "of" should be deleted.

Column 15,
Lines 15 and 16, "semiconductor" should read -- semiconductor, --.

Column 16,
Line 1, "raised" should be deleted.

Column 17,
Line 1, "micro crystal" should read -- microcrystal --; and
Line 65, "process" should be deleted.

Column 19,
Line 3, "trodes" should read -- trode, --; and
Line 50, "of the" should be deleted.

Column 20,
Line 44, "11" should read -- $1_1$ --; and
Line 49, "discharge," should read -- discharge --.

Column 21,
Line 37, "roll to roll" should read -- roll-to-roll --.

Column 22,
Line 33, "slacks." should read -- slack. --;
Line 51, "cathod" should read -- cathode --;
Line 60, "electrodes" should read -- electrode, --; and
Line 62, "electrodes" should read -- electrode --.

UNITED STATES PATENT AND TRADEMARK OFFICE
CERTIFICATE OF CORRECTION

PATENT NO.   : 6,159,763
DATED        : December 12, 2000
INVENTOR(S)  : Akira Sakai et al.

It is certified that error appears in the above-identified patent and that said Letters Patent is hereby corrected as shown below:

Column 23,
Table 1-1, line 22, "500" move 1 tab left, line 28, "$PH_3/H_2$" should read -- $H_2$ --, and
Line 31, insert -- 100 --; and
Line 44, "respects" should read -- aspects --.

Column 25,
Line 34, "more" should be deleted; and
Line 39, "that" should read -- that, --.

Column 26,
Line 7, "roll to roll" should read -- roll-to-roll --.

Column 27,
Line 41, "0.6 times." should read -- 0.6 --.

Column 29,
Line 33, "The other respects" should read -- All other aspects --.

Column 30,
Line 1, "the" should be deleted; and
Line 33, "respects" should read -- aspects --.

Column 32,
Line 59, "respects" should read -- aspects --; and
Table 5-1, "$SiH_4$ 10" should read -- $SiH_4$ -- and "600 1.6 200" should read -- 10 600 1.6 200 --.

Column 34,
Line 24, "2.6 times." should read -- to 2.6. --.

Column 35,
Line 45, "0.6 times." should read -- 0.6 --.

Column 37,
Line 23, "roll to roll" should read -- roll-to-roll --.

Column 39,
Line 64, "property:" should read -- property, --.

UNITED STATES PATENT AND TRADEMARK OFFICE
CERTIFICATE OF CORRECTION

PATENT NO. : 6,159,763
DATED : December 12, 2000
INVENTOR(S) : Akira Sakai et al.

It is certified that error appears in the above-identified patent and that said Letters Patent is hereby corrected as shown below:

Column 40,
Line 46, "the" (first and second occurrence) should be deleted;
Line 53, "electrode" (second occurrence) should be deleted; and
Line 65, "respects" should read -- aspects --.

Column 42,
Line 25, "the" should be deleted; and
Line 39, "respects" should read -- aspects --.

Column 43,
Line 32, "respects" should read -- aspects --.

Column 44,
Line 17, "the" (both occurrences) should be deleted;
Line 29, "Table" should read -- Table 11-1. -- and "Table 11-1. Also" should read -- Table 11-1. ¶ Also --.

Column 45,
Line 44, "the" should be deleted.

Column 47,
Line 36, "the" (both occurrences) should be deleted; and
Line 41, "roll to roll" should read -- roll-to-roll --.

Column 49,
Line 48, "0.6 times." should read -- 0.6. --.

Column 50,
Line 59, "roll to roll" should read -- roll-to-roll --.

Column 52,
Line 67, "roll to roll" should read -- roll-to-roll --.

Column 53,
Line 14, "cathod" should read -- cathode --; and
Line 65, "has enhanced in" should read -- exhibits enhanced --.

Column 55,
Line 20, "roll to roll" should read -- roll-to-roll --.

UNITED STATES PATENT AND TRADEMARK OFFICE
CERTIFICATE OF CORRECTION

PATENT NO. : 6,159,763
DATED : December 12, 2000
INVENTOR(S) : Akira Sakai et al.

It is certified that error appears in the above-identified patent and that said Letters Patent is hereby corrected as shown below:

Column 60,
Line 57, "roll to roll" should read -- roll-to-roll --.

Column 61,
Line 34, "respect" should read -- with respect --; and
Line 45, "Seen" should be deleted.

Column 63,
Line 32, "interval" should read -- intervals --; and
Line 42, "respect" should read -- with respect --.

Column 64,
Lines 22 and 25, "cathod" should read -- cathode --;
Line 28, "about to" should read -- to about --; and
Line 63, "the" should be deleted.

Column 65,
Line 2, "roll to roll" should read -- roll-to-roll --.

Column 66,
Line 2, "roll to roll" should read -- roll-to-roll --.

Column 67,
Table 19-3, "DEPOSITING" should read -- DEPOSITION --;
Line 58, "cathod" should read -- cathode --;
Line 61, "the" should be deleted; and
Line 66, "is" should be deleted.

Column 68,
Line 61, "cathod" should read -- cathode --;

UNITED STATES PATENT AND TRADEMARK OFFICE
CERTIFICATE OF CORRECTION

PATENT NO. : 6,159,763
DATED : December 12, 2000
INVENTOR(S) : Akira Sakai et al.

It is certified that error appears in the above-identified patent and that said Letters Patent is hereby corrected as shown below:

Column 69,
Table 20-1, line 14, "100" should read -- 80 --; and
Line 31, "of the" should read -- to --.

Column 70,
Line 63, "claim," should read -- claim 1, --.

Signed and Sealed this

Thirteenth Day of November, 2001

Attest:

NICHOLAS P. GODICI
Attesting Officer        Acting Director of the United States Patent and Trademark Office